(12) United States Patent
Fujita et al.

(10) Patent No.: US 8,742,804 B2
(45) Date of Patent: Jun. 3, 2014

(54) DIVIDER CIRCUIT AND SEMICONDUCTOR DEVICE USING THE SAME

(75) Inventors: Masashi Fujita, Machida (JP); Yukio Maehashi, Yokohama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/473,658

(22) Filed: May 17, 2012

(65) Prior Publication Data

US 2012/0299626 A1 Nov. 29, 2012

(30) Foreign Application Priority Data

May 26, 2011 (JP) ................. 2011-118125

(51) Int. Cl.
*H03B 19/06* (2006.01)
(52) U.S. Cl.
USPC ........... 327/118; 327/115; 327/211; 327/212; 327/214; 377/47
(58) Field of Classification Search
USPC ......... 327/115, 117, 118, 208, 210–212, 214, 327/215, 218, 219, 223, 225; 377/47, 48
See application file for complete search history.

(56) References Cited

U.S. PATENT DOCUMENTS

| | | | | |
|---|---|---|---|---|
| 3,664,118 A | * | 5/1972 | Walton | 368/80 |
| 3,679,913 A | * | 7/1972 | Foltz | 327/115 |
| 3,829,712 A | * | 8/1974 | Hama | 377/117 |
| 3,829,713 A | * | 8/1974 | Canning | 377/105 |
| 3,864,582 A | * | 2/1975 | Keeler | 377/105 |
| 5,731,856 A | | 3/1998 | Kim et al. | |
| 5,744,864 A | | 4/1998 | Cillessen et al. | |
| 6,249,157 B1 | | 6/2001 | Nakura et al. | |
| 6,294,274 B1 | | 9/2001 | Kawazoe et al. | |
| 6,563,174 B2 | | 5/2003 | Kawasaki et al. | |
| 6,727,522 B1 | | 4/2004 | Kawasaki et al. | |
| 6,911,855 B2 | * | 6/2005 | Yin et al. | 327/210 |
| 7,049,190 B2 | | 5/2006 | Takeda et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Jeon et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

(Continued)

*Primary Examiner* — William Hernandez
(74) *Attorney, Agent, or Firm* — Eric J. Robinson; Robinson Intellectual Property Law Office, P.C.

(57) ABSTRACT

A semiconductor device with low power consumption and a small area is provided. By using a transistor including an oxide semiconductor for a channel as a transistor included in a flip-flop circuit, a divider circuit in which the number of transistors is small, power consumption is low, and the area is small can be achieved. By using the divider circuit, a semiconductor device which operates stably and is highly reliable can be provided.

19 Claims, 33 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,109,961 B2 | 9/2006 | Osame |
| 7,211,825 B2 | 5/2007 | Shih et al |
| 7,248,665 B2 | 7/2007 | Shi et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,705,843 B2 | 4/2010 | Osame |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0210219 A1 | 11/2003 | Osame |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262062 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0206175 A1* | 8/2012 | Gu et al. ..................... 327/118 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-224026 A | 8/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-347904 A | 12/2003 |
| JP | 2004-103957 A | 4/2004 |
| JP | 2004-273614 A | 9/2004 |
| JP | 2004-273732 A | 9/2004 |
| JP | 2009-022021 A | 1/2009 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 2003, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of SOL-Gel-Derived Zinc Oxide Films by Irradiation With Ultraviolet Lamp,", Journal of SOL-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of The 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of The 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT.", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of The 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, or Al; B; Mg, Mn, Fe, Ni, Cu, or, Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID DIGEST '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects In ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of The 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2012/062245) Dated Jun. 12, 2012.

Written Opinion (Application No. PCT/JP2012/062245) Dated Jun. 12, 2012.

\* cited by examiner

FIG. 10A1
FIG. 10B1
FIG. 10C1
FIG. 10A2
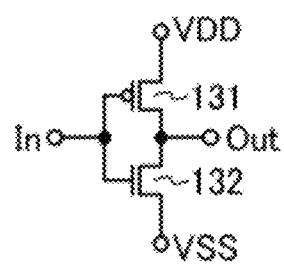
FIG. 10B2
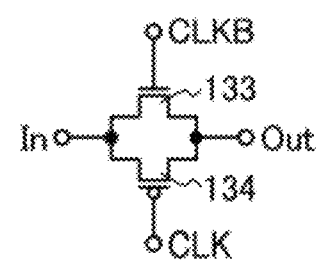
FIG. 10C2
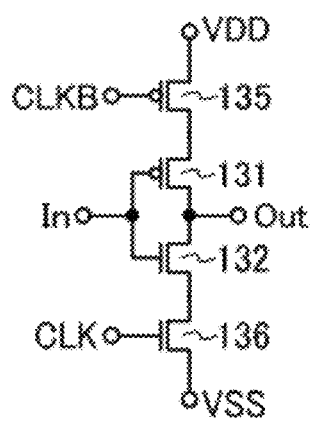

- In
- Sn
- Zn
- O

● In
○ Ga
○ Zn
● O

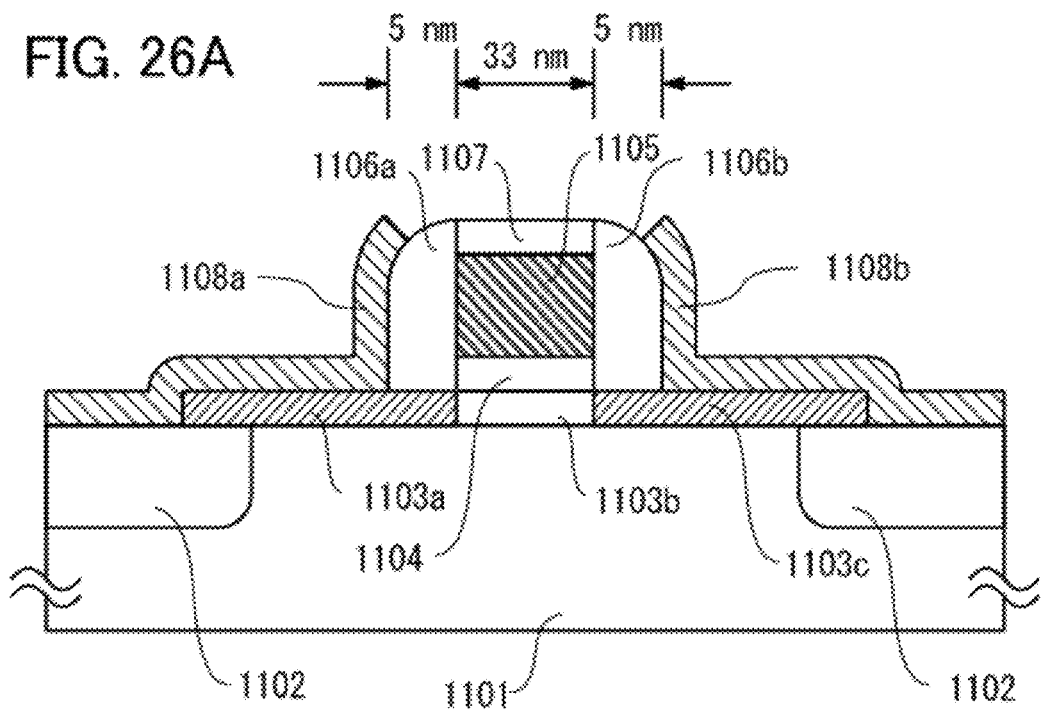
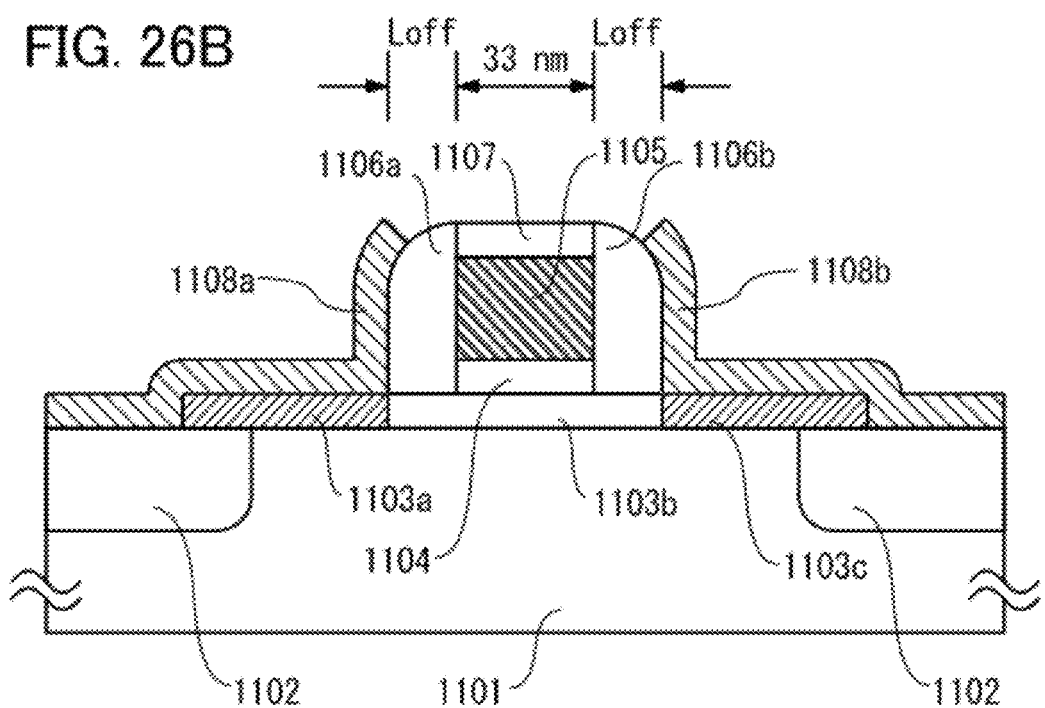

US 8,742,804 B2

DIVIDER CIRCUIT AND SEMICONDUCTOR DEVICE USING THE SAME

TECHNICAL FIELD

The present invention relates to a divider circuit and a semiconductor device using the divider circuit.

In this specification, a semiconductor device refers to a device which can function by utilizing semiconductor characteristics; a semiconductor device, an electro-optical device, a storage device, a signal processing unit, a semiconductor circuit, and an electronic device are all included in the category of the semiconductor device.

BACKGROUND ART

Semiconductor devices such as central processing units (CPUs) have various configurations depending on the application. Such semiconductor devices each include a plurality of circuits, for example, as well as a circuit for storing data or a program (main memory), a variety of storage circuits such as a register or a cache memory.

A register has a function of temporarily holding a data signal for carrying out arithmetic processing by an arithmetic circuit, holding a program execution state, or the like. In addition, a cache memory is located between an arithmetic circuit and a main memory in order to reduce access to the low-speed main memory and speed up arithmetic processing by the arithmetic circuit.

In such a semiconductor device including a plurality of circuits, a clock signal with a high frequency generated in an oscillation circuit is converted into a clock signal with a low frequency with the use of a divider circuit (also referred to as a prescaler), and the converted clock signal with a low frequency is used to synchronize the circuits.

In general, a divider circuit includes a delay flip-flop (DFF) circuit (see Patent Document 1, for example).

REFERENCE

Patent Document

[Patent Document 1] Japanese Published Patent Application No. 2000-224026

DISCLOSURE OF INVENTION

Examples of the configuration and operation of a general divider circuit are first described with reference to FIGS. 9A to 9C. FIG. 9A is a block diagram of a divider circuit 100 including delay flip-flop (DFF) circuits. The divider circuit 100 includes three stages of DFF circuits, a DFF circuit 101, a DFF circuit 102, and a DFF circuit 103 which are connected in series.

The DFF circuits 101 to 103 each include a clock signal input portion CK, an input portion D, an output portion Q, and an output portion Q bar. The clock signal input portion CK of the DFF circuit 101 is electrically connected to a terminal portion 111. A clock signal CLK with a predetermined frequency is input to the terminal portion 111. The clock signal CLK input to the terminal portion 111 is input to the DFF circuit 101 via the clock signal input portion CK. The output portion Q bar of the DFF circuit 101 is electrically connected to the input portion D of the DFF circuit 101. In addition, the output portion Q of the DFF circuit 101 is electrically connected to the clock signal input portion CK of the DFF circuit 102 via a node 112. The output portion Q bar of the DFF circuit 102 is electrically connected to the input portion D of the DFF circuit 102. The output portion Q of the DFF circuit 102 is electrically connected to the clock signal input portion CK of the DFF circuit 103 via a node 113. The output portion Q bar of the DFF circuit 103 is electrically connected to the input portion D of the DFF circuit 103. The output portion Q of the DFF circuit 103 is electrically connected to a terminal portion 114.

FIG. 9B is a diagram showing the configuration of the DFF circuit 101 that is a general DFF circuit, by using circuit symbols. The DFF circuit 101 shown in FIG. 9B includes an inverter 121, an inverter 122, an inverter 123, an analog switch 124, an analog switch 125, a clocked inverter 126, and a clocked inverter 127.

In FIG. 9B, a node 115 where the terminal portion 111 and an input portion of the inverter 121 are connected corresponds to the clock signal input portion CK. The inverter 121 generates a clock bar signal CLKB which is an inversion signal of the input clock signal CLK and outputs the clock bar signal CLKB to a node 116. The analog switch 124, the analog switch 125, the clocked inverter 126, and the clocked inverter 127 operate in synchronization with the clock signal CLK and the clock bar signal CLKB. An input of the analog switch 124 corresponds to the input portion D, and an output of the analog switch 125 corresponds to the output portion Q bar.

Note that each of the DFF circuit 102 and the DFF circuit 103 also has the same configuration as the DFF circuit 101.

FIG. 9C is a timing chart showing the operation of the divider circuit 100. The timing chart shows a change over time in potentials of the terminal portion 111, the node 112, the node 113, and the terminal portion 114. The frequency of the clock signal CLK input to the terminal portion 111 is reduced to a half (the period is increased twofold) by the DFF circuit 101 and the clock signal CLK is output to the node 112.

In addition, the frequency of the clock signal CLK input to the terminal portion 111 is reduced to a fourth (the period is increased fourfold) by the DFF circuit 101 and the DFF circuit 102 and the clock signal CLK is output to the node 113.

In addition, the frequency of the clock signal CLK input to the terminal portion 111 is reduced to an eighth (the period is increased eightfold) by the DFF circuit 101, the DFF circuit 102, and the DFF circuit 103 and the clock signal CLK is output to the terminal portion 114. In this manner, by each additional DFF circuit, the frequency of the clock signal CLK is reduced to a half.

FIGS. 10A1, 10B1, and 10C1 show circuit symbols used in FIG. 9B, and FIGS. 10A2, 10B2, and 10C2 are circuit diagrams showing the circuit configurations of the circuit symbols.

FIG. 10A1 is a circuit symbol of an inverter, and FIG. 10A2 is a circuit diagram showing the circuit configuration of the inverter. The inverter includes a p-channel transistor 131 and an n-channel transistor 132. One of a source and a drain of the p-channel transistor 131 is electrically connected to a high power supply potential $V_{DD}$, and the other of the source and the drain is electrically connected to an output terminal Out. In addition, one of a source and a drain of the n-channel transistor 132 is electrically connected to a low power supply potential $V_{SS}$, and the other of the source and the drain is electrically connected to the output terminal Out. Gates of the p-channel transistor 131 and the n-channel transistor 132 are electrically connected to an input terminal In.

The high power supply potential $V_{DD}$ (hereinafter also simply referred to as $V_{DD}$) is a power supply potential higher than the low power supply potential $V_{SS}$. The low power supply potential $V_{SS}$ (hereinafter also simply referred to as $V_{SS}$) is a power supply potential lower than the high power supply potential $V_{DD}$. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

The inverter has a function of inverting a signal that is input and outputting the inverted signal. For example, when a signal corresponding to "1" (e.g., $V_{DD}$) is input to the input terminal In of the inverter, "0" (e.g., $V_{SS}$) is output to the output terminal Out. In addition, when a signal corresponding to "0" is input to the input terminal In of the inverter, "1" is output to the output terminal Out.

FIG. 10B1 is a circuit symbol of an analog switch, and FIG. 10B2 is a circuit diagram showing the circuit configuration of the analog switch. The analog switch includes an n-channel transistor 133 and a p-channel transistor 134. One of a source and a drain of the n-channel transistor 133 and one of a source and a drain of the p-channel transistor 134 are electrically connected to an input terminal In. The other of the source and the drain of the n-channel transistor 133 and the other of the source and the drain of the p-channel transistor 134 are electrically connected to an output terminal Out. Here, a clock signal CLK is supplied to a gate of the p-channel transistor 134, and a clock bar signal CLKB is supplied to a gate of the n-channel transistor 133, for example.

With such a configuration, conduction or non-conduction between the input terminal In and the output terminal Out can be determined in synchronization with the clock signal CLK and the clock bar signal CLKB.

FIG. 10C1 is a circuit symbol of a clocked inverter, and FIG. 10C2 is a circuit diagram showing the circuit configuration of the clocked inverter. The clocked inverter includes a p-channel transistor 135 between the p-channel transistor 131 and $V_{DD}$ of the inverter shown in FIG. 10A2, and an n-channel transistor 136 between the n-channel transistor 132 and $V_{SS}$ of the inverter.

Specifically, one of a source and a drain of the p-channel transistor 135 is electrically connected to $V_{DD}$, and the other of the source and the drain of the p-channel transistor 135 is electrically connected to one of the source and the drain of the p-channel transistor 131. In addition, one of a source and a drain of the n-channel transistor 136 is electrically connected to $V_{SS}$, and the other of the source and the drain of the n-channel transistor 136 is electrically connected to one of the source and the drain of the n-channel transistor 132. In FIG. 10C2, a clock bar signal CLKB is supplied to a gate of the p-channel transistor 135, and a clock signal CLK is supplied to a gate of the n-channel transistor 136, for example.

In the clocked inverter, when the p-channel transistor 135 and the n-channel transistor 136 are on and a signal corresponding to "1" (e.g., $V_{DD}$) is input to the input terminal In, "0" (e.g., $V_{SS}$) is output to the output terminal Out. In addition, when the p-channel transistor 135 and the n-channel transistor 136 are on and a signal corresponding to "0" (e.g., $V_{SS}$) is input to the input terminal In, "1" (e.g., $V_{DD}$) is output to the output terminal Out. When the p-channel transistor 135 and the n-channel transistor 136 are off, no signal is output.

With such a configuration, a signal that is input can be inverted and output in synchronization with the clock signal CLK and the clock bar signal CLKB.

As described above, in the divider circuit 100 that has been conventionally used, three inverters, two analog switches, and two clocked inverters are used in one DFF circuit 101, which makes the total number of transistors at least 18, resulting in an increase in area of the circuit. Further, since a lot of transistors are used, the power consumption is increased.

In addition, in the conventional inverter, when an output signal is switched from "1" to "0" or from "0" to "1", through current is likely to be generated between $V_{DD}$ and $V_{SS}$ and power consumption is difficult to decrease.

In the present invention, by forming a divider circuit with fewer transistors than the conventional divider circuit, the area and power consumption of the divider circuit can be decreased.

An embodiment of the present invention is a divider circuit including a first inverter and a second inverter, a first transistor and a fifth transistor which are p-channel transistors, and a second transistor, a third transistor, a fourth transistor, a sixth transistor, a seventh transistor, and an eighth transistor which are n-channel transistors. One of a source and a drain of the first transistor and one of a source and a drain of the fifth transistor are electrically connected to a first power supply. The other of the source and the drain of the first transistor is electrically connected to one of a source and a drain of the second transistor. The other of the source and the drain of the second transistor is electrically connected to one of a source and a drain of the third transistor. The other of the source and the drain of the fifth transistor is electrically connected to one of a source and a drain of the sixth transistor. The other of the source and the drain of the sixth transistor is electrically connected to one of a source and a drain of the seventh transistor. The other of the source and the drain of the third transistor and the other of the source and the drain of the seventh transistor are electrically connected to a second power supply. A gate of the first transistor and a gate of the second transistor are electrically connected to a gate of the eighth transistor and an input of the first inverter. One of a source and a drain of the eighth transistor is electrically connected to the other of the source and the drain of the first transistor and one of the source and the drain of the second transistor. The other of the source and the drain of the eighth transistor is electrically connected to a gate of the seventh transistor. An input of the second inverter is electrically connected to the other of the source and the drain of the fifth transistor and one of the source and the drain of the sixth transistor. An output of the second inverter is electrically connected one of a source and a drain of the fourth transistor. The other of the source and the drain of the fourth transistor is electrically connected to a gate of the third transistor. An output of the first inverter is electrically connected to a gate of the fourth transistor, a gate of the fifth transistor, and a gate of the sixth transistor.

The first power supply supplies a higher potential than the second power supply. In addition, the off-state current of a transistor which includes an oxide semiconductor for a semiconductor layer in which a channel is formed (hereinafter also referred to as an oxide semiconductor (OS) transistor) is much smaller than that of a transistor which includes silicon.

By using an OS transistor as the fourth transistor, a potential of a node connected to the source or the drain of the fourth transistor can be kept stable. By using an OS transistor as the eighth transistor, a potential of a node connected to the source or the drain of the eighth transistor can be kept stable.

An OS transistor can also be used as the transistors other than the fourth transistor and the eighth transistor. By using an OS transistor in this manner, a highly reliable semiconductor device which operates stably can be achieved.

In accordance with an embodiment of the present invention, a divider circuit with a small area can be provided.

In accordance with an embodiment of the present invention, a divider circuit with low power consumption can be provided.

By using a divider circuit according to an embodiment of the present invention, a semiconductor device with low power consumption can be provided.

In accordance with an embodiment of the present invention, a highly reliable semiconductor device which operates stably can be provided.

An embodiment of the present invention can achieve at least one of the above objects.

BRIEF DESCRIPTION OF DRAWINGS

FIGS. 10A1, 10B1, and 10C1 show circuit symbols and FIGS. 10A2, 10B2, and 10C2 illustrate circuit configurations of the circuit symbols.

FIGS. 26A and 26B illustrate cross-sectional structures of transistors used for calculation.

BEST MODE FOR CARRYING OUT THE INVENTION

Figure 1A:
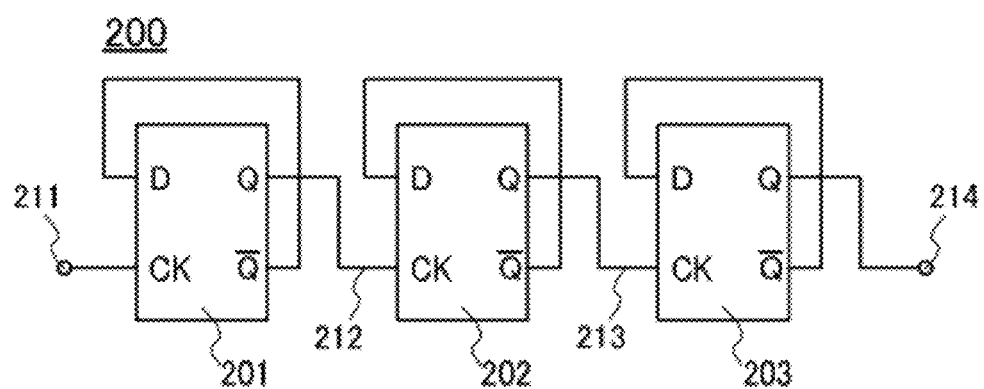
FIGS. 1A and 1B illustrate a divider circuit and an FF circuit, respectively.

Hereinafter, embodiments of the present invention will be described in detail with reference to the accompanying drawings. However, the present invention is not limited to the following description and it is easily understood by those skilled in the art that the mode and details thereof can be variously changed without departing from the spirit and the scope of the present invention. Accordingly, the present invention should not be construed as being limited to the description of the embodiments below.

Note that functions of "source" and "drain" may be switched in the case where transistors of different polarities are employed or in the case where the direction of a current flow changes in a circuit operation, for example. Therefore, the terms "source" and "drain" can be interchanged in this specification.

The term "electrically connected" includes the case where components are connected through an "object having any electric function". There is no particular limitation on the object having any electric function as long as electric signals can be transmitted and received between the components connected through the object. Examples of an "object having any electric function" are a switching element such as a transistor, a resistor, an inductor, a capacitor, and an element with a variety of functions as well as an electrode and a wiring.

In addition, even when a circuit diagram shows independent components as if they are electrically connected to each other, there is actually the case where one conductive film has functions of a plurality of components such as the case where part of a wiring also functions as an electrode. The "electrical connection" in this specification includes in its category such a case where one conductive film has functions of a plurality of components.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Ordinal numbers such as "first", "second", and "third" are used in order to avoid confusion among components and do not limit the components numerically.

Note that voltage refers to a difference between potentials of two points, and a potential refers to electrostatic energy (electric potential energy) of a unit electric charge at a given point in an electrostatic field. Note that in general, a difference between a potential of one point and a reference potential (such as a ground potential) is merely called a potential or a voltage, and a potential and a voltage are used as synonymous words in many cases. Thus, in this specification, a potential may be rephrased as voltage and voltage may be rephrased as a potential unless otherwise specified.

Embodiment 1

Examples of the configuration and operation of a divider circuit according to an embodiment of the present invention will be described with reference to FIGS. 1A and 1B, FIGS. 2A to 2C, FIG. 3, FIGS. 4A and 4B, FIGS. 5A and 5B, and FIG. 6. A divider circuit includes one or a plurality of flip-flop (FF) circuits. In this embodiment, a divider circuit 200 including three FF circuits, an FF circuit 201, an FF circuit 202, and an FF circuit 203, will be described.

FIG. 1A is a block diagram illustrating the configuration of the divider circuit 200 in which the FF circuits 201 to 203 in three stages are connected in series.

The FF circuits 201 to 203 each include a clock signal input portion CK, an input portion D, an output portion Q, and an output portion Q bar. The clock signal input portion CK of the FF circuit 201 is electrically connected to a terminal portion 211. A clock signal CLK with a predetermined frequency is input to the terminal portion 211. The clock signal CLK input to the terminal portion 211 is input to the FF circuit 201 via the clock signal input portion CK. The output portion Q bar of the FF circuit 201 is electrically connected to the input portion D of the FF circuit 201. In addition, the output portion Q of the FF circuit 201 is electrically connected to the clock signal input portion CK of the FF circuit 202 via a node 212. The output portion Q bar of the FF circuit 202 is electrically connected to the input portion D of the FF circuit 202. The output portion Q of the FF circuit 202 is electrically connected to the clock signal input portion CK of the FF circuit 203 via a node 213. The output portion Q bar of the FF circuit 203 is electrically connected to the input portion D of the FF circuit 203. The output portion Q of the FF circuit 203 is electrically connected to a terminal portion 214.

Figure 1B:
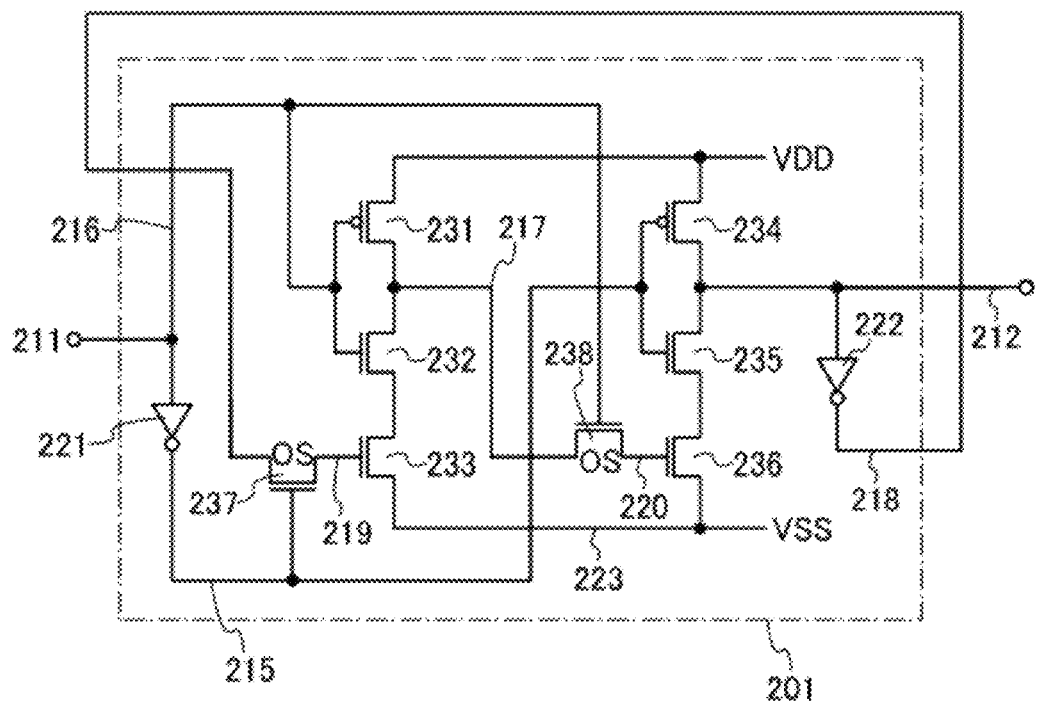

FIG. 1B is a circuit diagram illustrating the configuration of the FF circuit 201.

In the drawing, "OS" is written beside a circuit symbol of a transistor which is an OS transistor.

The FF circuit 201 illustrated in FIG. 1B includes an inverter 221 (a first inverter), an inverter 222 (a second inverter), a p-channel transistor 231 (a first transistor), a p-channel transistor 234 (a fifth transistor), an n-channel transistor 232 (a second transistor), an n-channel transistor 233 (a third transistor), an n-channel transistor 235 (a sixth transistor), an n-channel transistor 236 (a seventh transistor), a transistor 237 which is an OS transistor (a fourth transistor), and a transistor 238 which is an OS transistor (an eighth transistor).

A node 216 where the terminal portion 211 and an input portion of the inverter 221 are connected corresponds to the clock signal input portion CK. The inverter 221 generates a clock bar signal CLKB which is an inversion signal of the input clock signal CLK and outputs the clock bar signal CLKB to a node 215. One of a source and a drain of the transistor 231 is electrically connected to $V_{DD}$. The other of the source and the drain of the transistor 231 is electrically connected to a node 217. One of a source and a drain of the transistor 232 is electrically connected to the node 217. Gates of the transistor 231 and the transistor 232 are electrically connected to the node 216. One of a source and a drain of the transistor 233 is electrically connected to $V_{SS}$, and the other of the source and the drain of the transistor 233 is electrically connected to the other of the source and the drain of the transistor 232. One of a source and a drain of the transistor 237 is electrically connected to a gate of the transistor 233 via a node 219, and the other of the source and the drain of the transistor 237 is electrically connected to a node 218. An input portion of the inverter 222 is electrically connected to a node 212 and an output portion of the inverter 222 is electrically connected to the node 218.

One of a source and a drain of the transistor 234 is electrically connected to $V_{DD}$. The other of the source and the drain of the transistor 234 is electrically connected to the node 212. One of a source and a drain of the transistor 235 is electrically connected to the node 212. Gates of the transistor 234 and the transistor 235 are electrically connected to the node 215. One of a source and a drain of the transistor 236 is electrically connected to $V_{SS}$, and the other of the source and the drain of the transistor 236 is electrically connected to the other of the source and the drain of the transistor 235. One of a source and a drain of the transistor 238 is electrically connected to a gate of the transistor 236 via a node 220, and the other of the source and the drain of the transistor 238 is electrically connected to the node 217.

Figure 3:
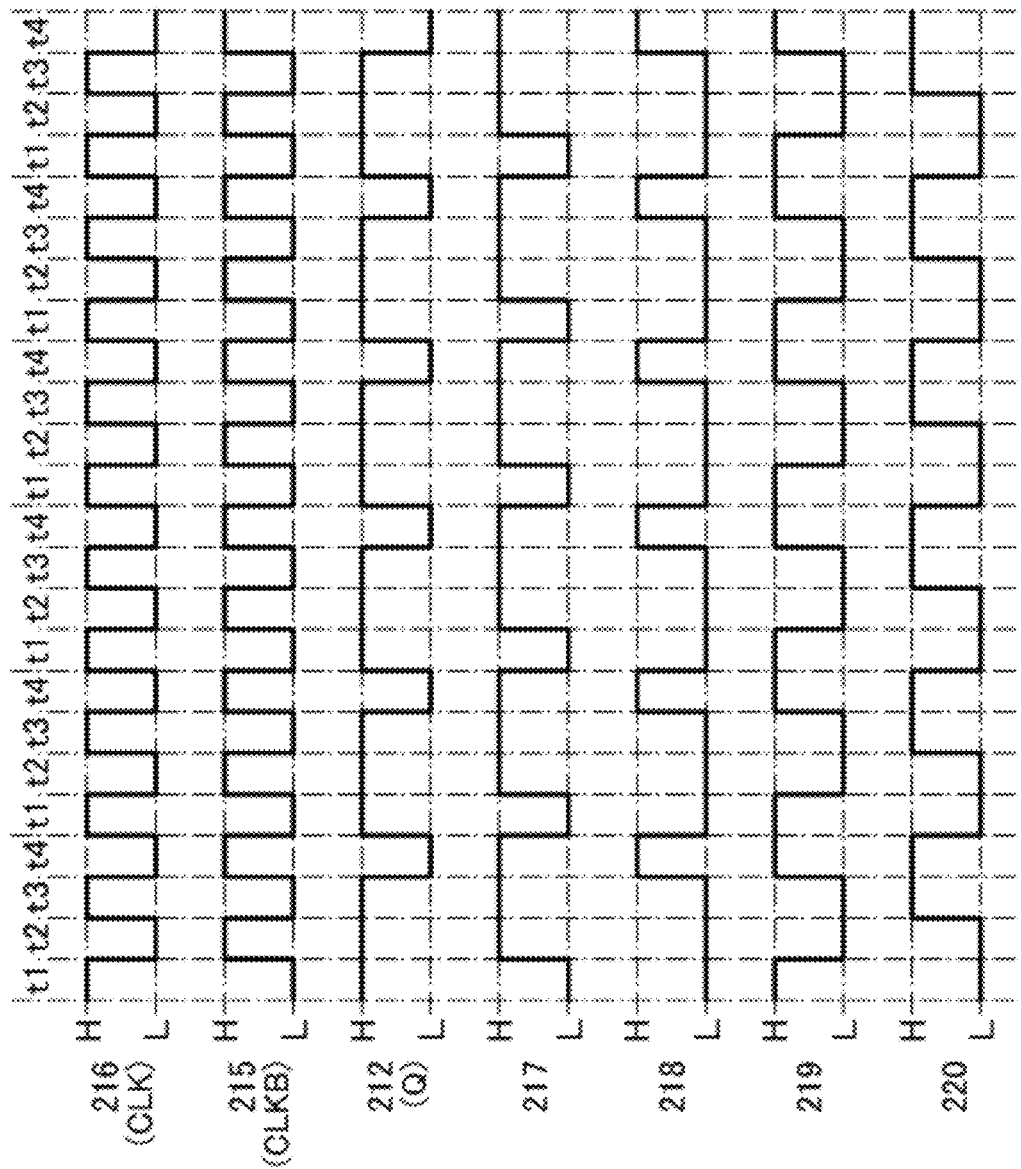
FIG. 3 is a timing chart showing the operation of an FF circuit.

Then, the operation of the FF circuit 201 is described with reference to FIG. 3, FIGS. 4A and 4B, FIGS. 5A and 5B, and FIG. 6. FIG. 3 is a timing chart showing the operation of the FF circuit 201. In FIG. 3, the potential of each node in operation periods t1 to t4 is shown. FIGS. 4A and 4B and FIGS. 5A and 5B illustrate the states of the transistors included in the FF circuit 201 in the operation periods.

Note that without limitation thereon, the conductivity types of the transistors, a combination of logic circuits, and the potential of each signal can be set as appropriate as long as the conduction states of the transistors are the same as those described here. Here, each signal is represented by an H potential or an L potential; the H potential (e.g., $V_{DD}$) brings an n-channel transistor into an on state and a p-channel transistor into an off state, and the L potential (e.g., $V_{SS}$) brings a p-channel transistor into an on-state and an n-channel transistor into an off state. In the initial state, a potential of the node 219 is an H potential, and a potential of the node 220 is an H potential. The clock signal CLK is an H potential or an L potential at predetermined intervals (frequency). In FIGS. 4A and 4B and FIGS. 5A and 5B, transistors which are in an off state are crossed.

Figure 4A:
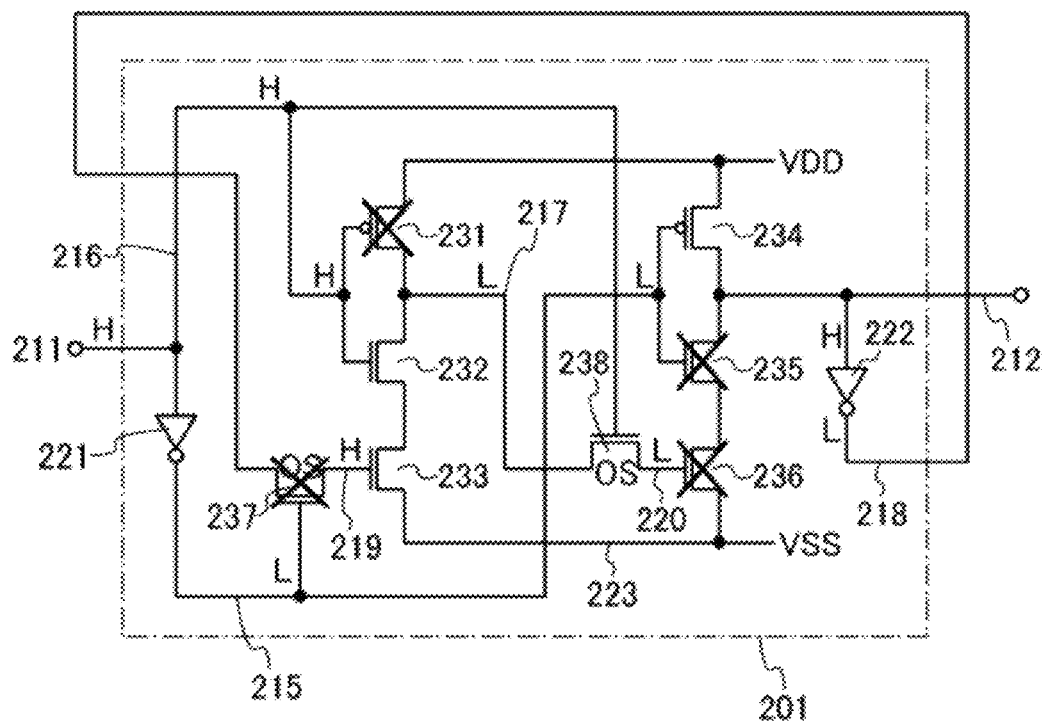
FIGS. 4A and 4B each illustrate the states of transistors in an FF circuit in the operation period.

First, the operation in the period t1 in FIG. 3 will be described with reference to FIG. 4A.

In the period t1, an H potential of a clock signal CLK is input to the terminal portion 211, so that a potential of the node 216 is an H potential. A clock bar signal CLKB is generated by the inverter 221, so that a potential of the node 215 is an L potential. Then, the transistor 237 is turned off, an H potential is held in the node 219, and the transistor 233 is kept on.

Since the node 216 has an H potential, the transistor 231 is turned off, and the transistor 232 is turned on, so that the node 217 and a node 223 are in a conduction state, and an L potential ($V_{SS}$) is supplied to the node 217.

Since the potential of the node 215 is an L potential, the transistor 234 is turned on and the transistor 235 is turned off. Then, an H potential ($V_{DD}$) is supplied to the node 212 and an L potential is output from the inverter 222, so that the node 218 has an L potential.

In addition, the transistor 238 is turned on, the node 217 and the node 220 are in a conduction state and the potential of the node 220 becomes an L potential. Accordingly, the transistor 236 is turned off.

Figure 4B:
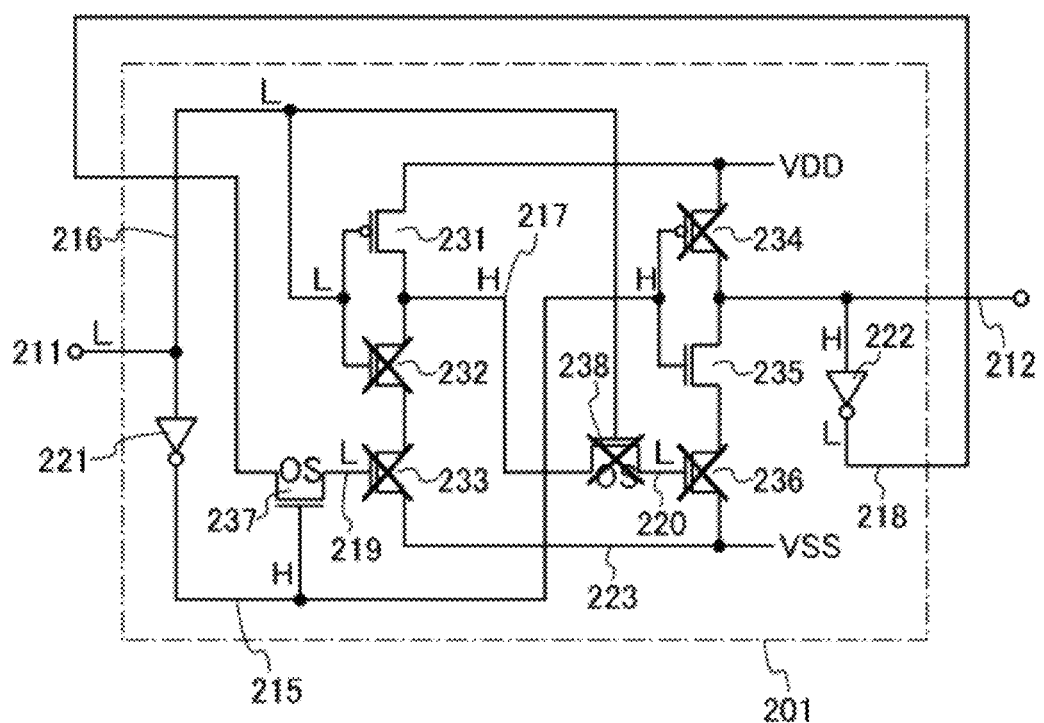

Next, the operation in the period t2 in FIG. 3 will be described with reference to FIG. 4B.

In the period t2, an L potential of the clock signal CLK is input to the terminal portion 211, so that the potential of the node 216 is an L potential. A clock bar signal CLKB is generated by the inverter 221, so that the potential of the node 215 is an H potential. When the potential of the node 216 is an L potential, the transistor 238 and the transistor 232 are turned off, and the transistor 231 is turned on, so that an H potential is supplied to the node 217.

Since the transistor 238 is off, the node 217 and the node 220 are not in a conduction state, whereby the L potential of the node 220 is kept, and the off state of the transistor 236 is kept.

Since the potential of the node 215 is an H potential, the transistor 234 is turned off and the transistor 235 is turned on, but because of the off state of the transistor 236, the node 212 is in an electrically floating state, so that the electric charge in the node 212 cannot move and is held. Consequently, the H potential is held in the node 212 here. Thus, an L potential is output from the inverter 222 to the node 218. Further, since the node 215 has an H potential, the transistor 237 is turned on, the node 218 and the node 219 are in a conduction state, and the potential of the node 219 becomes an L potential. Accordingly, the transistor 233 is turned off.

Figure 5A:
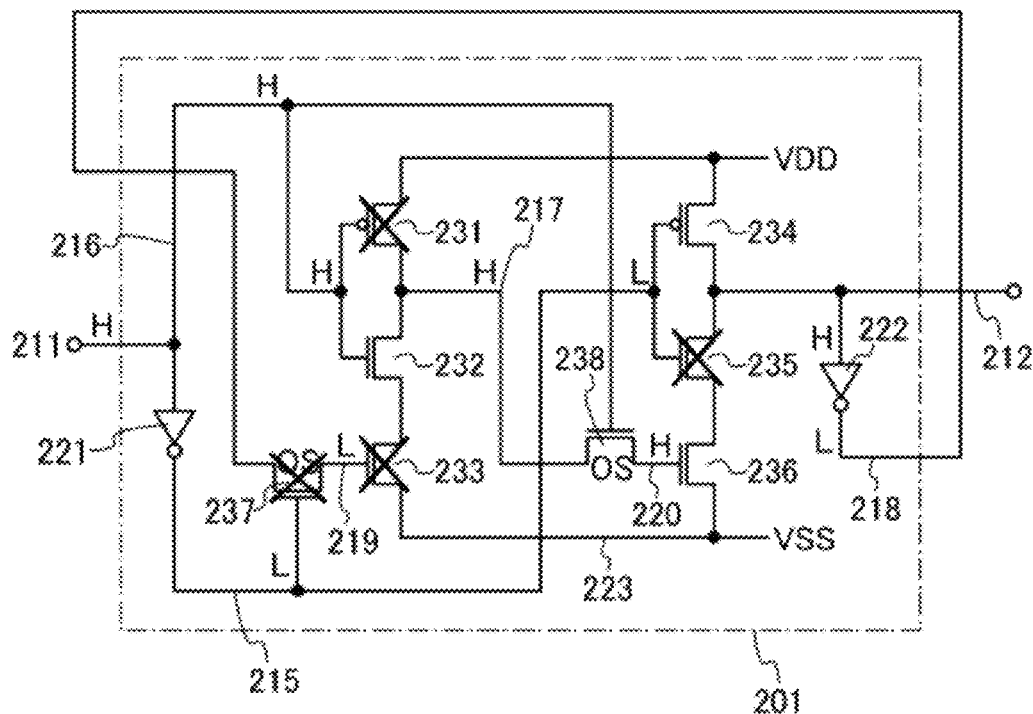
FIGS. 5A and 5B each illustrate the states of transistors in an FF circuit in the operation period.

Next, the operation in the period t3 in FIG. 3 will be described with reference to FIG. 5A.

In the period t3, an H potential of the clock signal CLK is input to the terminal portion 211, so that the potential of the node 216 is an H potential. A clock bar signal CLKB is generated by the inverter 221, so that the potential of the node 215 is an L potential. When the potential of the node 215 is an L potential, the transistor 237 is turned off, the potential of the node 219 (the L potential) is held, and the transistor 233 is kept off.

When the potential of the node 216 is an H potential, the transistor 232 is turned on and the transistor 231 is turned off, but because of the off state of the transistor 233, the node 217 is in an electrically floating state, so that the electric charge in the node 217 cannot move and is held. Consequently, the H potential is held in the node 217 here. In addition, the transistor 238 is turned on, the node 217 and the node 220 are in a conduction state, and the potential of the node 220 becomes an H potential. Accordingly, the transistor 236 is turned on.

Since the node 215 has an L potential, the transistor 234 is turned on, the transistor 235 is turned off, an H potential is supplied to the node 212, an L potential is output from the inverter 222, and the node 218 has an L potential.

Figure 5B:
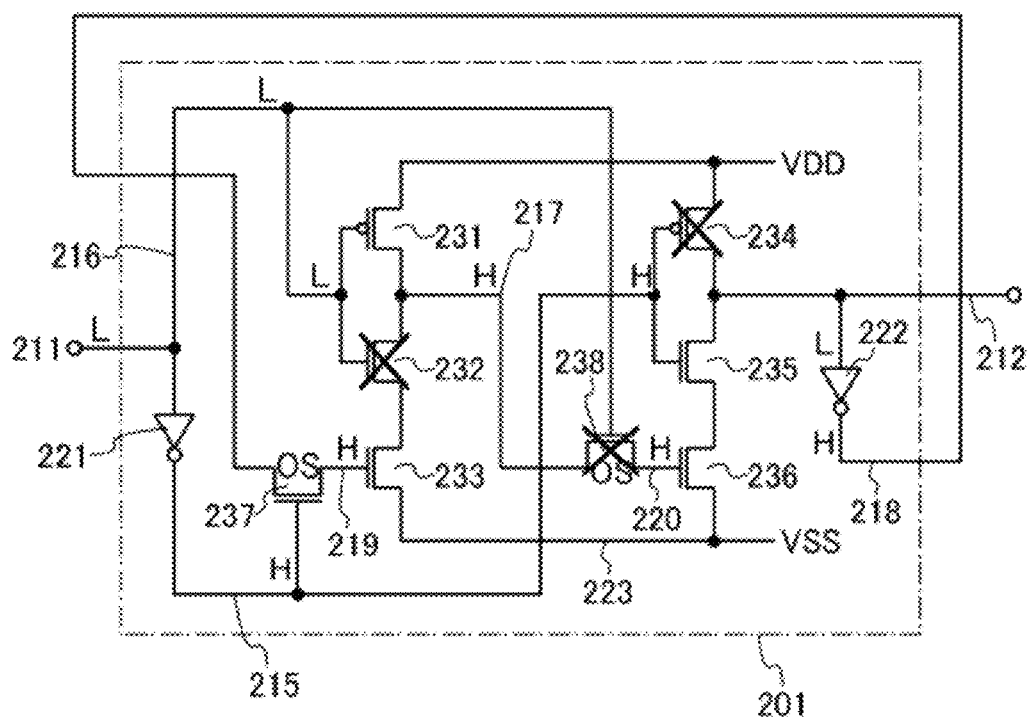

Next, the operation in the period t4 in FIG. 3 will be described with reference to FIG. 5B.

In the period t4, an L potential of the clock signal CLK is input to the terminal portion 211, so that the potential of the node 216 is an L potential. A clock bar signal CLKB is generated by the inverter 221, so that the potential of the node 215 is an L potential. When the potential of the node 216 is an L potential, the transistor 238 is turned off, the potential of the node 220 (the H potential) is held, and the transistor 236 is kept on.

When the node 215 has an H potential, the transistor 234 is turned off and the transistor 235 is turned on, so that the node 212 and the node 223 are in a conduction state, and an L potential ($V_{SS}$) is supplied to the node 212. When an L potential is supplied to the node 212, an H potential is output from the inverter 222, so that the node 218 has an H potential.

Further, when the node 215 has an H potential, the transistor 237 is turned on, the node 218 and the node 219 are in a conduction state, and the potential of the node 219 becomes an H potential, so that the transistor 233 is turned on.

When the node 216 has an L potential, the transistor 231 is turned on, the transistor 232 is turned off, and the node 217 has an H potential.

As described above, the FF circuit according to an embodiment of the present invention can output a signal having a frequency that is a half of that of a clock signal CLK input. In addition, although the potential of the node 212 is used as an output of the FF circuit in this embodiment, a potential of another node may be used as the output of the FF circuit. For example, the potential of the node 219 or the node 220 is used as an output, whereby a signal having a duty ratio which is substantially the same as that of the input clock signal CLK and a frequency which is a half of that of the input clock signal CLK can be output.

In addition, the FF circuit disclosed in this embodiment can be applied to other circuits such as a counter circuit.

Figure 6:
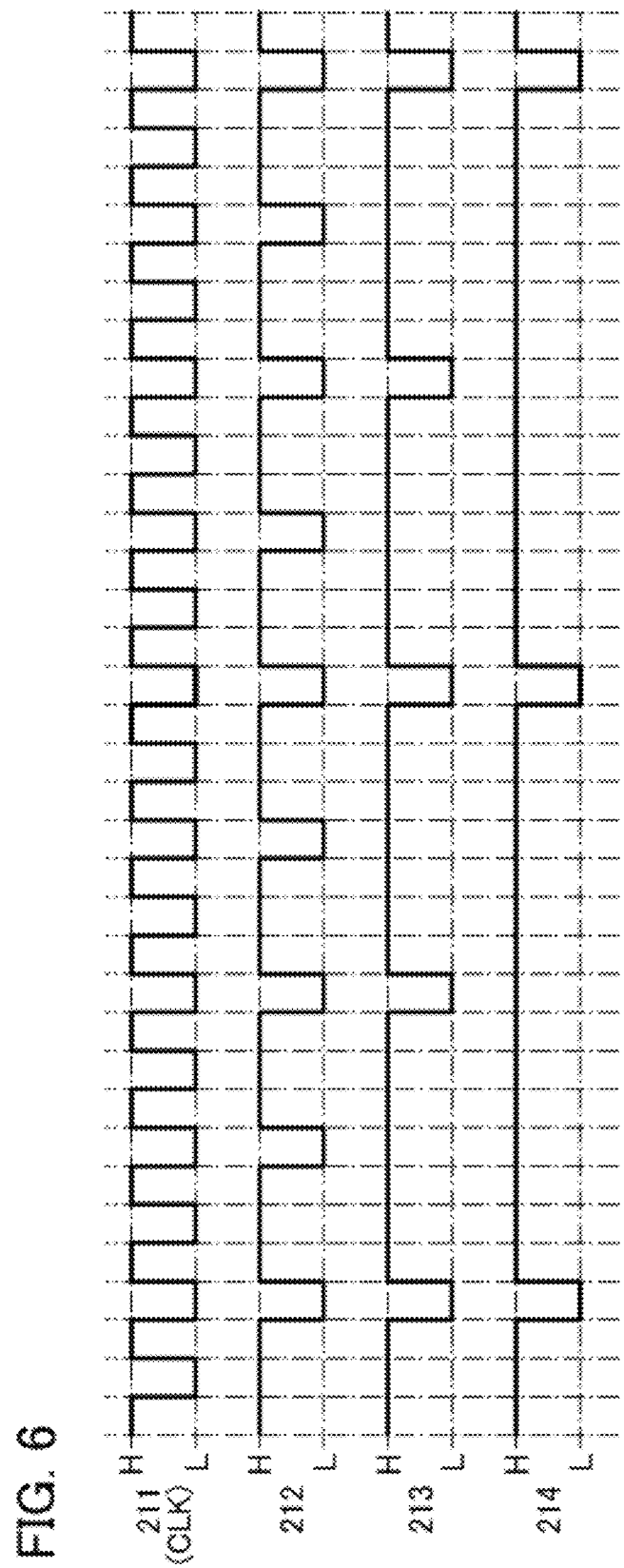
FIG. 6 is a timing chart showing the operation of a divider circuit.

FIG. 6 is a timing chart showing the operation of the divider circuit 200. The timing chart shows a change over time in potentials of the terminal portion 211, the node 212, the node 213, and the terminal portion 214. The frequency of the clock signal CLK input to the terminal portion 211 is reduced to a half (the period is increased twofold) by the FF circuit 201 and the clock signal CLK is output to the node 212.

In addition, the frequency of the clock signal CLK input to the terminal portion 211 is reduced to a fourth (the period is increased fourfold) by the FF circuit 201 and the FF circuit 202 and the clock signal CLK is output to the node 213.

In addition, the frequency of the clock signal CLK input to the terminal portion 211 is reduced to an eighth (the period is increased eightfold) by the FF circuit 201, the FF circuit 202, and the FF circuit 203 and the clock signal CLK is output to the terminal portion 214. In this manner, by each additional FF circuit, the frequency of the clock signal CLK is reduced to a half.

For example, a clock signal CLK with a frequency of 32.768 kHz is input to a divider circuit in which 15 stages of FF circuits are connected in series, whereby a clock signal CLK having a frequency of 1 Hz can be obtained. That is, the divider circuit 200 can also be used as a timer circuit which generates a signal every predetermined period.

The FF circuit according to an embodiment of the present invention can include fewer transistors than a conventional DFF circuit. Moreover, fewer inverters are used. Thus, an increase in power consumption due to through current can be suppressed. That is, the divider circuit can be manufactured with fewer transistors than the conventional divider circuit. Accordingly, a semiconductor device with a small area and low power consumption can be achieved.

In addition, the off-state current of an OS transistor is much smaller than that of a transistor including silicon. The off-state current of an OS transistor per micrometer of a channel width is less than or equal to 100 zA, preferably less than or equal to 10 zA, more preferably less than or equal to 1 zA.

That is, by using an OS transistor as the transistor 237, the potential of the node 219 can be kept stable when the transistor 237 is in an off state. In particular, when the number of FF circuits is increased, time for keeping the potential of the node 219 by turning off the transistor 237 is lengthened, and the effect of using the OS transistor as the transistor 237 is large.

Similarly, by using an OS transistor as the transistor 238, the potential of the node 220 can be kept stable when the transistor 238 is in an off state.

Figure 2A:
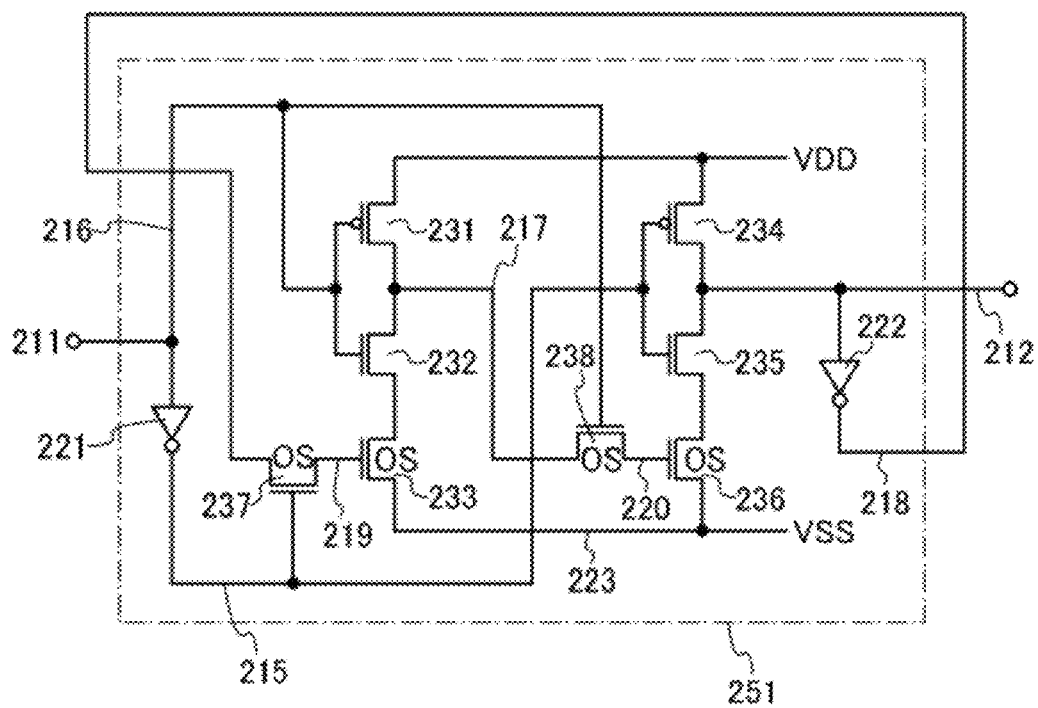
FIGS. 2A to 2C illustrate the configuration of an FF circuit.

An FF circuit 251 illustrated in FIG. 2A has a circuit configuration similar to that of the FF circuit 201. In the FF circuit 251, an OS transistor is used not only as the transistor 237 and the transistor 238 but also as the transistor 233 and the transistor 236. In addition, an OS transistor may also be used as the transistor 232 and the transistor 235.

By using an OS transistor as one of or both the transistor 232 and the transistor 233, when the transistor 231 is turned on so that the node 217 has an H potential, electric charge of the node 217 can be prevented from leaking to the node 223, whereby electric charge can be efficiently supplied. Therefore, power consumption can be reduced.

In addition, when the number of FF circuits is increased, time for keeping the H potential in the node 217 is lengthened. Thus, by using an OS transistor as one of or both the transistor 232 and the transistor 233, the potential of the node 217 can be kept stable. In particular, since the transistor 233 is off for a longer time than the transistor 232, it is preferable that an OS transistor be used as the transistor 233.

By using an OS transistor as one of or both the transistor 235 and the transistor 236, when the transistor 234 is turned on so that the node 212 has an H potential, electric charge of the node 212 can be prevented from leaking to the node 223, whereby electric charge can be efficiently supplied. Therefore, power consumption can be reduced.

In addition, by using an OS transistor as one of or both the transistor 235 and the transistor 236, the potential of the node 212 can be kept stable. In particular, since the transistor 236 is off for a longer time than the transistor 235, it is preferable that an OS transistor be used as the transistor 236.

Figure 2B:
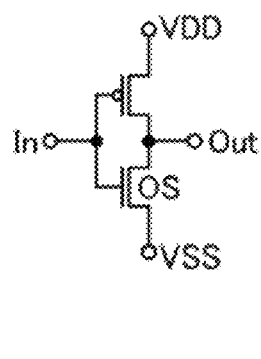
Figure 2C:
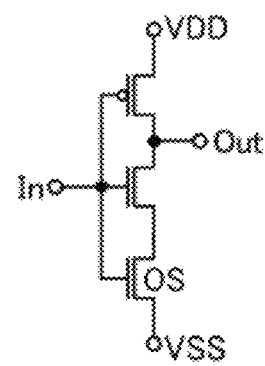

FIGS. 2B and 2C are circuit diagrams in each of which an OS transistor is used as a transistor included in an inverter. By using an OS transistor as a transistor included in an inverter, power consumption can be further reduced.

By using an OS transistor as a transistor included in a semiconductor device, the semiconductor device can operate stably and can be highly reliable. In addition, power consumption of the semiconductor device can be reduced.

This embodiment can be implemented by being combined with other embodiments as appropriate.

Embodiment 2

In this embodiment, an FF circuit 261 having a configuration different from that of the FF circuit 201 in Embodiment 1 will be described.

Figure 7:
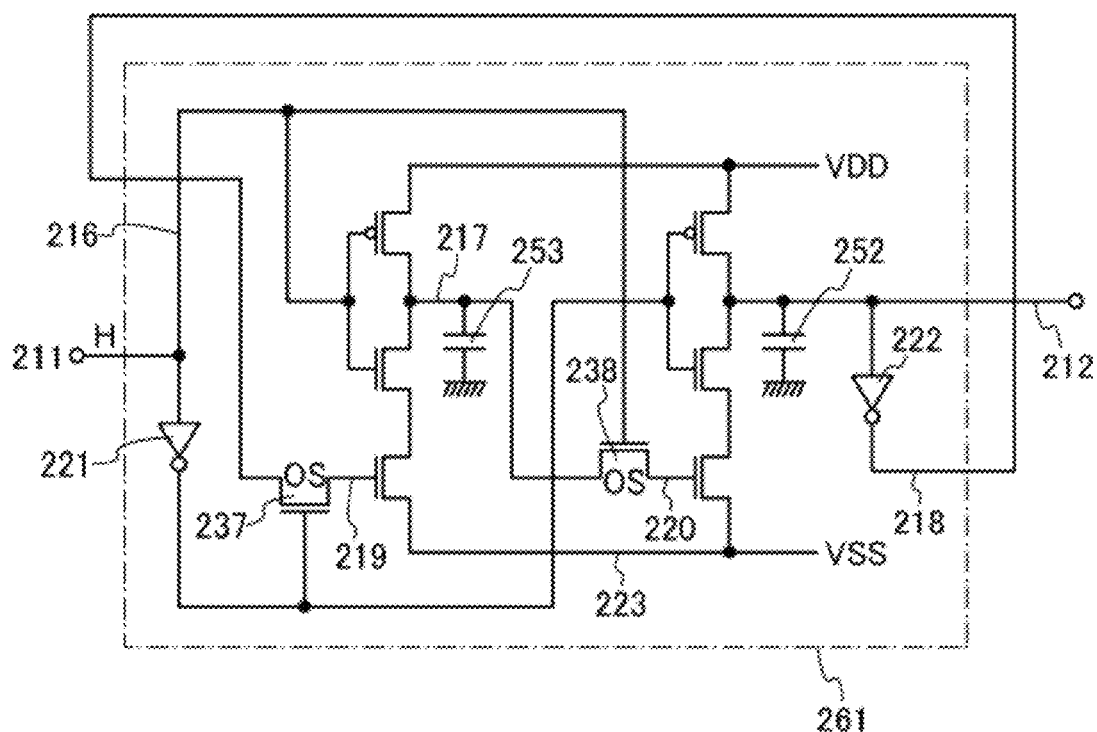
FIG. 7 is a circuit diagram showing the configuration of an FF circuit.

FIG. 7 is a circuit diagram showing the configuration of the FF circuit 261. The FF circuit 261 is obtained by adding a capacitor 252 and a capacitor 253 to the node 212 and the node 217 of the FF circuit 201 described in Embodiment 1.

In the FF circuit 261, one electrode of the capacitor 252 is electrically connected to the node 212, and the other electrode of the capacitor 252 is electrically connected to a common electrode to which a common potential is supplied. In addition, one electrode of the capacitor 253 is electrically connected to the node 217, and the other electrode of the capacitor 253 is electrically connected to a common electrode to which a common potential is supplied.

In this example, a common potential is supplied to the other electrode of the capacitor 252 and the other electrode of the capacitor 253. It is preferable that a fixed potential be supplied to the other electrodes of the capacitors 252 and 253. $V_{DD}$ or $V_{SS}$ may be supplied thereto, or different potentials from each other may be supplied thereto.

By adding the capacitors 252 and 253, potentials of the nodes 212 and 217 can be more stable also when the node 212 and the node 217 are in a floating state. Thus, the reliability of the semiconductor device can be further increased.

This embodiment can be implemented by being combined with other embodiments as appropriate.

Embodiment 3

Figure 8A:
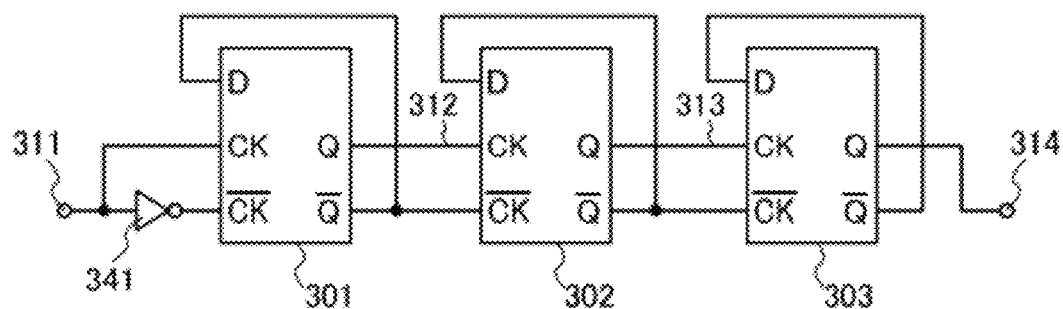
FIGS. 8A and 8B illustrate a divider circuit and an FF circuit, respectively.

In this embodiment, a divider circuit 300 having a configuration different from that of the divider circuit 200 in the above embodiment will be described. FIG. 8A is a block diagram illustrating the configuration of the divider circuit 300 in which three stages of FF circuits 301 to 303 are connected in series.

The FF circuits 301 to 303 each include a clock signal input portion CK, a clock bar signal input portion CK bar, an input portion D, an output portion Q, and an output portion Q bar. In the FF circuit 301, the clock signal input portion CK is electrically connected to a terminal portion 311.

A clock signal CLK with a predetermined frequency is input to the terminal portion 311. The clock signal CLK input to the terminal portion 311 is input to the FF circuit 301 via the clock signal input portion CK. The terminal portion 311 is connected to the clock bar signal input portion CK bar via an inverter 341. When the clock signal CLK is input to the terminal portion 311, a clock bar signal CLKB which is an inversion signal of the clock signal CLK is output from the inverter 341. The clock bar signal CLKB is input to the FF circuit 301 via the clock bar signal input portion CK bar.

The output portion Q of the FF circuit 301 is electrically connected to the clock signal input portion CK of the FF circuit 302 via a node 312. In addition, the output portion Q bar of the FF circuit 301 is electrically connected to the input portion D of the FF circuit 301 and the clock bar signal input portion CK bar of the FF circuit 302.

The output portion Q of the FF circuit 302 is electrically connected to the clock signal input portion CK of the FF circuit 303 via the node 313. In addition, the output portion Q bar of the FF circuit 302 is electrically connected to the input portion D of the FF circuit 302 and the clock bar signal input portion CK bar of the FF circuit 303. The output portion Q of the FF circuit 303 is electrically connected to a terminal portion 314. The output portion Q bar of the FF circuit 303 is electrically connected to the input portion D of the FF circuit 303.

Figure 8B:
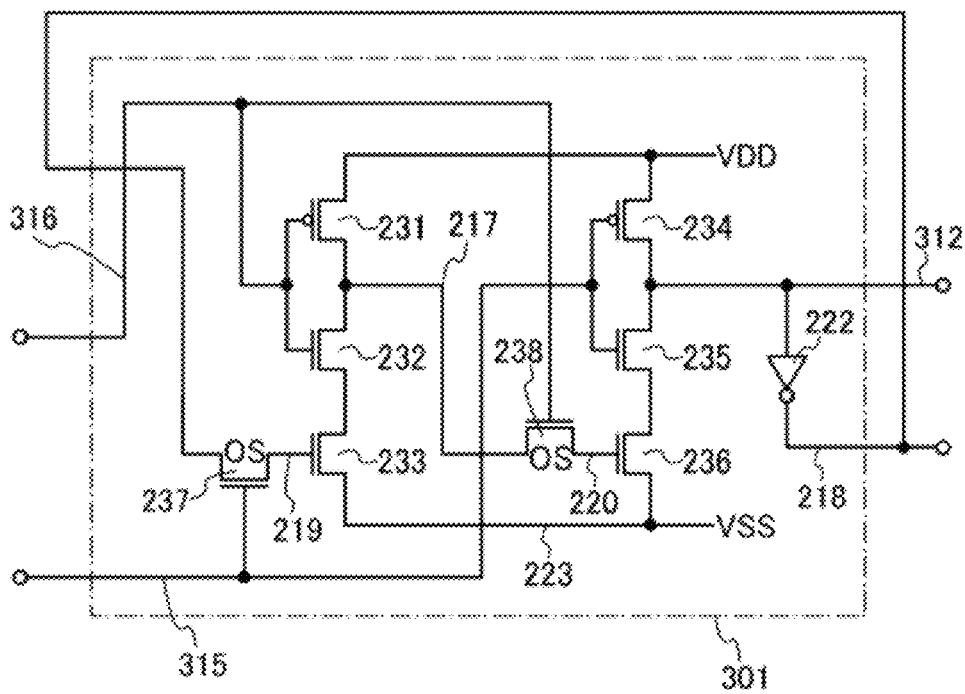
Figure 9A:
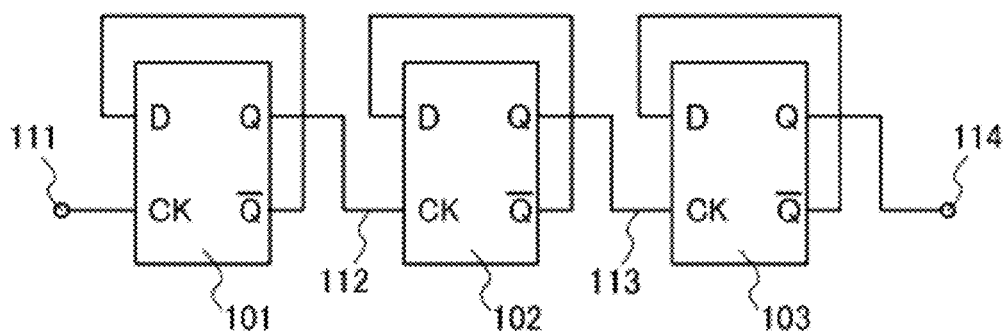
FIGS. 9A and 9B illustrate examples of the configurations and FIG. 9C illustrates an example of the operation, of a general divider circuit.
Figure 9B:
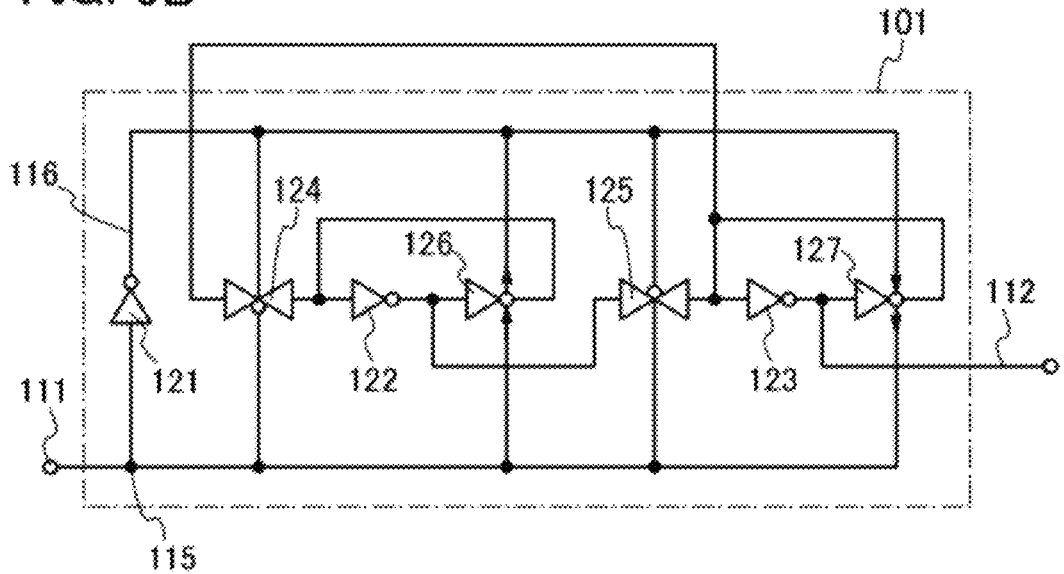
Figure 9C:
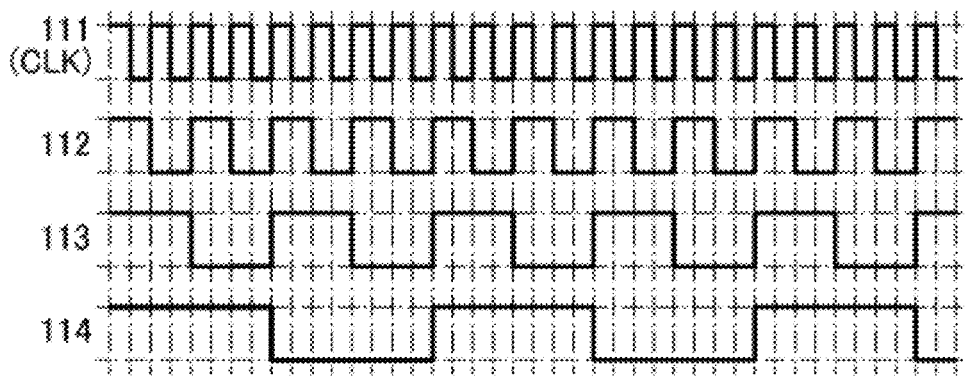

FIG. 8B is a circuit diagram illustrating the configuration of the FF circuit 301.

A node 316 in FIG. 8B corresponds to the clock signal input portion CK. In addition, a node 315 corresponds to the clock bar signal input portion CK bar. The FF circuit 301 is different from the FF circuit 201 shown in FIG. 1B in that the inverter 221 is not provided and the clock bar signal CLKB is input from the outside. In the FF circuit in the second stage or the stage after the second stage, a signal output from the output portion Q bar of the FF circuit in the previous stage can be used as the clock bar signal CLKB.

Since the inverter 221 is not provided in the FF circuit 301, the area of the FF circuit 301 can be smaller than that of the FF circuit 201. That is, the area of the divider circuit 300 can be smaller than that of the divider circuit 200. Other circuit configurations or operation methods can be similar to those of the FF circuit 201, and the description will be omitted.

This embodiment can be implemented by being combined with other embodiments as appropriate.

Embodiment 4

In this embodiment, a structure of a CPU, one of semiconductor devices according to an embodiment of the present invention, will be described.

Figure 11:
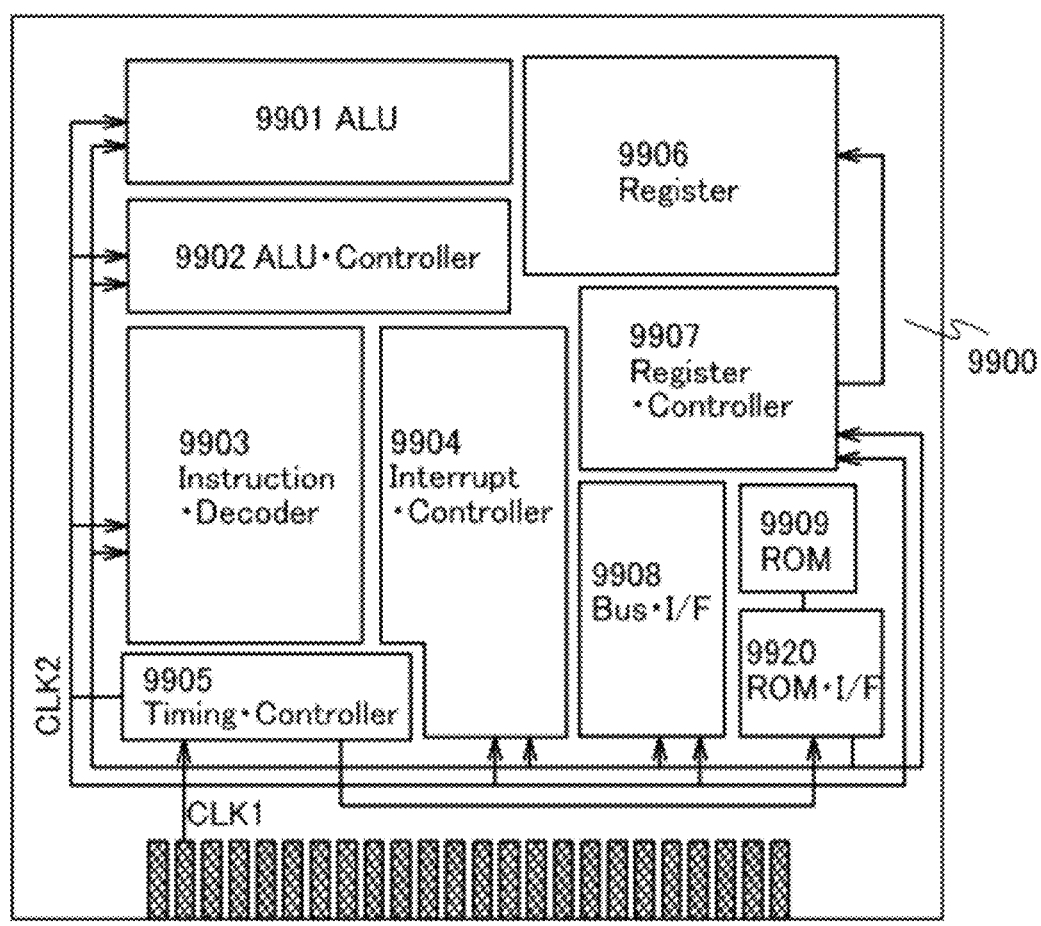
FIG. 11 illustrates the configuration of a CPU.

FIG. 11 illustrates the structure of the CPU in this embodiment. The CPU illustrated in FIG. 11 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900.

Further, the ROM 909 and the ROM I/F 920 may be provided over different chips. Obviously, the CPU shown in FIG. 11 is only an example of a structure which is simplified, and an actual CPU may have various structures depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 includes a divider circuit having the configuration described in the above embodiments and generates signals for controlling operation timing of the ALU 9901, the ALU controller 9902, the instruction decoder 9903, the interrupt controller 9904, and the register controller 9907. For example, the timing controller 9905 is provided with an internal clock generator (divider circuit) for generating an internal clock signal CLK2 on the basis of a reference clock signal CLK1, and inputs the clock signal CLK2 to the above circuits.

By using the divider circuit described in the above embodiments for the structure of the CPU, the area of the CPU can be reduced, and power consumption can be reduced.

Although the example of the CPU is described in this embodiment, the divider circuit of the present invention is not limited to be applied to the CPU and can be used in an LSI such as a microprocessor, an image processing circuit, a digital signal processor (DSP), or a field programmable gate array (FPGA).

This embodiment can be implemented by being combined with other embodiments as appropriate.

Embodiment 5

In this embodiment, a structure and a manufacturing method of a transistor which can be applied to the FF circuit described in the above embodiments will be described with reference to FIGS. 12A to 12D, FIGS. 13A to 13C, FIGS. 14A to 14C, and FIG. 15. Examples of the transistor include an OS transistor and a transistor using silicon for a semiconductor layer where a channel is formed.

Figure 12A:
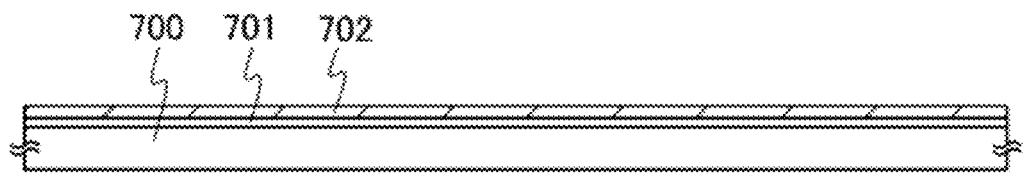
FIGS. 12A to 12D are cross-sectional views illustrating a method for manufacturing a transistor.

As illustrated in FIG. 12A, an insulating film 701 and a semiconductor film 702 that has been separated from a single crystal semiconductor substrate are formed over a substrate 700.

Although there is no particular limitation on a material which can be used as the substrate 700, it is necessary that the material has at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature for the heat treatment performed later is high, a glass substrate whose strain point is higher than or equal to 730° C. is preferably used as the glass substrate.

In this embodiment, an example in which the semiconductor film 702 is a single crystal silicon film is described; however, the semiconductor film 702 can be an amorphous semiconductor film or a crystalline semiconductor film such as a single crystal semiconductor film, a polycrystalline semiconductor film, or a microcrystalline semiconductor film, for example. Examples of a semiconductor material include silicon, germanium, silicon germanium, silicon carbide, and gallium arsenide.

Hereinafter, a method for manufacturing a transistor 732 is described. Note that a specific example of a method for forming the single crystal semiconductor film 702 is briefly described. First, an ion beam including ions which are accelerated by an electric field is made enter a bond substrate which is a single crystal semiconductor substrate and a fragile layer which is locally fragile because of disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately higher than or equal to 1 N/cm$^2$ and lower than or equal to 500 N/cm$^2$, preferably higher than or equal to 11 N/cm$^2$ and lower than or equal to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Then, heat treatment is performed, whereby very small voids that exist in the fragile layer are combined, so that the very small voids increase in volume. Accordingly, a single crystal semiconductor film which is part of the bond substrate is separated from the bond substrate along the fragile layer. The heat treatment is performed at a temperature which does not exceed the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film before being etched to have a predetermined shape or may be added to the semiconductor film 702 which has been etched to have a predetermined shape. Further, the impurity element for controlling the threshold voltage may be added to the bond substrate. Alternatively, the impurity element may be added to the bond substrate in order to roughly control the threshold voltage, and the impurity element may be further added to the semiconductor film before being etched to have a predetermined shape or the semiconductor film 702 which has been etched to have a predetermined shape in order to finely control the threshold voltage.

Note that although an example in which a single crystal semiconductor film is used is described in this embodiment, the present invention is not limited to this structure. For example, a polycrystalline, microcrystalline, or amorphous semiconductor film which is formed over the insulating film 701 by vapor deposition may be used. The semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a highly heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at approximately 950° C.

Figure 12B:
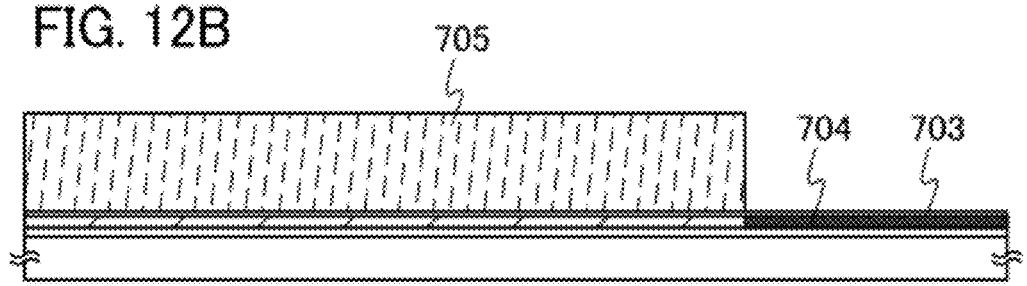

Next, as illustrated in FIG. 12B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed, for example, by using a mixed gas of an inert gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, nitrous oxide ($N_2O$) is diluted with Ar by 1 to 3 times (flow rate) and a microwave (2.45 GHz) electric power of 3 kW to 5 kW is applied with a pressure of 10 Pa to 30 Pa so that the oxidation or nitriding of the surface of the semiconductor film 702 is performed. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) electric power of 3 kW to 5 kW is applied with a pressure of 10 Pa to 30 Pa so that a silicon oxynitride film is formed by vapor deposition, thereby forming a gate insulating film. With a combination of a solid-phase reaction and a reaction by a vapor deposition method, the gate insulating film with low interface state density and excellent withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Moreover, in the case where the semiconductor film has crystallinity, the surface of the semiconductor film is oxidized with solid reaction by the high-density plasma treatment to restrain fast oxidation only in a crystal grain boundary; therefore, the gate insulating film with high uniformity and low interface state density can be formed. Variation in the characteristics of a transistor whose gate insulating film partly or entirely includes an insulating film formed by high-density plasma treatment can be suppressed.

The gate insulating film 703 may be formed to have a single-layer structure or a layered structure using a film including silicon oxide, silicon nitride, silicon nitride oxide, silicon oxynitride, aluminum oxide, aluminum nitride, zirconium oxide, yttrium oxide, lanthanum oxide, cesium oxide, tantalum oxide, magnesium oxide, hafnium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like by a plasma CVD method, a sputtering method, or the like.

Also, in this specification, an oxynitride denotes a substance containing a higher quantity of oxygen than that of nitrogen, and a nitride oxide denotes a substance containing a higher quantity of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma CVD method.

Figure 12C:
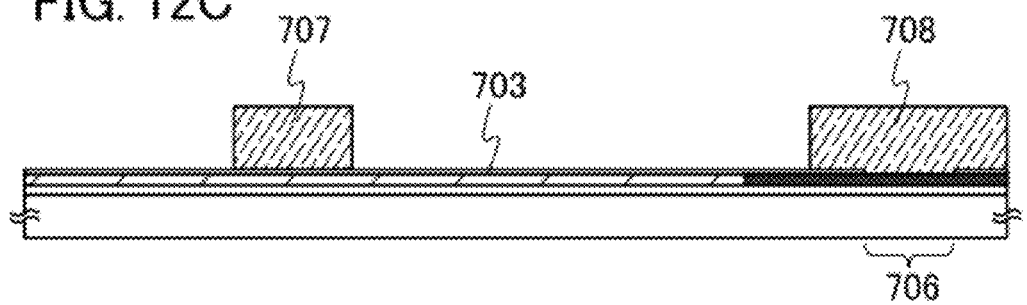

Then, after the mask 705 is removed, part of the gate insulating film 703 is removed as illustrated in FIG. 12C and an opening 706 is formed in a region overlapping with an impurity region 704 by etching or the like. After that, a gate electrode 707 and a conductive film 708 are formed.

A conductive film is formed so as to cover the opening 706 and then is processed into a predetermined shape, so that the gate electrode 707 and the conductive film 708 can be formed. The conductive film 708 is in contact with the impurity region 704 in the opening 706. The conductive film can be formed by a CVD method, a sputtering method, an evaporation method, a spin coating method, or the like. For the conductive film, tantalum (Ta), tungsten (W), titanium (Ti), molybdenum (Mo), aluminum (Al), copper (Cu), chromium (Cr), niobium (Nb), magnesium (Mg), or the like can be used. Alternatively, an alloy containing the above-described metal as its main component or a compound containing the above-described metal may be used. Alternatively, the conductive film may be formed using a semiconductor such as polycrystalline silicon doped with an impurity element such as phosphorus which imparts conductivity.

Note that although the gate electrode 707 and the conductive film 708 are formed using a single-layer conductive film in this embodiment, this embodiment is not limited to this structure. The gate electrode 707 and the conductive film 708 may be formed of a plurality of stacked conductive films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as the combination of two conductive films, for example, nickel silicide and silicon doped with an impurity element which imparts n-type conductivity, tungsten silicide and silicon doped with an impurity element which imparts n-type conductivity, or the like can be used.

In the case of using a three-layer structure including three conductive films stacked, a stacked structure of a molybdenum film, an aluminum film, and a molybdenum film may be employed.

Alternatively, the gate electrode 707 and the conductive film 708 can be a light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like.

Alternatively, the gate electrode 707 and the conductive film 708 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the gate electrode 707 and the conductive film 708 may be formed by forming a conductive film and etching the conductive film into a desired tapered shape by a dry etching method using inductively coupled plasma (ICP) under appropriately controlled conditions (e.g., the amount of electric power applied to a coiled electrode layer, the amount of electric power applied to an electrode layer on the substrate side, and the electrode temperature on the substrate side). In addition, an angle and the like of the tapered shape may also be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 12D:
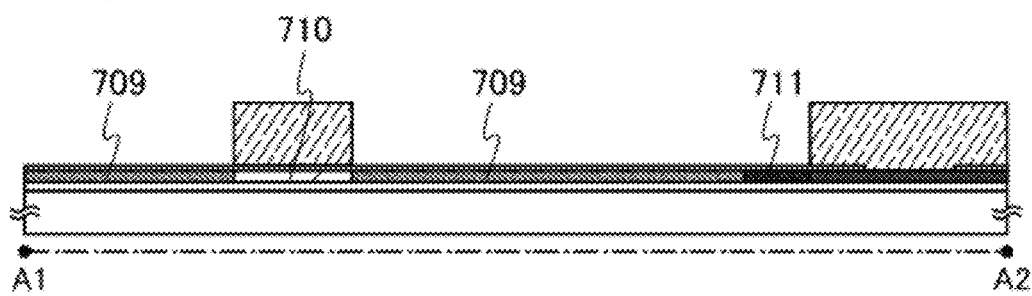

Next, as illustrated in FIG. 12D, an impurity element which imparts one conductivity is added to the semiconductor film 702 with the gate electrode 707 and the conductive film 708 used as masks, whereby a channel formation region 710 overlapping with the gate electrode 707, a pair of impurity regions 709 sandwiching the channel formation region 710, and an impurity region 711 obtained by further adding an impurity element to part of the impurity region 704 are formed in the semiconductor film 702.

In this embodiment, the case where an impurity element which imparts p-type conductivity (e.g., boron) is added to the semiconductor film 702 is described as an example.

Figure 13A:
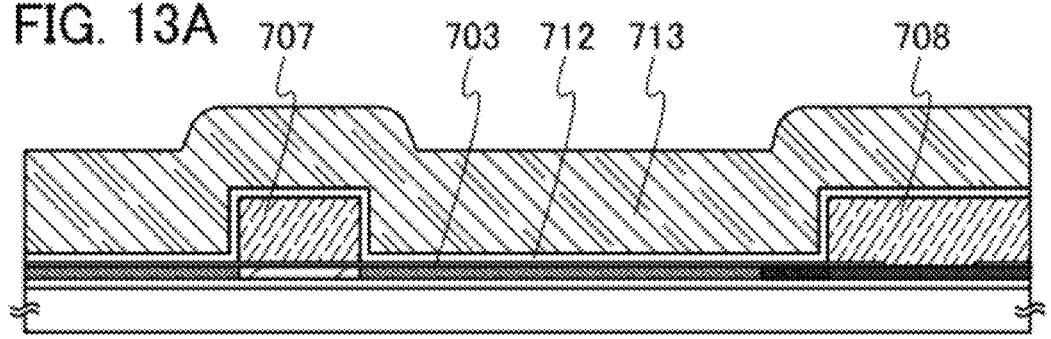
FIGS. 13A to 13C are cross-sectional views illustrating a method for manufacturing a transistor.

Next, as illustrated in FIG. 13A, insulating films 712 and 713 are formed so as to cover the gate insulating film 703, the gate electrode 707, and the conductive film 708. Specifically, the insulating films 712 and 713 may be formed using a single layer or a stack of layers of an inorganic insulating film of silicon oxide, silicon nitride, silicon nitride oxide, silicon oxynitride, aluminum nitride, aluminum oxide, aluminum nitride oxide, aluminum oxynitride, hafnium oxide, zirconium oxide, yttrium oxide, lanthanum oxide, cesium oxide, tantalum oxide, magnesium oxide, or the like. The insulating films 712 and 713 are preferably formed of a low dielectric constant (low-k) material to sufficiently reduce capacitance due to overlapping electrodes or wirings. Note that a porous insulating film containing such a material may be used as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, although an example in which the insulating films 712 and 713 are formed over the gate electrode 707 and the conductive film 708 is described in this embodiment, in the present invention, only one insulating film may be formed over the gate electrode 707 and the conductive film 708, or a plurality of insulating films of three or more layers may be stacked.

Figure 13B:
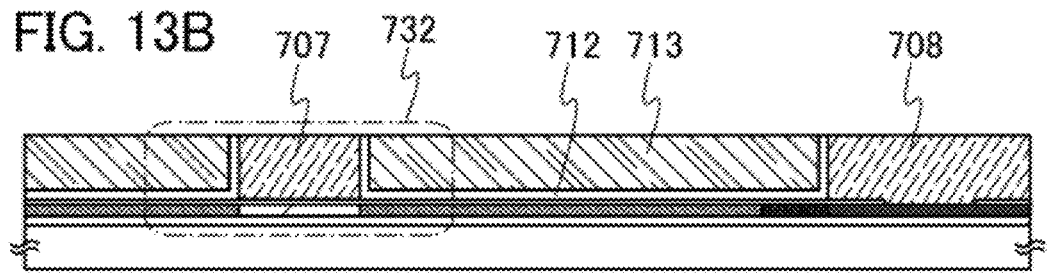

Next, as illustrated in FIG. 13B, the insulating films 712 and 713 are subjected to CMP (chemical mechanical polishing) or etching, so that surfaces of the gate electrode 707 and the conductive film 708 are exposed. Note that in order to improve the characteristics of a transistor 731 which is formed later, surfaces of the insulating films 712 and 713 are preferably planarized as much as possible.

Through the steps described above, the transistor 732 can be formed.

Figure 13C:
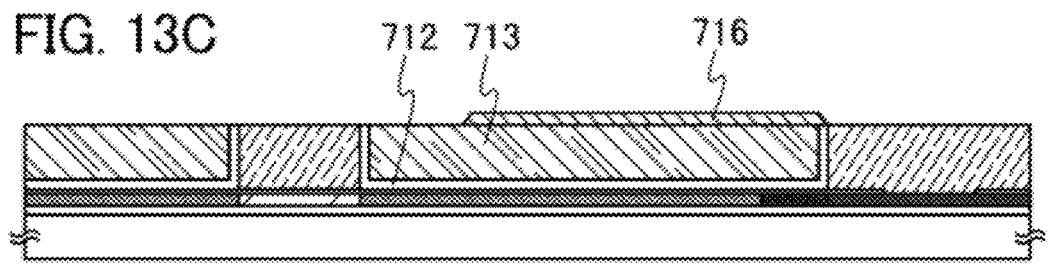

Next, a method for forming the transistor 731 is described. First, as illustrated in FIG. 13C, an oxide semiconductor layer 716 is formed over the insulating film 712 or the insulating film 713.

The oxide semiconductor layer 716 can be formed by processing an oxide semiconductor film formed over the insulating films 712 and 713 into a desired shape. Specifically, a resist mask in a desired pattern is formed over the oxide semiconductor film by a well-known technique such as a photolithography method or an inkjet method. Unnecessary part of the oxide semiconductor film is selectively removed by a well-known technique such as a dry etching method or a wet etching method. In this manner, the oxide semiconductor layer 716 may be formed.

The oxide semiconductor film can be formed by a sputtering method, an evaporation method, a PCVD method, a PLD method, an ALD method, an MBE method, or the like. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm.

When the oxide semiconductor film is formed by a sputtering method, a metal oxide containing In and Zn can be used as a target, for example. As the sputtering gas, a rare gas (typically, argon), oxygen, or a mixed gas of a rare gas and oxygen can be used. In the case where a mixed gas of a rare gas and oxygen is used as a sputtering gas, the percentage of the oxygen gas is higher than or equal to 30 vol. %, preferably higher than or equal to 50 vol. %, more preferably higher than or equal to 80 vol. %. As the oxide semiconductor film is thinner, the short channel effect of the transistor can be reduced. However, when the oxide semiconductor film is too thin, the oxide semiconductor film is significantly influenced by interface scattering; thus, the field-effect mobility might be decreased.

Note that before the oxide semiconductor film is formed by a sputtering method, dust on surfaces of the insulating films 712 and 713 are preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As an oxide semiconductor, a material containing at least indium (In) or zinc (Zn) is preferably used. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. Further, $SiO_2$ may be contained in the above oxide semiconductor.

Note that here, for example, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0) may be used as an oxide semiconductor. Note that M denotes one metal element or a plurality of metal elements selected from Sn, Zn, Ga, Fe, Ni, Mn, and Co. As the oxide semiconductor, a material represented by $In_3SnO_5(ZnO)_n$ (n>0) may also be used.

For example, an In—Ga—Zn-based oxide with an atomic ratio of In:Ga:Zn=1:1:1 or In:Ga:Zn=2:2:1, or any of oxides whose composition is in the neighborhood of the above compositions can be used. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above compositions may be used.

However, without limitation to the materials given above, a material with an appropriate composition may be used depending on needed semiconductor characteristics (e.g., field-effect mobility, the threshold voltage, and variation). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high field-effect mobility can be obtained relatively easily in the case of using an In—Sn—Zn-based oxide. However, field-effect mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

In the case where an In—Zn-based oxide semiconductor is used as the oxide semiconductor, the atomic ratio is set so that In/Zn ranges from 0.5 to 50, preferably from 1 to 20, more preferably from 1.5 to 15. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

In this embodiment, as the oxide semiconductor film, an In—Ga—Zn-based oxide semiconductor thin film with a thickness of 30 nm, which is obtained by a sputtering method using a metal oxide target including indium (In), gallium (Ga), and zinc (Zn), is used. As the above target, for example, a target having an atomic ratio of In:Ga:Zn=1:1:0.5, In:Ga:Zn=1:1:1, or In:Ga:Zn=1:1:2 can be used. The relative density of the metal oxide target used for forming an oxide semiconductor is higher than or equal to 90% and lower than or equal to 100%, preferably higher than or equal to 95% and lower than 100%. With the use of the target with high relative density, a dense oxide semiconductor film can be formed. An In—Ga—Zn-based oxide semiconductor can be referred to as IGZO.

In the case where an In—Sn—Zn-based oxide thin film is used for the oxide semiconductor film, a target for formation of the In—Sn—Zn-based oxide by a sputtering method may have a composition ratio of In:Sn:Zn=1:2:2, 2:1:3, 1:1:1, or 20:45:35 in an atomic ratio, for example.

Note that in the case where the oxide semiconductor film is formed using a target including indium (In) and zinc (Zn), the atomic ratio of the target is In/Zn=greater than or equal to 0.5 and less than or equal to 50, preferably greater than or equal to 1 and less than or equal to 20, more preferably greater than or equal to 1.5 to and less than or equal to 15. The field-effect mobility can be improved by keeping the ratio of Zn within the above range.

In this embodiment, the oxide semiconductor film is formed in such a manner that the substrate is held in a deposition chamber kept in a reduced pressure state, moisture remaining in the deposition chamber is removed, a sputtering gas from which hydrogen and moisture are removed is introduced, and the target is used. A highly purified gas is preferably used as the sputtering gas. For example, when argon is used as a sputtering gas, it is preferable that the purity be 9N, the dew point be −121° C., the content of $H_2O$ be lower than or equal to 0.1 ppb, and the content of $H_2$ be lower than or equal to 0.5 ppb. When oxygen is used as a sputtering gas, it is preferable that the purity be 8N, the dew point be −112° C., the content of $H_2O$ be lower than or equal to 1 ppb, and the content of $H_2$ be lower than or equal to 1 ppb.

The oxide semiconductor film preferably contains a larger amount of oxygen than the stoichiometric proportion. When the amount of oxygen is in excess of stoichiometric proportion, generation of carriers which result from oxygen vacancies in the oxide semiconductor can be suppressed.

The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. In addition, damage by sputtering can be reduced. In order to remove moisture remaining in the deposition chamber, an adsorption type vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities contained in the oxide semiconductor film formed in the deposition chamber can be reduced.

An example of the deposition conditions is as follows: the distance between the substrate and the target is 100 mm, the pressure is 0.6 Pa, the electric power of the DC power source is 0.5 kW, and oxygen (the flow rate of oxygen is 100%) is used as a sputtering gas. Note that a pulsed direct-current (DC) power source is preferable because dust generated in deposition can be reduced and the film thickness can be made uniform.

Further, when the leakage rate of the deposition chamber of the sputtering apparatus is set to lower than or equal to $1 \times 10^{-10}$ Pa·m$^3$/s, entry of impurities such as an alkali metal and hydride to the oxide semiconductor film that is being deposited by sputtering can be reduced. Further, with the use of an adsorption type vacuum pump as an evacuation system, counter flow of impurities, such as alkali metal, hydrogen atoms, hydrogen molecules, water, a hydroxyl group, or hydride, from the evacuation system can be reduced.

When the purity of the target is set to higher than or equal to 99.99%, alkali metal, hydrogen atoms, hydrogen molecules, water, a hydroxyl group, hydride, or the like which enters the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and water be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of the sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, a reactive ion etching (RIE) method can be used. For generation of plasma, a capacitively coupled plasma (CCP) method, an inductively coupled plasma (ICP) method, an electron cyclotron resonance (ECR) plasma method, a helicon wave plasma (HWP) method, a microwave-excited surface wave plasma (SWP) method, or the like can be used. When a dry etching is performed as the etching, the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step to remove a resist residue or the like left over surfaces of the oxide semiconductor layer 716 and the insulating films 712 and 713.

The oxide semiconductor film formed by sputtering or the like contains a large amount of water or hydrogen (including a hydroxyl group) as an impurity in some cases. Water or hydrogen easily forms a donor level and thus serves as an impurity in the oxide semiconductor. Thus, in one mode of the present invention, in order to reduce impurities such as water or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is lower than or equal to 20 ppm (−55° C. in a dew point), preferably lower than or equal to 1 ppm, more preferably lower than or equal to 10 ppb, in the case where measurement is performed by a dew point meter of a cavity ring down laser spectroscopy (CRDS) method).

By performing heat treatment on the oxide semiconductor layer 716, water or hydrogen in the oxide semiconductor layer 716 can be eliminated. Specifically, heat treatment may be performed at a temperature of higher than or equal to 250° C. and lower than or equal to 750° C., preferably higher than or equal to 400° C. and lower than the strain point of a substrate. For example, heat treatment may be performed at 500° C. for approximately three minutes to six minutes, inclusive. When an RTA method is used for the heat treatment, dehydration or dehydrogenation can be performed for a short time; therefore, even when a glass substrate is used as the substrate, treatment can be performed even at a temperature of higher than the strain point of a glass substrate.

In this embodiment, an electric furnace that is one of heat treatment apparatuses is used.

Note that the heat treatment apparatus is not limited to an electric furnace, and may have a device for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that water, hydrogen, or the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably lower than or equal to 1 ppm, more preferably lower than or equal to 0.1 ppm).

Through the above steps, the concentration of hydrogen in the oxide semiconductor layer 716 can be reduced and the oxide semiconductor layer 716 can be highly purified.

After the oxide semiconductor layer 716 is formed, oxygen may be introduced thereinto by an ion implantation method. Oxygen can be alternatively introduced by a plasma doping method. Specifically, oxygen is turned into plasma with the use of radio-frequency (RF) power, and oxygen radicals and/or oxygen ions are introduced into the oxide semiconductor layer 716. At this time, it is preferable to apply a bias to the substrate over which the oxide semiconductor layer 716 is formed. By increasing the bias applied to the substrate, oxygen can be introduced more deeply.

Oxygen (an oxygen radical, an oxygen atom, and/or an oxygen ion) introduced into the oxide semiconductor layer 716 by a plasma doping method may be supplied from a plasma generation apparatus with the use of a gas containing oxygen or from an ozone generation apparatus.

After the introduction of oxygen to the oxide semiconductor layer 716, the heat treatment may be performed (preferably at higher than or equal to 200° C. and lower than or equal to 600° C., for example, at higher than or equal to 250° C. and lower than or equal to 550° C.). For example, the heat treatment is performed at 450° C. for one hour in a nitrogen atmosphere. It is preferable that the above atmosphere do not contain water, hydrogen, or the like.

By introduction of oxygen to the oxide semiconductor layer 716 and heat treatment, it is possible to supply oxygen, which is one of the main components of the oxide semiconductor and is reduced at the same time as a step for removing impurities, so that the oxide semiconductor layer 716 can be made to be i-type (intrinsic).

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high field-effect mobility can be obtained relatively easily.

In an oxide semiconductor having crystallinity, defects in the bulk can be further reduced, and when the surface flatness of the oxide semiconductor is improved, the field-effect mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness (Ra) of less than or equal to 1 nm, preferably less than or equal to 0.3 nm, more preferably less than or equal to 0.1 nm. Ra can be measured using an atomic force microscope (AFM).

When an oxide semiconductor having crystallinity is used for the oxide semiconductor layer 716, the insulating film 713 that is in contact with the oxide semiconductor layer 716 preferably has a sufficient planarity so that crystals of the oxide semiconductor are easily grown. Alternatively, an insulating film which has a sufficient planarity may be provided between the insulating film 713 and the oxide semiconductor layer 716.

As the oxide semiconductor having crystallinity, an oxide semiconductor including a crystal with c-axis alignment (also referred to as a c-axis aligned crystalline oxide semiconductor (CAAC-OS)), which has a triangular or hexagonal atomic arrangement when seen from the direction of an a-b plane, a surface, or an interface is preferably used. In the crystal, metal atoms are arranged in a layered manner or metal atoms and oxygen atoms are arranged in a layered manner along the c-axis, and the direction of the a-axis or the b-axis is varied in the a-b plane (the crystal rotates around the c-axis).

In a broad sense, CAAC-OS means a non-single-crystal including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal, but does not consist only of an amorphous portion. Although the CAAC-OS includes a crystallized portion (crystalline portion), a boundary between one crystalline portion and another crystalline portion is not clear in some cases.

Nitrogen may be substituted for part of oxygen which is a constituent of the CAAC-OS. The c-axes of the crystalline portions included in the CAAC-OS may be aligned in one direction (e.g., a direction perpendicular to a surface of a substrate over which the CAAC-OS is formed, a surface of the CAAC-OS, or the like). Alternatively, the normals of the a-b planes of individual crystalline portions included in the CAAC-OS may be aligned in one direction (e.g., the direction perpendicular to a surface of a substrate over which the CAAC-OS is formed, a surface of the CAAC-OS, or the like).

The CAAC-OS may become a conductor or an insulator depending on its composition or the like. The CAAC-OS transmits or does not transmit visible light depending on its composition or the like.

An example of such CAAC-OS is an oxide which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC-OS will be described in detail with reference to FIGS. 18A to 18E, FIGS. 19A to 19C, and FIGS. 20A to 20C. In FIGS. 18A to 18E, FIGS. 19A to 19C, and FIGS. 20A to 20C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 18A to 18E, O surrounded by a circle represents a tetracoordinate O atom, and O surrounded by a double circle represents a tricoordinate O atom.

Figure 18A:
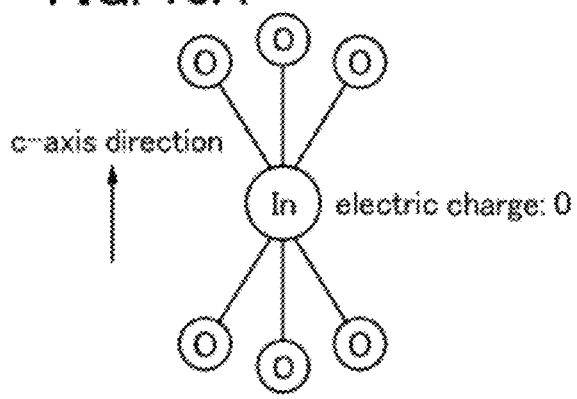
FIGS. 18A to 18E each illustrate a crystal structure of an oxide material.

FIG. 18A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0.

Figure 18D:
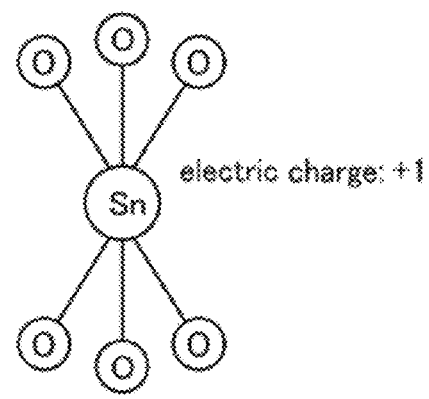
Figure 18B:
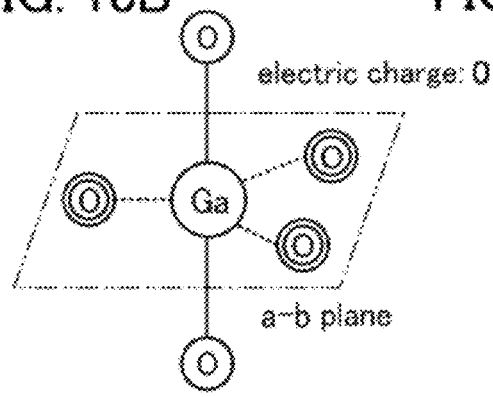

FIG. 18B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
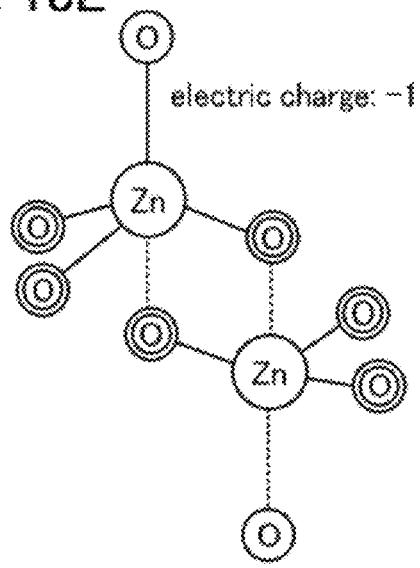
Figure 18C:
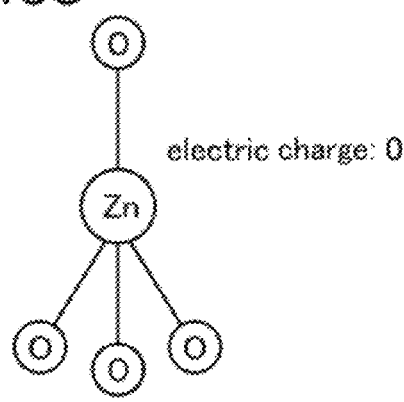

FIG. 18C illustrates a structure including one tetracoordinate Zn atom and four tetracoordinate O atoms proximate to the Zn atom. In FIG. 18C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 18C. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half. In the small group illustrated in FIG. 18D, electric charge is +1.

FIG. 18E illustrates a small group including two Zn atoms. In FIG. 18E, one tetracoordinate O atom exists in each of an upper half and a lower half. In the small group illustrated in FIG. 18E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 18A each have three proximate In atoms in the downward direction, and the three O atoms in the lower half each have three proximate In atoms in the upward direction. The one O atom in the upper half with respect to the pentacoordinate Ga atom in FIG. 18B has one proximate Ga atom in the downward direction, and the one O atom in the lower half has one proximate Ga atom in the upward direction. The one O atom in the upper half with respect to the tetracoordinate Zn atom in FIG. 18C has one proximate Zn atom in the downward direction, and the three O atoms in the lower half each have three proximate Zn atoms in the upward direction. In this manner, the number of the tetracoordinated O atoms above the metal atom is equal to the number of the metal atoms proximate to and below each of the tetracoordinated O atoms. Similarly, the number of the tetracoordinate O atoms below the metal atom is equal to the number of the metal atoms proximate to and above each of the tetracoordinate O atoms. Since the coordination number of the tetracoordinate O atoms is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 19A:
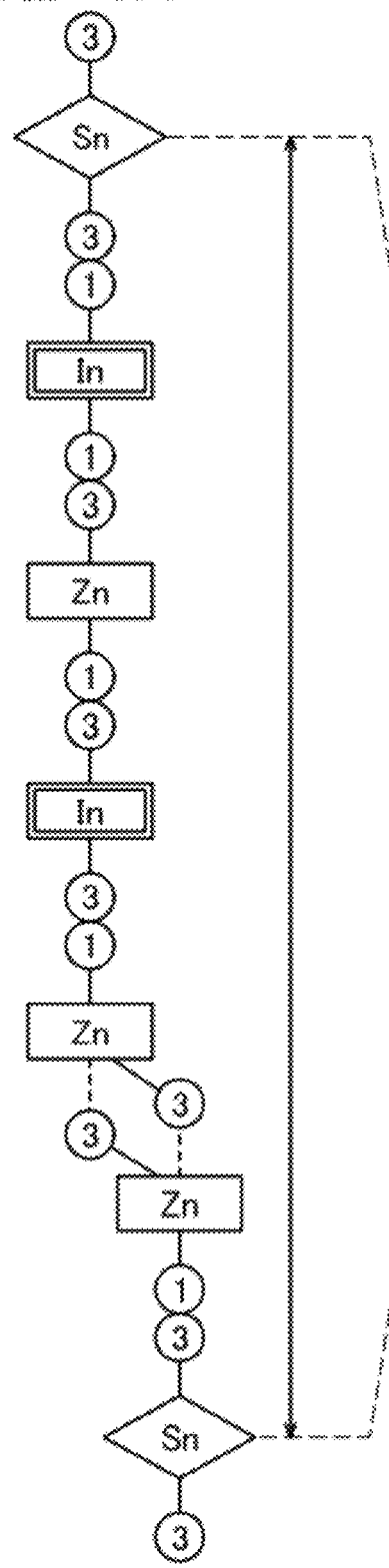
FIGS. 19A to 19C illustrate a crystal structure of an oxide material.
Figure 19B:
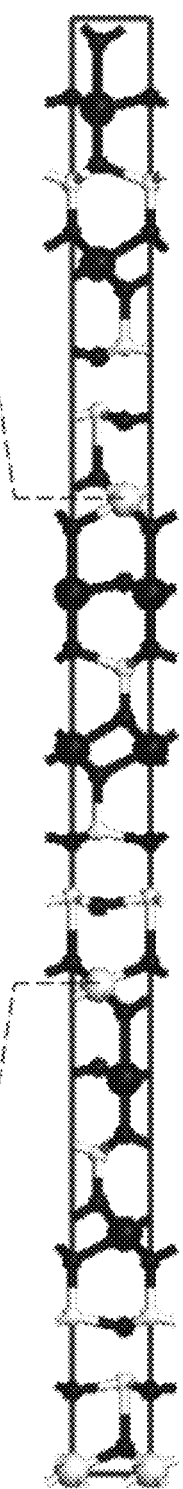
Figure 19C:
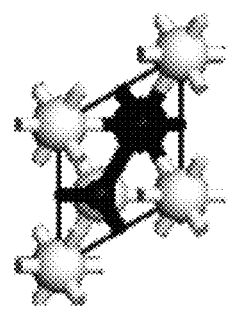

FIG. 19A illustrates a model of a medium group included in a layered structure of an In—Sn—Zn-based oxide. FIG. 19B illustrates a large group including three medium groups. Note that FIG. 19C illustrates an atomic arrangement in the case where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, the state that three tetracoordinate O atoms existing in each of an upper half and a lower half with respect to a Sn atom is denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

When the large group illustrated in FIG. 19B is repeated, a crystal of an In—Sn—Zn-based oxide ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a one-component metal oxide such as an In-based oxide, a Sn-based oxide, or a Zn-based oxide; and the like.

Figure 20A:
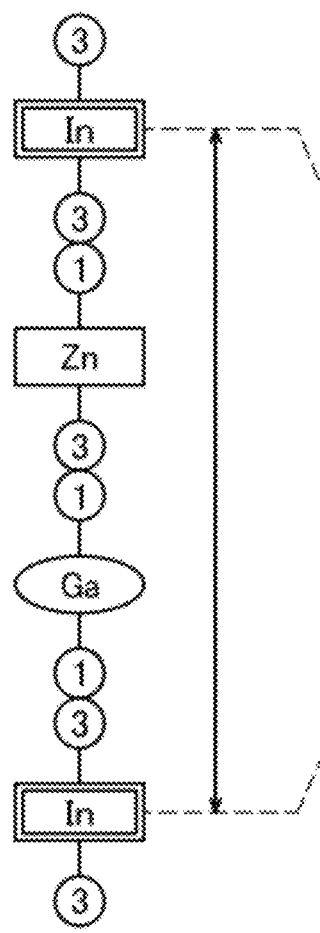
FIGS. 20A to 20C illustrate a crystal structure of an oxide material.

As an example, FIG. 20A illustrates a model of a medium group included in a layered structure of an In—Ga—Zn-based oxide.

In the medium group included in the layered structure of the In—Ga—Zn-based oxide in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 20B:
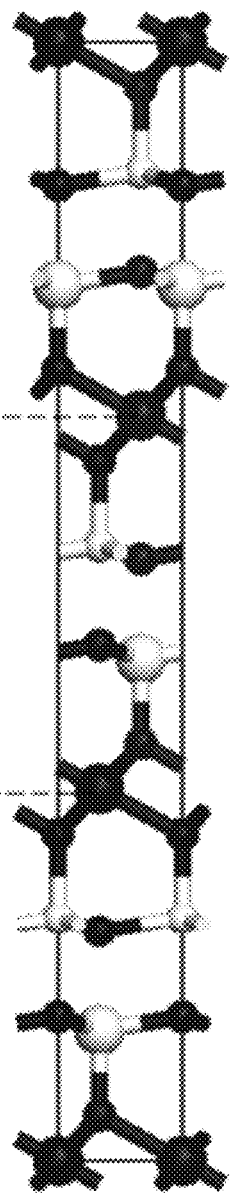
Figure 20C:
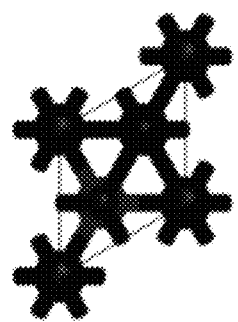

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 20A but also a medium group in which the arrangement of the In atom, the Ga atom, and the Zn atom is different from that in FIG. 20A.

When the large group illustrated in FIG. 20B is repeated, a crystal of an In—Ga—Zn-based oxide can be obtained. Note that a layered structure of the obtained In—Ga—Zn-based oxide can be expressed as a composition formula, $InGaO_3(ZnO)_n$ (n is a natural number).

Figure 21A:
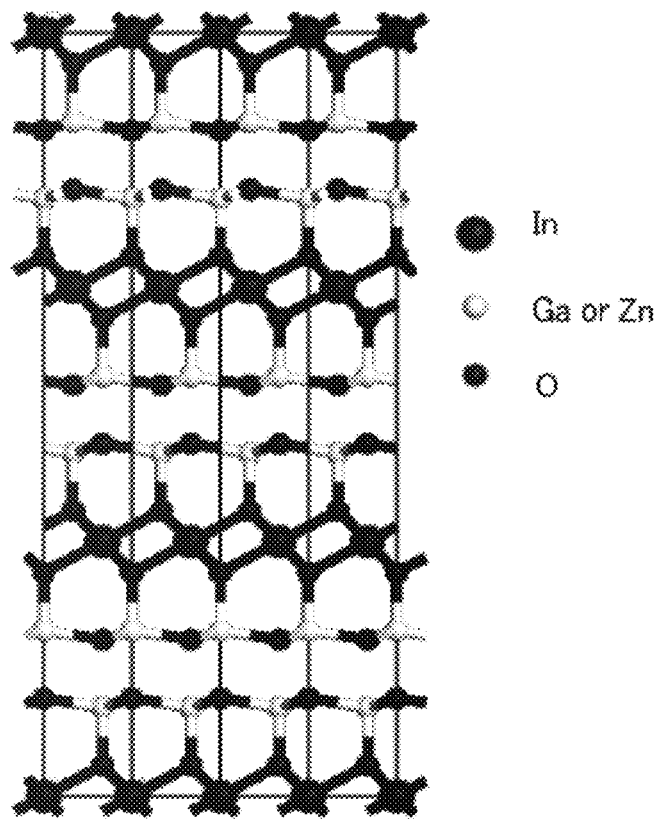
FIGS. 21A and 21B each illustrate a crystal structure of an oxide material.

In the case where n=1 ($InGaZnO_4$), a crystal structure illustrated in FIG. 21A can be obtained, for example. Note that in the crystal structure in FIG. 21A, since a Ga atom and an In atom each have five ligands as described in FIG. 18B, a structure in which Ga is replaced with In can be obtained.

Figure 21B:
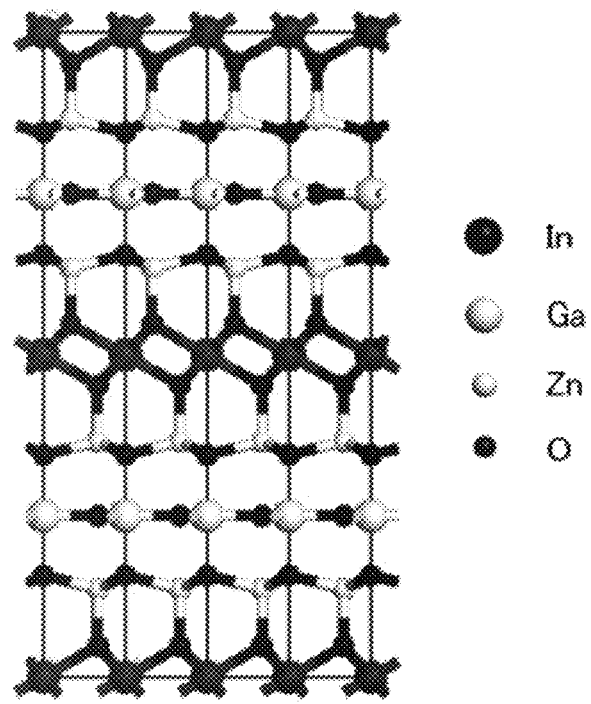

In the case where n=2 ($InGaZn_2O_5$), a crystal structure illustrated in FIG. 21B can be obtained, for example. Note that in the crystal structure in FIG. 21B, since a Ga atom and an In atom each have five ligands as described in FIG. 18B, a structure in which Ga is replaced with In can be obtained.

Figure 14A:
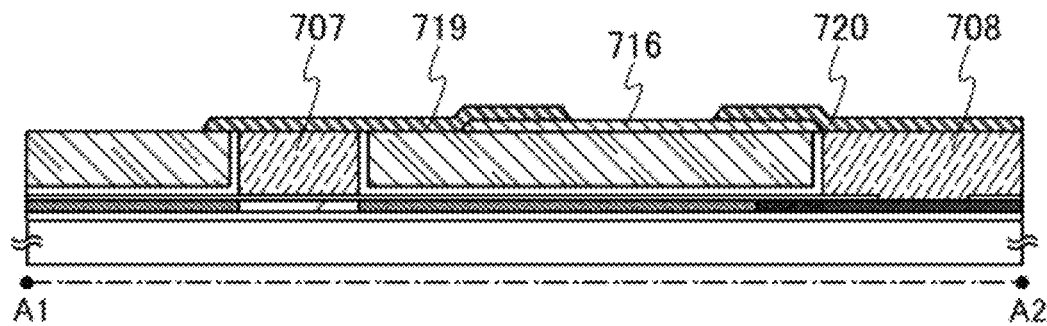
FIGS. 14A to 14C are cross-sectional views illustrating a method for manufacturing a transistor.

Then, as illustrated in FIG. 14A, the conductive film 719 which is in contact with the gate electrode 707 and the oxide semiconductor layer 716, and the conductive film 720 which is in contact with the conductive film 708 and the oxide semiconductor layer 716 are formed. The conductive films 719 and 720 function as a source and drain electrodes.

Specifically, the conductive films 719 and 720 can be formed in such a manner that a conductive film is formed so as to cover the gate electrode 707 and the conductive film 708 by a sputtering method or a vacuum evaporation method and then is processed into a predetermined shape.

As the conductive film which serves as the conductive films 719 and 720, any of the following materials can be used: an element selected from aluminum, chromium, copper, tantalum, titanium, molybdenum, tungsten, and magnesium; an alloy including any of the above elements as its component; an alloy film including any of the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film including a Cu—Mg—Al alloy, a Mo—Ti alloy, Ti, or Mo is used for the lower layer and a conductive film including Cu is used for the upper layer; thus, the adhesiveness between an insulating film which is an oxide film and the conductive films 719 and 720 can be increased.

As the conductive film which serves as the conductive films 719 and 720, a conductive metal oxide may be used. As the conductive metal oxide, indium oxide, tin oxide, zinc oxide, a mixture of indium oxide and tin oxide, a mixture of indium oxide and zinc oxide, or the metal oxide material containing silicon or silicon oxide can be used.

In the case where heat treatment is performed after formation of the conductive film, the conductive film preferably has heat resistance enough to withstand the heat treatment.

Note that the material and etching conditions are adjusted as appropriate so that the oxide semiconductor layer 716 is not removed in etching of the conductive film as much as possible. Depending on the etching conditions, there are some cases in which an exposed portion of the oxide semiconductor layer 716 is partially etched and thus a groove (a depression portion) is formed.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask through which light is transmitted so as to have a plurality of intensities. A resist mask formed using a multi-tone mask has a plurality of thicknesses and can be changed in shape by etching; thus, the resist mask can be used in a plurality of etching steps for processing a film into different patterns. Therefore, a resist mask corresponding to at least two kinds of different patterns can be formed by one multi-tone mask. Thus, the number of light-exposure masks can be reduced and the number of corresponding photolithography steps can also be reduced, whereby simplification of a process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, zinc gallium oxide, or the like can be used.

For example, in the case where the oxide conductive film is formed, an etching process for forming the oxide conductive film and an etching process for forming the conductive films 719 and 720 may be performed concurrently.

By providing the oxide conductive film functioning as a source region and a drain region, the resistance between the oxide semiconductor layer 716 and the conductive films 719 and 720 can be lowered, so that the transistor can operate at high speed. In addition, by providing the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 14B:
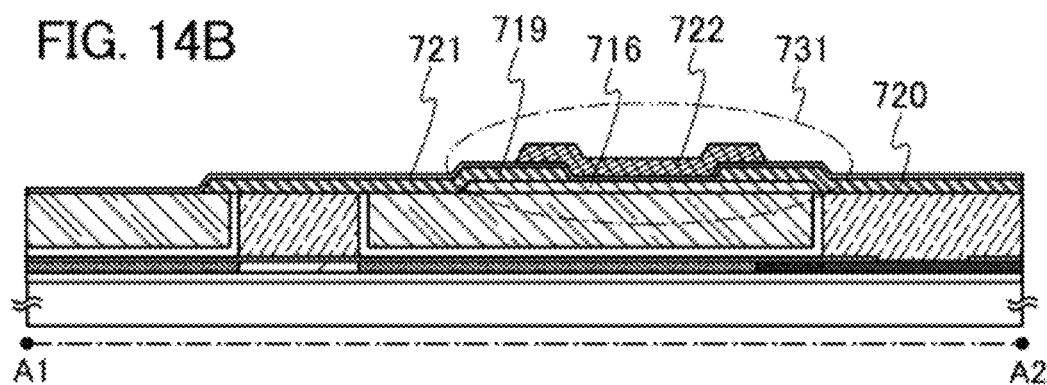

After the plasma treatment, as illustrated in FIG. 14B, the gate insulating film 721 is formed so as to cover the conductive films 719 and 720 and the oxide semiconductor layer 716. Then, a gate electrode 722 is formed over the gate insulating film 721 to overlap with the oxide semiconductor layer 716.

The gate insulating film 721 can be formed using a material and a layered structure which are similar to those of the gate insulating film 703. Note that the gate insulating film 721 preferably includes impurities such as water or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed.

Thus, it is important that a deposition method in which hydrogen is not used be employed in order to form the gate insulating film 721 containing hydrogen as little as possible. It is preferable that the gate insulating film 721 also include an oxygen-excess region for the following reason. When the gate insulating film 721 includes an oxygen-excess region, oxygen can be prevented from moving from the oxide semiconductor layer 716 to the gate insulating film 721, and oxygen can be supplied from the gate insulating film 721 to the oxide semiconductor layer 716.

The gate insulating film 721 may be formed using a material that has a high barrier property against an alkali metal, hydrogen, and oxygen. The gate insulating film 721 may be formed by stacking an insulating film including an oxygen-excess region and an insulating film having a high barrier property. For example, as the insulating film having a high barrier property, a silicon nitride film, a silicon nitride oxide film, an aluminum nitride film, an aluminum oxide film, an aluminum oxynitride film, an aluminum nitride oxide film, or the like can be used. In the case where the gate insulating film 721 is formed by stacking an insulating film including an oxygen-excess region and an insulating film having a high barrier property, the insulating film including an oxygen-excess region can be formed in contact with the oxide semiconductor layer 716.

When the insulating film having a high barrier property is used, impurities can be prevented from entering the oxide semiconductor layer 716, an interface between the oxide semiconductor layer 716 and the insulating film, and the vicinity thereof, and oxygen can be prevented from being released from the oxide semiconductor layer 716.

In this embodiment, the gate insulating film 721 has a structure in which a 100-nm-thick silicon nitride film formed by a sputtering method is stacked over a 200-nm-thick silicon oxide film formed by a sputtering method. The substrate temperature in film formation may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature of higher than or equal to 200° C. and lower than or equal to 400° C., for example, higher than or equal to 250° C. and lower than or equal to 350° C. It is preferable that the water content in the gas be lower than or equal to 20 ppm, preferably lower than or equal to 1 ppm, more preferably lower than or equal to 10 ppb. In this embodiment, for example, heat treatment is performed at 250° C. for one hour in a nitrogen atmosphere. Alternatively, RTA treatment for a short time at a high temperature may be performed before the formation of the conductive films 719 and 720 in a manner similar to that of the heat treatment performed on the oxide semiconductor layer for reduction of water or hydrogen. Even when oxygen vacancies are generated in the oxide semiconductor layer 716 by the previous heat treatment performed on the oxide semiconductor layer 716, by performing heat treatment after providing the gate insulating film 721 containing oxygen, oxygen is supplied to the oxide semiconductor layer 716 from the gate insulating film 721.

By supplying oxygen to the oxide semiconductor layer 716, oxygen vacancies that serve as a donor can be reduced in the oxide semiconductor layer 716 and the stoichiometric ratio can be satisfied. As a result, the oxide semiconductor layer 716 can be made to be substantially i-type and variation in electric characteristics of the transistor due to oxygen vacancies can be reduced; thus, electric characteristics can be improved. The timing of this heat treatment is not particularly limited as long as it is after the formation of the gate insulating film 721. When this heat treatment doubles as another step such as heat treatment for formation of a resin film or heat treatment for reduction of the resistance of a transparent conductive film, the oxide semiconductor layer 716 can be made to be substantially i-type without the number of steps increased.

Moreover, the oxygen vacancies that serve as a donor in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%), more preferably greater than or equal to 7N (99.99999%) (that is, the impurity concentration in the oxygen gas is lower than or equal to 1 ppm, preferably lower than or equal to 0.1 ppm).

The gate electrode 722 can be formed in such a manner that a conductive film is formed over the gate insulating film 721 and then is etched. The gate electrode 722 can be formed using a material similar to those of the gate electrode 707 and the conductive films 719 and 720.

The thickness of the gate electrode 722 is 10 nm to 400 nm, preferably 100 nm to 200 nm In this embodiment, after a 150-nm-thick conductive film for the gate electrode is formed by a sputtering method using a tungsten target, the conductive film is etched into a desired shape, so that the gate electrode 722 is formed. Note that a resist mask may be formed by an inkjet method. Formation of the resist mask by an inkjet method needs no photomask; thus, manufacturing cost can be reduced.

The above steps allow the transistor 731 to be formed.

Although the transistor 731 is described as a single-gate transistor, a multi-gate transistor including a plurality of channel formation regions can be formed when a plurality of gate electrodes which are electrically connected are included when needed.

Note that an insulating film in contact with the oxide semiconductor layer 716 (which corresponds to the gate insulating film 721 in this embodiment) may be formed using an insulating material containing an element that belongs to Group 13 and oxygen. Many of oxide semiconductor materials contain elements that belong to Group 13, and an insulating material containing an element that belongs to Group 13 is compatible with an oxide semiconductor. Thus, when an insulating material containing an element that belongs to Group 13 is used for the insulating film in contact with the oxide semiconductor layer, the state of the interface between the oxide semiconductor layer and the insulating film can be kept favorable.

An insulating material containing an element that belongs to Group 13 is an insulating material containing one or more elements that belong to Group 13. As the insulating material containing an element that belongs to Group 13, gallium oxide, aluminum oxide, aluminum gallium oxide, gallium aluminum oxide, and the like are given for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced. Note that a similar effect can be obtained in the case where an element in the same group as a constituent element of the oxide semiconductor is used in an insulating film. For example, it is also effective to form an insulating film with the use of a material including aluminum oxide. Note that water is less likely to permeate aluminum oxide which has a barrier property, and it is therefore preferable to use a material containing aluminum oxide in terms of preventing entry of water into the oxide semiconductor layer.

Similarly to the gate insulating film 721, the insulating film 713 is preferably formed using a material including an oxygen-excess region (a region containing oxygen at a proportion exceeding the stoichiometric composition). An insulating film including an oxygen-excess region may also be formed between the insulating film 713 and the oxide semiconductor layer 716.

Oxygen doping treatment is performed on an insulating film, so that the insulating film including an oxygen-excess region can be formed. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method, an ion doping method, or a plasma doping method.

For example, in the case where the insulating film in contact with the oxide semiconductor layer 716 is formed using gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

When the insulating film including an oxygen-excess region is formed in contact with the oxide semiconductor layer 716 and heat treatment is performed, oxygen that exists in excess in the insulating film is supplied to the oxide semiconductor layer, and oxygen defects in the oxide semiconductor layer or at the interface between the oxide semiconductor layer and the insulating film are reduced. Thus, the oxide semiconductor layer can be an intrinsic or substantially intrinsic oxide semiconductor.

The insulating film including an oxygen excess region may be applied to either the insulating film located on the upper side of the oxide semiconductor layer 716 or the insulating film located on the lower side of the oxide semiconductor layer 716 of the insulating films in contact with the oxide semiconductor layer 716; however, it is preferable to apply such an insulating film to both the insulating films in contact with the oxide semiconductor layer 716. The above advantageous effect can be enhanced with a structure where the oxide semiconductor layer 716 is sandwiched between the insulating films each including an oxygen excess region, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent elements or different constituent elements. For example, the insulating films on the upper side and the lower side may be both formed of gallium oxide whose composition is $Ga_2O_x$ ($x=3+\alpha$, $0<\alpha<1$). Alternatively, one of the insulating films on the upper side and the lower side may be formed of $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating film in contact with the oxide semiconductor layer 716 may be formed by stacking insulating films which each include an oxygen excess region. For example, the insulating film on the upper side of the oxide semiconductor layer 716 may be formed as follows: gallium oxide whose composition is $Ga_2O_x$ (x=3+a, 0<a<1) is formed and gallium aluminum oxide (aluminum gallium oxide) whose composition is $Ga_xAl_{2-x}O_{3+a}$ (0<x<2, 0<a<1) is formed thereover.

Figure 14C:
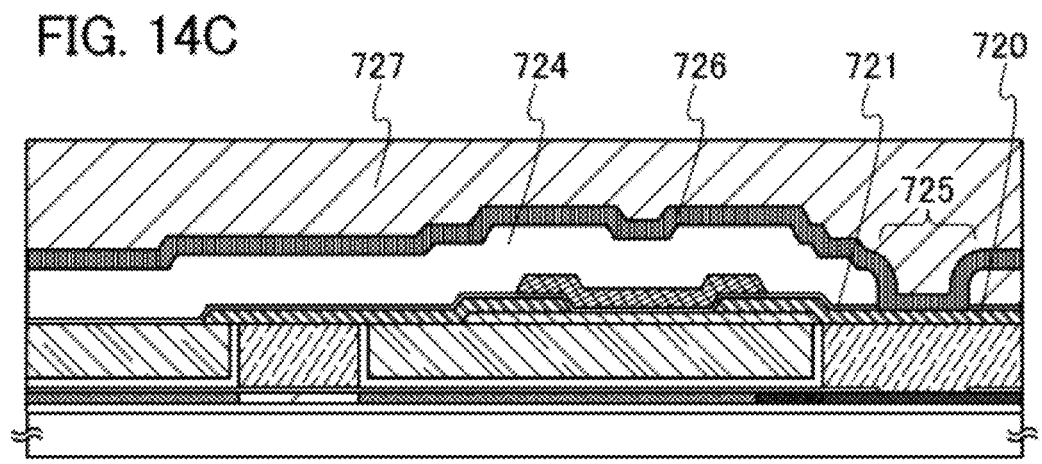

Next, as illustrated in FIG. 14C, an insulating film 724 is formed so as to cover the gate insulating film 721, and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is low, parasitic capacitance generated between wirings or electrodes can be reduced, which results in higher speed operation. Note that although the insulating film 724 has a single-layer structure in this embodiment, an embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

The wiring 726 is formed in such a manner that a conductive film is formed by a PVD method or a CVD method and then the conductive film is processed by etching. As the material of the conductive film, an element selected from aluminum, chromium, copper, tantalum, titanium, molybdenum, and tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film (with a thickness of about 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of an aluminum film can be prevented. A copper film may be formed by a plating method after the formation of the barrier film of titanium, titanium nitride, or the like.

The opening 725 formed in the insulating film 724 is preferably formed in a region overlapping with the conductive film 708. With provision of the opening 725 in such a region, the increase in element area due to a contact region can be prevented.

Here, the case where a connection position of the impurity region 704 and the conductive film 720 and a connection position of the conductive film 720 and the wiring 726 overlap with each other without the use of the conductive film 708 is described. In that case, an opening (also referred to as an opening in a lower portion) is formed in the insulating films 712 and 713 which are formed over the impurity region 704, and the conductive film 720 is formed so as to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected by etching. In order to avoid the disconnection, the openings in the lower portion and in the upper portion are formed so as not to overlap with each other, so that a problem of the increase in element area occurs.

As described in this embodiment, with the use of the conductive film 708, the opening in the upper portion can be formed without disconnection of the conductive film 720. Thus, the openings in the lower portion and in the upper portion can be formed so as to overlap with each other, so that the increase in element area due to the openings can be suppressed. In other words, the degree of integration of the semiconductor device can be increased.

Next, an insulating film 727 is formed so as to cover the wiring 726. Through the series of steps, the FF circuit can be manufactured.

Note that in the manufacturing method, the conductive films 719 and 720 functioning as source and drain electrodes are formed after the formation of the oxide semiconductor layer 716. Thus, as illustrated in FIG. 14B, in the transistor 731 obtained by the manufacturing method, the conductive films 719 and 720 are formed over the oxide semiconductor layer 716. However, in the transistor 731, the conductive films functioning as source and drain electrodes may be formed below the oxide semiconductor layer 716, that is, between the oxide semiconductor layer 716 and the insulating films 712 and 713.

Figure 15:
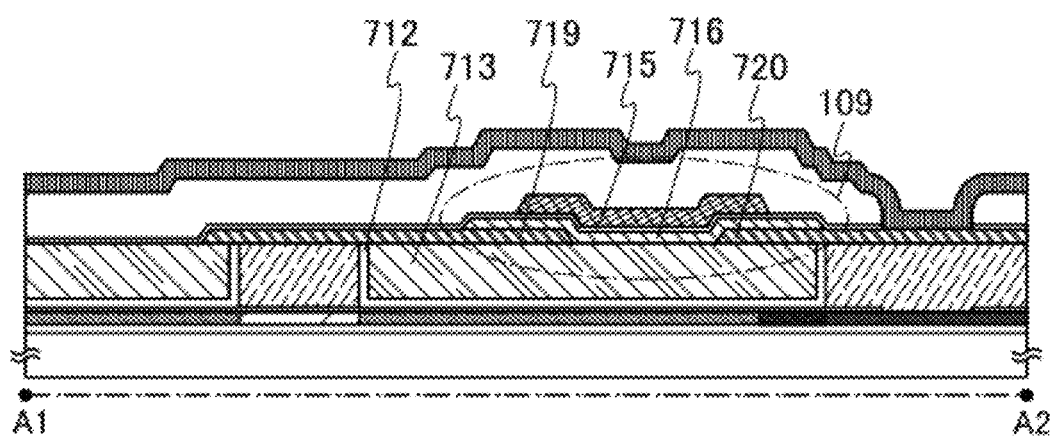
FIG. 15 is a cross-sectional view illustrating a structure example of a transistor.

FIG. 15 illustrates a cross-sectional view of the transistor 731 at the time when the conductive films 719 and 720 functioning as source and drain electrodes are provided between the oxide semiconductor layer 716 and the insulating films 712 and 713. The transistor 731 illustrated in FIG. 15 can be obtained in such a manner that the conductive films 719 and 720 are formed after the formation of the insulating film 713, and then the oxide semiconductor layer 716 is formed.

This embodiment can be implemented by being combined as appropriate with any of the above-described embodiments.

Embodiment 6

Figure 16A:
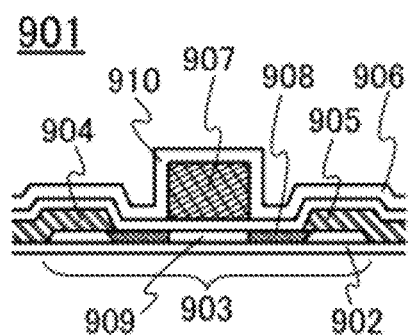
FIGS. 16A to 16E are cross-sectional views each illustrating a structure example of a transistor.

In this embodiment, a transistor including an oxide semiconductor layer with a structure different from the structures in Embodiment 4 will be described with reference to cross-sectional views in FIGS. 16A to 16E. FIGS. 16A to 16E each show an example of a structure of a top gate transistor. FIGS. 16A, 16C, and 16E each illustrate an example of structure of a planar (coplanar) transistor, and FIGS. 16B and 16D each illustrate an example of a structure of a staggered transistor.

A transistor 901 illustrated in FIG. 16A includes an oxide semiconductor layer 903 that serves as an active layer and is formed over a base film 902; a source electrode 904 and a drain electrode 905 formed over the oxide semiconductor layer 903; a gate insulating film 906 over the oxide semiconductor layer 903, the source electrode 904, and the drain electrode 905; a gate electrode 907 that is over the gate insulating film 906 and overlaps with the oxide semiconductor layer 903; and a protective insulating film 910 that is over the gate electrode 907 and covers the oxide semiconductor layer 903.

The transistor 901 illustrated in FIG. 16A has a top-gate structure where the gate electrode 907 is formed over the oxide semiconductor layer 903 and has a top-contact structure where the source electrode 904 and the drain electrode 905 are formed over the oxide semiconductor layer 903. The source electrode 904 and the drain electrode 905 do not overlap with the gate electrode 907 in the transistor 901. That is, a distance between the source electrode 904 and the gate electrode 907 and a distance between the drain electrode 905 and the gate electrode 907 are each larger than the thickness of the gate insulating film 906. Accordingly, parasitic capacitance between the source electrode 904 and the gate electrode 907 and between the drain electrode 905 and the gate electrode 907 can be reduced, and thus high speed operation can be achieved in the transistor 901.

The oxide semiconductor layer 903 includes a pair of high-concentration regions 908 which are obtained by addition of dopant imparting n-type conductivity to the oxide semiconductor layer 903 after formation of the gate electrode 907. Further, the oxide semiconductor layer 903 includes a channel formation region 909 which overlaps with the gate electrode 907 with the gate insulating film 906 interposed therebetween. In the oxide semiconductor layer 903, the channel formation region 909 is provided between the pair of high-concentration regions 908. The dopant for forming the high-concentration regions 908 can be added by an ion implantation method. A rare gas such as helium, argon, or xenon, nitrogen, phosphorus, arsenic, antimony, boron, or the like can be used as the dopant.

For example, when nitrogen is used as the dopant, it is preferable that the high-concentration regions 908 have a nitrogen atom concentration of higher than or equal to $5 \times 10^{19}/cm^3$ and lower than or equal to $1 \times 10^{22}/cm^3$.

The high-concentration regions 908 to which the dopant imparting n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be decreased.

In the case where an In—Ga—Zn-based oxide is used for the oxide semiconductor layer 903, heat treatment is performed at a temperature of higher than or equal to 300° C. and lower than or equal to 600° C. for about one hour after nitrogen is added. Consequently, the oxide semiconductor in the high-concentration regions 908 has a wurtzite crystal structure. When the oxide semiconductor in the high-concentration regions 908 has a wurtzite crystal structure, the conductivity of the high-concentration regions 908 can be further increased and the resistance between the source electrode 904 and the drain electrode 905 can be further reduced. Note that in order to effectively reduce the resistance between the source electrode 904 and the drain electrode 905 by forming the oxide semiconductor having a wurtzite crystal structure, when nitrogen is used as the dopant, the nitrogen atom concentration in the high-concentration regions 908 is preferably higher than or equal to $1 \times 10^{20}/cm^3$ and lower than or equal to 7 at. %. However, even when the nitrogen atom concentration is lower than the above range, the oxide semiconductor having a wurtzite crystal structure can be obtained in some cases.

The oxide semiconductor layer 903 may be composed of a CAAC-OS. The oxide semiconductor layer 903 composed of a CAAC-OS has a higher conductivity than that of an amorphous oxide semiconductor layer; thus, the resistance between the source electrode 904 and the drain electrode 905 can be decreased.

The reduction in the resistance between the source electrode 904 and the drain electrode 905 ensures a high on-state current and high speed operation even when the transistor 901 is miniaturized. In addition, by miniaturization of the transistor 901, the area of a semiconductor device including the transistor can be reduced, so that the number of transistors per unit area can be increased.

Figure 16B:
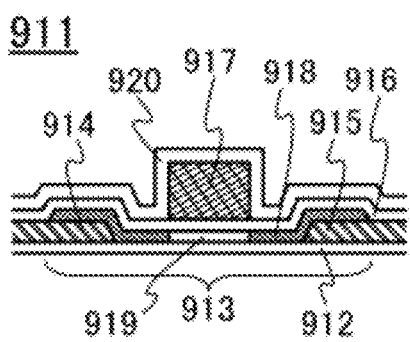
Figure 16C:
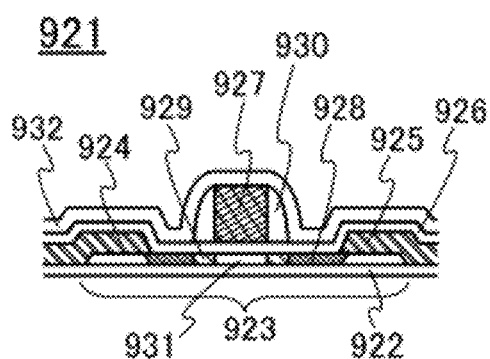

A transistor 911 illustrated in FIG. 16B includes a source electrode 914 and a drain electrode 915 formed over a base film 912; an oxide semiconductor layer 913 which is formed over the source electrode 914 and the drain electrode 915 and functions as an active layer; a gate insulating film 916 over the oxide semiconductor layer 913, and the source electrode 914 and the drain electrode 915; a gate electrode 917 which is provided over the gate insulating film 916 so as to overlap with the oxide semiconductor layer 913; and a protective insulating film 920 that is over the gate electrode 917 and covers the oxide semiconductor layer 913.

The transistor 911 illustrated in FIG. 16B has a top-gate structure in which the gate electrode 917 is formed over the oxide semiconductor layer 913, and has also a bottom-contact structure in which the source electrode 914 and the drain electrode 915 are formed below the oxide semiconductor layer 913. Like the transistor 901, the source electrode 914 and the drain electrode 915 do not overlap with the gate electrode 917 in the transistor 911. Thus, parasitic capacitance formed between the source electrode 914 and the gate electrode 917 and between the drain electrode 915 and the gate electrode 917 can be reduced and high speed operation can be achieved.

The oxide semiconductor layer 913 includes a pair of high-concentration regions 918 which are obtained by addition of dopant imparting n-type conductivity to the oxide semiconductor layer 913 after formation of the gate electrode 917. Further, the oxide semiconductor layer 913 includes a channel formation region 919 which overlaps with the gate electrode 917 with the gate insulating film 916 interposed therebetween. In the oxide semiconductor layer 913, the channel formation region 919 is provided between the pair of high-concentration regions 918.

The high-concentration regions 918 can be formed by an ion implantation method as in the case of the high-concentration regions 908 included in the transistor 901. The case of the high-concentration regions 908 can be referred to for a kind of the dopant for forming the high-concentration regions 918.

For example, when nitrogen is used as the dopant, it is preferable that the high-concentration regions 918 have a nitrogen atom concentration of higher than or equal to $5 \times 10^{19}/cm^3$ and lower than or equal to $1 \times 10^{22}/cm^3$.

The high-concentration regions 918 to which the dopant imparting n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

In the case where an In—Ga—Zn-based oxide is used for the oxide semiconductor layer 913, heat treatment is performed at a temperature of higher than or equal to 300° C. and lower than or equal to 600° C. after nitrogen is added. Consequently, the oxide semiconductor in the high-concentration regions 918 has a wurtzite crystal structure. When the oxide semiconductor in the high-concentration regions 918 has a wurtzite crystal structure, the conductivity of the high-concentration regions 918 can be further increased and the resistance between the source electrode 914 and the drain electrode 915 can be further reduced. Note that in order to effectively reduce the resistance between the source electrode 914 and the drain electrode 915 by forming the oxide semiconductor having a wurtzite crystal structure, when nitrogen is used as a dopant, the nitrogen atom concentration in the high-concentration regions 918 is preferably higher than or equal to $1\times10^{20}/cm^3$ and lower than or equal to 7 at. %. However, even when the nitrogen atom concentration is lower than the above range, the oxide semiconductor having a wurtzite crystal structure can be obtained in some cases.

The oxide semiconductor layer 913 may be composed of a CAAC-OS. The oxide semiconductor layer 913 composed of a CAAC-OS has a higher conductivity than that of an amorphous oxide semiconductor layer; thus, the resistance between the source electrode 914 and the drain electrode 915 can be decreased.

The reduction in the resistance between the source electrode 914 and the drain electrode 915 ensures a high on-state current and high speed operation even when the transistor 911 is miniaturized. With the miniaturization of the transistor 911, the area occupied by the semiconductor device including the transistor can be reduced and the number of transistors per unit area can be increased.

A transistor 921 illustrated in FIG. 16C includes an oxide semiconductor layer 923 which is formed over a base film 922 and functions as an active layer; a source electrode 924 and a drain electrode 925 formed over the oxide semiconductor layer 923; a gate insulating film 926 over the oxide semiconductor layer 923, and the source electrode 924 and the drain electrode 925; a gate electrode 927 which is provided over the gate insulating film 926 so as to overlap with the oxide semiconductor layer 923; and a protective insulating film 932 that is over the gate electrode 927 and covers the oxide semiconductor layer 923. In addition, the transistor 921 includes sidewalls 930 which are formed using an insulator and are provided on side surfaces of the gate electrode 927.

The transistor 921 illustrated in FIG. 16C has a top-gate structure in which where the gate electrode 927 is formed over the oxide semiconductor layer 923, and also has a top-contact structure in which the source electrode 924 and the drain electrode 925 are formed over the oxide semiconductor layer 923. Since the source electrode 924 and the drain electrode 925 do not overlap with the gate electrode 927 in the transistor 921 like the transistor 901, parasitic capacitances between the source electrode 924 and the gate electrode 927 and between the drain electrode 925 and the gate electrode 927 can be reduced and high speed operation can be achieved.

The oxide semiconductor layer 923 includes a pair of high-concentration regions 928 and a pair of low-concentration regions 929 which are obtained by addition of dopant imparting n-type conductivity to the oxide semiconductor layer 923 after formation of the gate electrode 927. Further, the oxide semiconductor layer 923 includes a channel formation region 931 which overlaps with the gate electrode 927 with the gate insulating film 926 interposed therebetween. In the oxide semiconductor layer 923, the channel formation region 931 is provided between the pair of low-concentration regions 929 which are provided between the pair of high-concentration regions 928. Further, the pair of low-concentration regions 929 are provided in regions of the oxide semiconductor layer 923 that overlap with the sidewalls 930 with the gate insulating film 926 provided therebetween.

The high-concentration regions 928 and the low-concentration regions 929 can be formed by an ion implantation method as in the case of the high-concentration regions 908 included in the transistor 901. The case of the high-concentration regions 908 can be referred to for a kind of the dopant for forming the high-concentration regions 928.

For example, when nitrogen is used as the dopant, it is preferable that the high-concentration regions 928 have a nitrogen atom concentration of higher than or equal to $5\times10^{19}/cm^3$ and lower than or equal to $1\times10^{22}/cm^3$. Further, when nitrogen is used as the dopant, for example, it is preferable that the low-concentration regions 929 have a nitrogen atom concentration of higher than or equal to $5\times10^{18}/cm^3$ and lower than $5\times10^{19}$ cm$^3$.

The high-concentration regions 928 to which the dopant imparting n-type conductivity is added have higher conductivity than the other regions in the oxide semiconductor layer 923. Therefore, by providing the high-concentration regions 928 in the oxide semiconductor layer 923, the resistance between the source electrode 924 and the drain electrode 925 can be decreased. The low-concentration regions 929 are provided between the channel formation region 931 and the high-concentration regions 928, so that a negative shift of the threshold voltage due to a short-channel effect can be reduced.

In the case where an In—Ga—Zn-based oxide semiconductor is used for the oxide semiconductor layer 923, heat treatment is performed at a temperature of higher than or equal to 300° C. and lower than or equal to 600° C. after nitrogen is added. Consequently, the oxide semiconductor in the high-concentration regions 928 has a wurtzite crystal structure. Further, depending on the nitrogen concentration, the low-concentration regions 929 also have a wurtzite crystal structure due to the heat treatment. When the oxide semiconductor in the high-concentration regions 928 has a wurtzite crystal structure, the conductivity of the high-concentration regions 928 can be further increased and the resistance between the source electrode 924 and the drain electrode 925 can be further reduced. Note that in order to effectively reduce the resistance between the source electrode 924 and the drain electrode 925 by forming the oxide semiconductor having a wurtzite crystal structure, when nitrogen is used as a dopant, the nitrogen atom concentration in the high-concentration regions 928 is preferably higher than or equal to $1\times10^{20}/cm^3$ and lower than or equal to 7 at. %. However, even when the nitrogen atom concentration is lower than the above range, the oxide semiconductor having a wurtzite crystal structure can be obtained in some cases.

The oxide semiconductor layer 923 may be composed of a CAAC-OS. The oxide semiconductor layer 923 composed of a CAAC-OS has a higher conductivity than that of an amorphous oxide semiconductor layer; thus, the resistance between the source electrode 924 and the drain electrode 925 can be decreased.

The reduction in the resistance between the source electrode 924 and the drain electrode 925 ensures a high on-state current and high speed operation even when the transistor 921 is miniaturized. With the miniaturization of the transistor 921, the area occupied by a semiconductor device including the transistor can be reduced and the number of transistors per unit area can be increased.

Figure 16D:
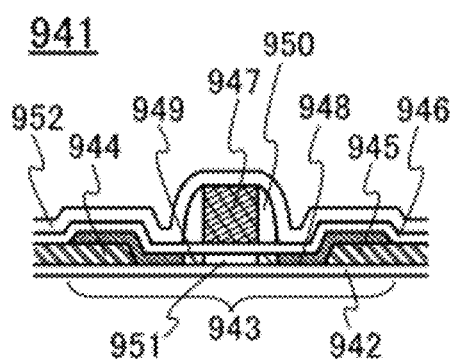
Figure 16E:
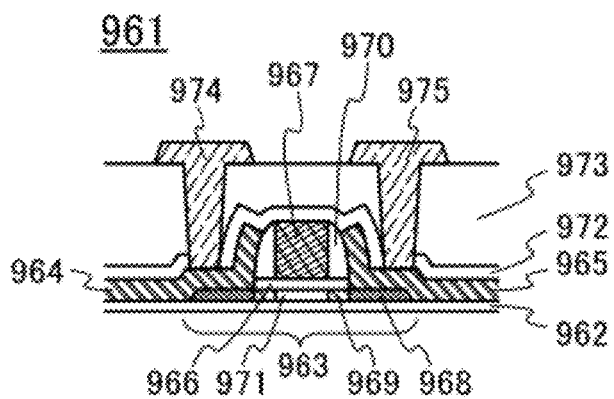

A transistor 941 illustrated in FIG. 16D includes a source electrode 944 and a drain electrode 945 formed over a base film 942; an oxide semiconductor layer 943 which is formed over the source electrode 944 and the drain electrode 945 and functions as an active layer; a gate insulating film 946 over the oxide semiconductor layer 943, and the source electrode 944 and the drain electrode 945; a gate electrode 947 which is provided over the gate insulating film 946 so as to overlap with the oxide semiconductor layer 943; and a protective insulating film 952 that is over the gate electrode 947 and covers the oxide semiconductor layer 943. In addition, the transistor 941 includes sidewalls 950 which are formed using an insulator and are provided on side surfaces of the gate electrode 947.

The transistor 941 illustrated in FIG. 16D has a top-gate structure in which the gate electrode 947 is formed over the oxide semiconductor layer 943, and also has a bottom-contact structure in which the source electrode 944 and the drain electrode 945 are formed below the oxide semiconductor layer 943. Since the source electrode 944 and the drain electrode 945 do not overlap with the gate electrode 947 in the transistor 941 like the transistor 901, parasitic capacitance between the source electrode 944 and the gate electrode 947 and between the drain electrode 945 and the gate electrode 947 can be reduced and high speed operation can be achieved.

The oxide semiconductor layer 943 includes a pair of high-concentration regions 948 and a pair of low-concentration regions 949 which are obtained by addition of dopant imparting n-type conductivity to the oxide semiconductor layer 943 after formation of the gate electrode 947. Further, the oxide semiconductor layer 943 includes a channel formation region 951 which overlaps with the gate electrode 947 with the gate insulating film 946 interposed therebetween. In the oxide semiconductor layer 943, the channel formation region 951 is provided between the pair of low-concentration regions 949 which are provided between the pair of high-concentration regions 948. Further, the pair of low-concentration regions 949 are provided in regions of the oxide semiconductor layer 943 that overlap with the sidewalls 950 with the gate insulating film 946 provided therebetween.

The high-concentration regions 948 and the low-concentration regions 949 can be formed by an ion implantation method as in the case of the high-concentration regions 908 included in the transistor 901. The case of the high-concentration regions 908 can be referred to for a kind of the dopant for forming the high-concentration regions 948.

For example, when nitrogen is used as the dopant, it is preferable that the high-concentration regions 948 have a nitrogen atom concentration of higher than or equal to $5\times10^{19}/cm^3$ and lower than or equal to $1\times10^{22}/cm^3$. Further, when nitrogen is used as the dopant, for example, it is preferable that the low-concentration regions 949 have a nitrogen atom concentration of higher than or equal to $5\times10^{18}/cm^3$ and lower than $5\times10^{19}\ cm^3$.

The high-concentration regions 948 to which the dopant imparting n-type conductivity is added have higher conductivity than the other regions in the oxide semiconductor layer 943. Therefore, by providing the high-concentration regions 948 in the oxide semiconductor layer 943, the resistance between the source electrode 944 and the drain electrode 945 can be decreased. The low-concentration regions 949 are provided between the channel formation region 951 and the high-concentration regions 948, so that a negative shift of the threshold voltage due to a short-channel effect can be reduced.

In the case where an In—Ga—Zn-based oxide is used for the oxide semiconductor layer 943, heat treatment is performed at a temperature of higher than or equal to 300° C. and lower than or equal to 600° C. after nitrogen is added. Consequently, the oxide semiconductor in the high-concentration regions 948 has a wurtzite crystal structure. Further, depending on the nitrogen concentration, the low-concentration regions 949 also have a wurtzite crystal structure due to the heat treatment. When the oxide semiconductor in the high-concentration regions 948 includes a wurtzite crystal structure, the conductivity of the high-concentration regions 948 can be further increased and the resistance between the source electrode 944 and the drain electrode 945 can be further reduced. Note that in order to effectively reduce the resistance between the source electrode 944 and the drain electrode 945 by forming the oxide semiconductor having a wurtzite crystal structure, when nitrogen is used as a dopant, the nitrogen atom concentration in the high-concentration regions 948 is preferably higher than or equal to $1\times10^{20}/cm^3$ and lower than or equal to 7 at. %. However, even when the nitrogen atom concentration is lower than the above range, the oxide semiconductor having a wurtzite crystal structure can be obtained in some cases.

The oxide semiconductor layer 943 may be composed of a CAAC-OS. The oxide semiconductor layer 943 composed of a CAAC-OS has a higher conductivity than that of an amorphous oxide semiconductor layer; thus, the resistance between the source electrode 944 and the drain electrode 945 can be decreased.

The reduction in the resistance between the source electrode 944 and the drain electrode 945 ensures a high on-state current and high speed operation even when the transistor 941 is miniaturized. With the miniaturization of the transistor 941, the area occupied by the semiconductor device including the transistor can be reduced and the number of transistors per unit area can be increased.

A transistor 961 illustrated in FIG. 16E includes an oxide semiconductor layer 963 which is formed over a base film 962 and functions as an active layer; a source electrode 964 and a drain electrode 965 which are formed over the oxide semiconductor layer 963; a gate electrode 967 which overlaps with the oxide semiconductor layer 963 with a gate insulating film 966 interposed therebetween; sidewalls 970 formed of an insulator and provided on side surfaces of the gate electrode 967; a protective insulating film 972 which is formed over the gate electrode 967 and covers the oxide semiconductor layer 963; and an insulating film 973 over the protective insulating film 972. Further, the transistor 961 includes an electrode 974 electrically connected to the source electrode 964 through a contact hole provided in the protective insulating film 972 and the insulating film 973, and an electrode 975 electrically connected to the drain electrode 965 through a contact hole provided in the protective insulating film 972 and the insulating film 973.

The insulating film 973 can be formed using a material containing an inorganic insulating material such as silicon oxide, silicon nitride oxide, silicon nitride, hafnium oxide, aluminum oxide, or tantalum oxide. Moreover, the insulating film 973 can be formed using an organic insulating material such as polyimide or acrylic.

After the insulating film 973 is formed, planarization treatment is preferably performed to reduce the unevenness of the surface of the insulating film 973 by CMP treatment, etching treatment, or the like. By reducing the unevenness of the surface of the insulating film 973, coverage with an electrode, a wiring, or the like formed in a later step can be improved, and the degree of integration of the semiconductor device can be easily increased. Moreover, an increase in wiring resistance in the step portion or disconnection of a wiring due to poor coverage can be suppressed, so that the reliability of the semiconductor device can be improved.

The transistor 961 has a top-gate structure in which the gate electrode 967 is formed over the oxide semiconductor layer 963, and also has a top-contact structure in which the source electrode 964 and the drain electrode 965 are formed over the oxide semiconductor layer 963. As in the transistor 901, in the transistor 961, the source electrode 964 and the drain electrode 965 do not overlap with the gate electrode 967. Thus, parasitic capacitance formed between the source electrode 964 and the gate electrode 967 and between the drain electrode 965 and the gate electrode 967 can be reduced. Consequently, high-speed operation can be performed.

The oxide semiconductor layer 963 includes a pair of high-concentration regions 948 and a pair of low-concentration regions 949 which are obtained by addition of dopant imparting n-type conductivity to the oxide semiconductor layer 963 after formation of the gate electrode 967. Further, the oxide semiconductor layer 963 includes a channel formation region 971 which overlaps with the gate electrode 967 with the gate insulating film 966 interposed therebetween. In the oxide semiconductor layer 963, the channel formation region 971 is provided between the pair of low-concentration regions 969 which are provided between the pair of high-concentration regions 968. Further, the pair of low-concentration regions 969 are provided in regions of the oxide semiconductor layer 963 that overlap with the sidewalls 970 with the gate insulating film 966 provided therebetween.

The high-concentration regions 968 and the low-concentration regions 969 can be formed by an ion implantation method in a similar manner to the case of the high-concentration regions 908 included in the transistor 901. The high-concentration regions 908 can be referred to for the kind of a dopant used for the formation of the high-concentration regions 968.

For example, in the case where nitrogen is used as the dopant, the nitrogen atom concentration in the high-concentration regions 968 is preferably higher than or equal to $5 \times 10^{19}/cm^3$ and lower than or equal to $1 \times 10^{22}/cm^3$. Further, for example, in the case where nitrogen is used as the dopant, the nitrogen atom concentration in the low-concentration regions 969 is preferably higher than or equal to $5 \times 10^{18}/cm^3$ and lower than $5 \times 10^{19}/cm^3$.

The high-concentration regions 968 to which the dopant imparting n-type conductivity is added have higher conductivity than the other regions in the oxide semiconductor layer 963. Therefore, by providing the high-concentration regions 968 in the oxide semiconductor layer 963, the resistance between the source electrode 964 and the drain electrode 965 can be decreased. Further, the low-concentration regions 969 are provided between the channel formation region 971 and the high-concentration regions 968, which result in a reduction in negative shift of a threshold voltage due to a short-channel effect.

When an In—Ga—Zn-based oxide is used for the oxide semiconductor layer 963, heat treatment is performed at a temperature of higher than or equal to 300° C. and lower than or equal to 600° C. after addition of nitrogen, so that an oxide semiconductor in the high-concentration regions 968 has a wurtzite crystal structure. Further, depending on the concentration of nitrogen, the low-concentration region 969 has a wurtzite crystal structure by the heat treatment in some cases. When the oxide semiconductor in the high-concentration region 968 has a wurtzite crystal structure, the conductivity of the high-concentration region 968 can be further increased and the resistance between the source electrode 964 and the drain electrode 965 can be lowered. Note that in order to effectively decrease the resistance between the source electrode 964 and the drain electrode 965 by forming an oxide semiconductor having a wurtzite crystal structure, in the case of using nitrogen as the dopant, the nitrogen atom concentration in the high-concentration regions 968 is preferably higher than or equal to $1 \times 10^{20}/cm^3$ and lower than or equal to 7 at. %. However, even when the nitrogen atom concentration is lower than the above range, the oxide semiconductor having a wurtzite crystal structure can be obtained in some cases.

The oxide semiconductor layer 963 may be composed of a CAAC-OS. The oxide semiconductor layer 963 composed of a CAAC-OS has a higher conductivity than that of an amorphous oxide semiconductor layer; thus, the resistance between the source electrode 964 and the drain electrode 965 can be decreased.

The reduction in the resistance between the source electrode 964 and the drain electrode 965 ensures a high on-state current and high-speed operation even when the transistor 961 is miniaturized. With the miniaturization of the transistor 961, the area occupied by the semiconductor device including the transistor can be reduced and the number of transistors per unit area can be increased.

Note that as one of methods for forming a high-concentration region functioning as a source region or a drain region in a transistor including an oxide semiconductor through a self-aligning process, a method has been disclosed by which a surface of an oxide semiconductor layer is exposed, argon plasma treatment is performed, and the resistivity of a region in the oxide semiconductor layer that is exposed to plasma is lowered (S. Jeon et al., "180 nm Gate Length Amorphous InGaZnO Thin Film Transistor for High Density Image Sensor Applications", IEDM Tech. Dig., pp. 504-507, 2010).

However, in the manufacturing method, a gate insulating film needs to be partly removed after formation of the gate insulating film so that portions which are to serve as the source region and the drain region are exposed. Therefore, at the time of removing the gate insulating film, the oxide semiconductor layer which is below the gate insulating film is partially over-etched; thus, the thickness of the portions which are to be the source region and the drain region becomes small. Consequently, the resistance of the source or drain region is increased, and defects in characteristics of the transistor due to over-etching tends to be triggered.

For further miniaturization of a transistor, it is necessary to adopt a dry-etching method with high process accuracy. However, the over-etching easily occurs remarkably in the case where a dry etching method with which the selectivity of a gate insulating film to an oxide semiconductor layer is not sufficiently obtained is employed.

For example, the problem of over-etching does not arise when the oxide semiconductor layer has a sufficient thickness. However, when the channel length is to be shorter than or equal to 200 nm, the thickness of the portion of the oxide semiconductor layer to be a channel formation region needs to be less than or equal to 20 nm, preferably less than or equal to 10 nm so as to prevent short-channel effect. When the thickness of the oxide semiconductor layer is small as in the above case, the resistance of the source region or the drain region is increased and defective characteristics of the transistor occur due to over-etching of the oxide semiconductor layer as described above, which is not preferable.

However, as in an embodiment of the present invention, when addition of dopant to an oxide semiconductor layer is performed in the state where a gate insulating film is left so as not to expose the oxide semiconductor, the over-etching of the oxide semiconductor layer can be prevented and excessive damage to the oxide semiconductor layer can be reduced. In addition, the interface between the oxide semiconductor layer and the gate insulating film is kept clean. Accordingly, the characteristics and reliability of the transistor can be improved.

A base film positioned below the oxide semiconductor layer or a protective insulating film is preferably formed using a material that has a high barrier property against an alkali metal, hydrogen, and oxygen. For example, as the insulating film having a high barrier property, a silicon nitride film, a silicon nitride oxide film, an aluminum nitride film, an aluminum oxide film, an aluminum oxynitride film, an aluminum nitride oxide film, or the like can be used. As the base film and the protective insulating film, a single layer or a stack of layers of the insulating film having a high barrier property, or a stack of layers of the insulating film having a high barrier property and the insulating film having a low barrier property may be used.

Covering the oxide semiconductor layer with an insulating film having a high barrier property can prevent entry of impurities from the outside and oxygen from releasing from the oxide semiconductor layer. Therefore, reliability of the transistor can be improved.

This embodiment can be implemented by being combined as appropriate with any of the above-described embodiments.

Embodiment 7

By using a divider circuit according to an embodiment of the present invention, a highly reliable electronic device and an electronic device with low power consumption can be provided. In particular, in the case of a portable electronic device which has difficulty in continuously receiving power, when a divider circuit with low power consumption according to an embodiment of the present invention is added as a component of the device, an advantage in increasing the continuous operation time can be obtained.

The divider circuit according to an embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can be provided with the divider circuit according to an embodiment of the present invention, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 17A and 17B.

Figure 17A:
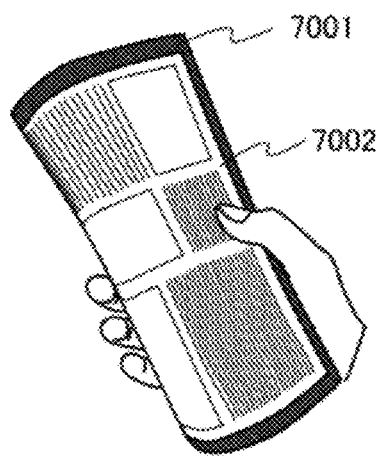
FIGS. 17A to 17F each illustrate an electronic device.

FIG. 17A illustrates an e-book reader including a housing 7001, a display portion 7002, and the like. The divider circuit according to an embodiment of the present invention can be used for an integrated circuit used for controlling driving of the e-book reader. With the use of the divider circuit according to an embodiment of the present invention for the integrated circuit for controlling driving of the e-book reader, the e-book reader can reduce power consumption. When a flexible substrate is used, the integrated circuit can have flexibility, whereby a user-friendly e-book reader which is flexible and lightweight can be provided.

Figure 17B:
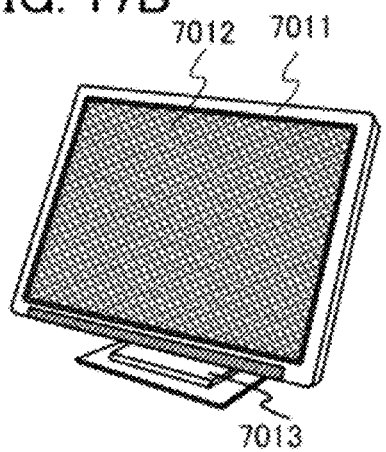

FIG. 17B illustrates a display device including a housing 7011, a display portion 7012, a supporting base 7013, and the like. The divider circuit according to an embodiment of the present invention can be used for an integrated circuit used for controlling driving of the display device. With the use of the divider circuit according to an embodiment of the present invention for the integrated circuit for controlling driving of the display device, the display device can reduce power consumption. Note that a display device includes all display devices for displaying information, such as display devices for personal computers, for receiving television broadcast, and for displaying advertisement, in its category.

Figure 17C:
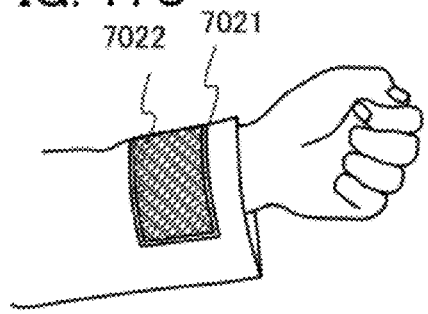

FIG. 17C illustrates a display device including a housing 7021, a display portion 7022, and the like. The divider circuit according to an embodiment of the present invention can be used for an integrated circuit used for controlling driving of the display device. With the use of the divider circuit according to an embodiment of the present invention for the integrated circuit for controlling driving of the display device, the display device can reduce power consumption. Moreover, with the use of a flexible substrate, the integrated circuit can have flexibility. Thus, a user-friendly display device which is flexible and lightweight can be provided. Accordingly, as illustrated in FIG. 17C, the display device can be used while being fixed to fabric or the like, and the application range of the display device is dramatically widened.

Figure 17D:
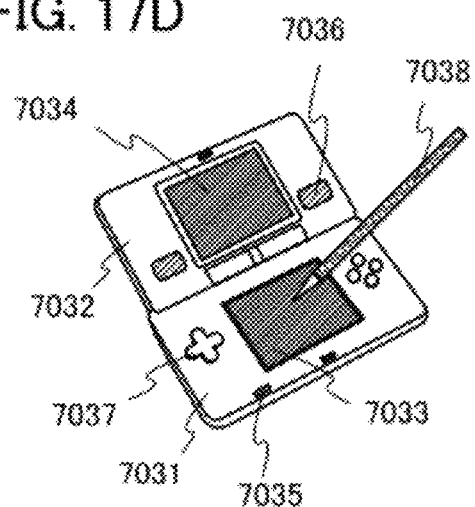

FIG. 17D illustrates a portable game machine including a housing 7031, a housing 7032, a display portion 7033, a display portion 7034, a microphone 7035, speakers 7036, an operation key 7037, a stylus 7038, and the like. The divider circuit according to an embodiment of the present invention can be used for an integrated circuit used for controlling driving of the portable game machine. With the use of the divider circuit which is an embodiment of the present invention for the integrated circuit for controlling driving of the portable game machine, a portable game machine with low power consumption can be provided. Note that although the portable game machine illustrated in FIG. 17D includes two display portions 7033 and 7034, the number of display portions included in the portable game machine is not limited to two.

Figure 17E:
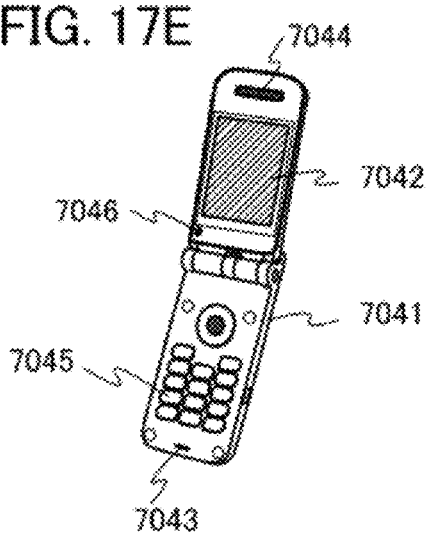

FIG. 17E illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electric signals, whereby external images can be loaded. The divider circuit according to an embodiment of the present invention can be used for an integrated circuit used for controlling driving of the mobile phone. With the use of the divider circuit according to an embodiment of the present invention for the integrated circuit for controlling driving of the mobile phone, the mobile phone can reduce power consumption.

Figure 17F:
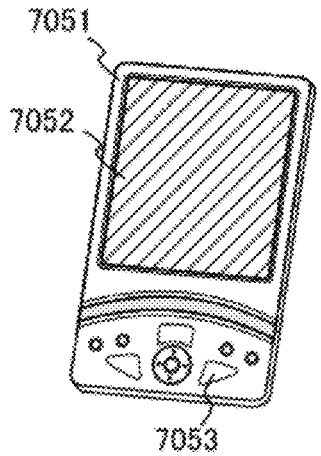

FIG. 17F illustrates a portable information terminal including a housing 7051, a display portion 7052, operation keys 7053, and the like. A modem may be incorporated in the housing 7051 of the portable information terminal illustrated in FIG. 17F. The divider circuit according to an embodiment of the present invention can be used for an integrated circuit used for controlling driving of the portable information terminal. With the use of the divider circuit which is an embodiment of the present invention for the integrated circuit for controlling driving of the portable information terminal, a portable information terminal with low power consumption can be provided.

This embodiment can be implemented by being combined as appropriate with any of the above-described embodiments.

Example 1

The field-effect mobility of a transistor which includes an ideal oxide semiconductor without a defect for a semiconductor layer where a channel is formed will be described in this example.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility (Hall mobility) and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[Formula 1]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 2]}$$

Here, e represents the elementary electric charge, N represents the average defect density per unit area in a channel, $\in$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[Formula 3]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad \text{[Formula 4]}$$

The right side of Formula 4 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ results in 120 cm$^2$/Vs from Formula 1 and Formula 2. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the field-effect mobility $\mu_1$ at a position that is distance x away from the interface between the semiconductor and the gate insulating film can be expressed as the following formula.

$$\frac{1}{\mu_1} = \frac{1}{\mu_0} + \frac{D}{B}\exp\left(-\frac{x}{G}\right) \quad \text{[Formula 5]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 5 is increased and accordingly the field-effect mobility $\mu_1$ is decreased.

Figure 22:
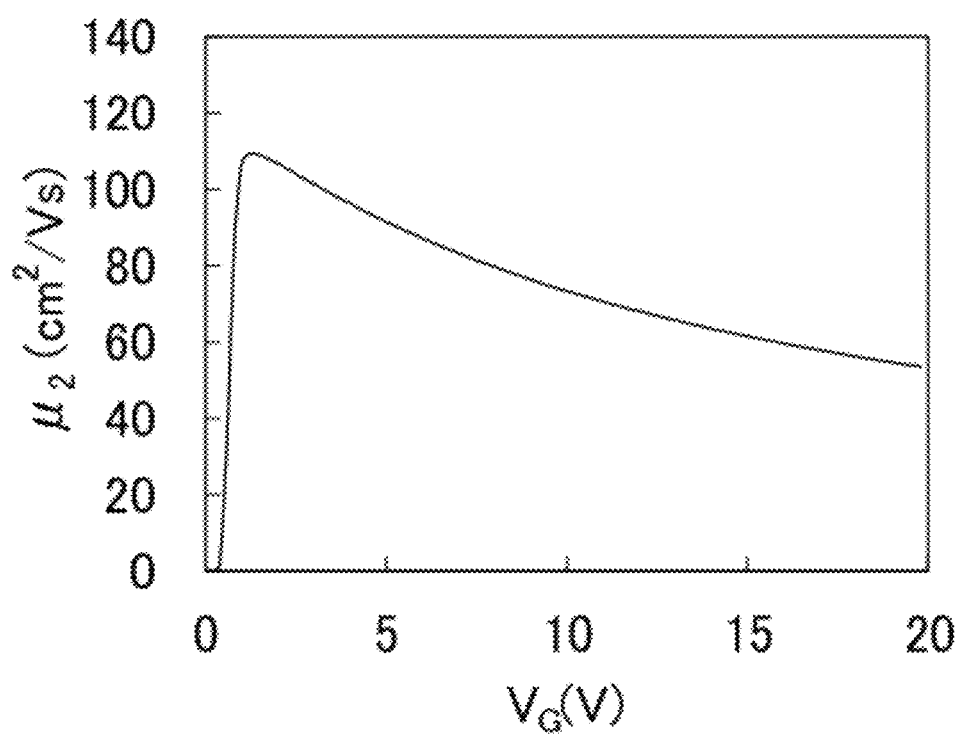
FIG. 22 shows the gate voltage dependence of field-effect mobility obtained by calculation.

Calculation results of the field-effect mobility $\mu_2$ of a transistor whose channel includes an ideal oxide semiconductor without a defect inside the semiconductor are shown in FIG. 22. For the calculation, device simulation software Sentaurus Device manufactured by Synopsys, Inc. was used, and the band gap, the electron affinity, the relative dielectric constant, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative dielectric constant thereof was assumed to be 4.1. The channel length and the channel width were each assumed to be 10 μm, and the drain voltage $V_d$ was assumed to be 0.1 V.

As shown in FIG. 22, the mobility has a peak of greater than or equal to 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 23A to 23C, FIGS. 24A to 24C, and FIGS. 25A to 25C. FIGS. 26A and 26B illustrate cross-sectional structure of transistors used for the calculation. The transistors illustrated in FIGS. 26A and 26B each include a semiconductor region 1103a and a semiconductor region 1103c that have n$^+$-type conductivity in an oxide semiconductor layer. The resistivities of the semiconductor region 1103a and the semiconductor region 1103c are $2 \times 10^{-3}$ Ωcm.

The transistor in FIG. 26A is formed over a base insulating layer 1101 and an embedded insulator 1102 that is embedded in the base insulating layer 1101 and formed of aluminum oxide. The transistor includes the semiconductor region 1103a, the semiconductor region 1103c, an intrinsic semiconductor region 1103b serving as a channel formation region therebetween, and a gate 1105. The width of the gate 1105 is 33 nm.

A gate insulating film 1104 is formed between the gate 1105 and the semiconductor region 1103b. In addition, a sidewall insulator 1106a and a sidewall insulator 1106b are formed on both side surfaces of the gate 1105, and an insulator 1107 is formed over the gate 1105 so as to prevent a short circuit between the gate 1105 and another wiring. The sidewall insulator has a width of 5 nm. A source 1108a and a drain 1108b are provided in contact with the semiconductor region 1103a and the semiconductor region 1103c, respectively. Note that the channel width of this transistor is 40 nm.

The transistor in FIG. 26B is the same as the transistor in FIG. 26A in that it is formed over the base insulating layer 1101 and the embedded insulator 1102 formed of aluminum oxide and that it includes the semiconductor region 1103a, the semiconductor region 1103c, the intrinsic semiconductor region 1103b provided therebetween, the gate 1105 having a width of 33 nm, the gate insulating film 1104, the sidewall insulator 1106a, the sidewall insulator 1106b, the insulator 1107, the source 1108a, and the drain 1108b.

The difference between the transistor in FIG. 26A and the transistor in FIG. 26B is the conductivity type of semiconductor regions under the sidewall insulators 1106a and 1106b. In the transistor in FIG. 26A, the semiconductor regions under the sidewall insulator 1106a and the sidewall insulator 1106b are part of the semiconductor region 1103a having $n^+$-type conductivity and part of the semiconductor region 1103c having $n^+$-type conductivity, whereas in the transistor in FIG. 26B, the semiconductor regions under the sidewall insulator 1106a and the sidewall insulator 1106b are part of the intrinsic semiconductor region 1103b. In other words, in the semiconductor layer in FIG. 26B, a region having a width of $L_{off}$ which overlaps with neither the semiconductor region 1103a (the semiconductor region 1103c) nor the gate 1105 is provided. This region is called an offset region, and the width $L_{off}$ is called an offset length. As is seen from the drawing, the offset length is equal to the width of the sidewall insulator 1106a (the sidewall insulator 1106b).

Figure 23A:
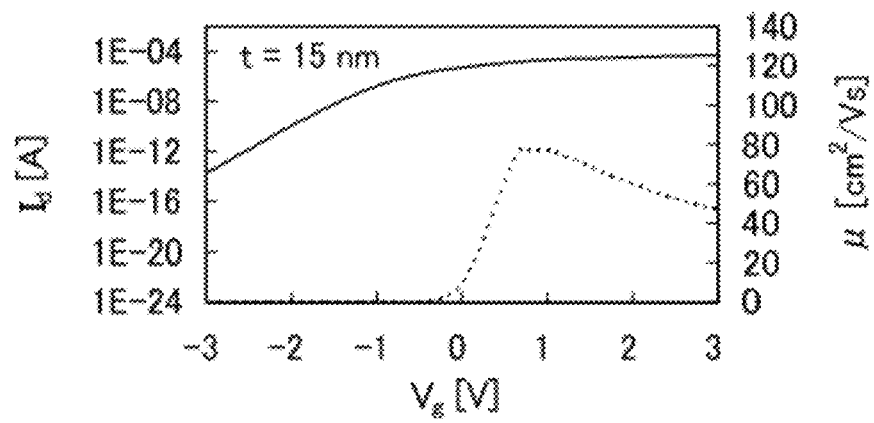
FIGS. 23A to 23C each show the gate voltage dependence of drain current and field-effect mobility obtained by calculation.
Figure 23B:
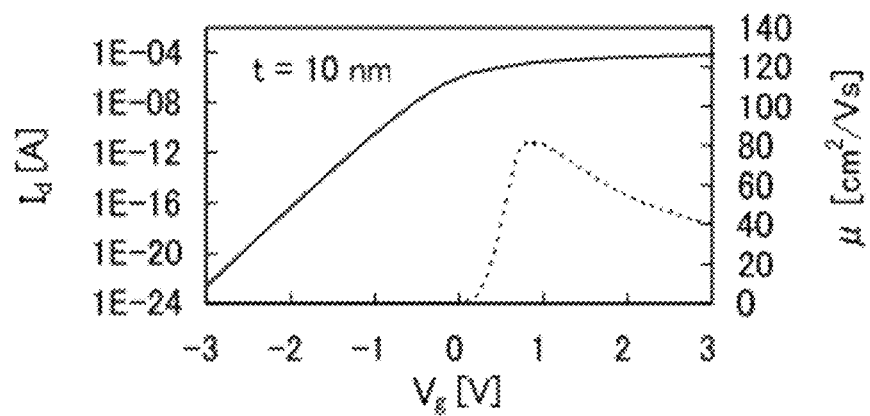
Figure 23C:
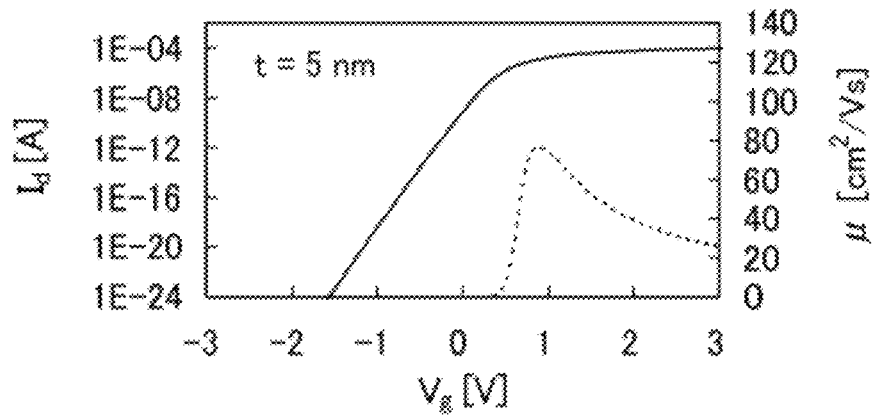

The other parameters used in calculation are as described above. For the calculation, device simulation software Sentaurus Device manufactured by Synopsys, Inc. was used. FIGS. 23A to 23C show the gate voltage ($V_g$: a potential difference between the gate and the source) dependence of the drain current ($I_d$, a solid line) and the field-effect mobility ($\mu$, a dotted line) of the transistor having the structure illustrated in FIG. 26A. The drain current $I_d$ is obtained by calculation under the assumption that the drain voltage (a potential difference between the drain and the source) is +1 V and the field-effect mobility $\mu$ is obtained by calculation under the assumption that the drain voltage is +0.1 V.

FIG. 23A shows the gate voltage dependence of the transistor in the case where the thickness of the gate insulating film is 15 nm, FIG. 23B shows that of the transistor in the case where the thickness of the gate insulating film is 10 nm, and FIG. 23C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility $\mu$ and the drain current $I_d$ in an on state (on-state current). The graphs show that the drain current exceeds 10 μA, at a gate voltage of around 1 V.

Figure 24A:
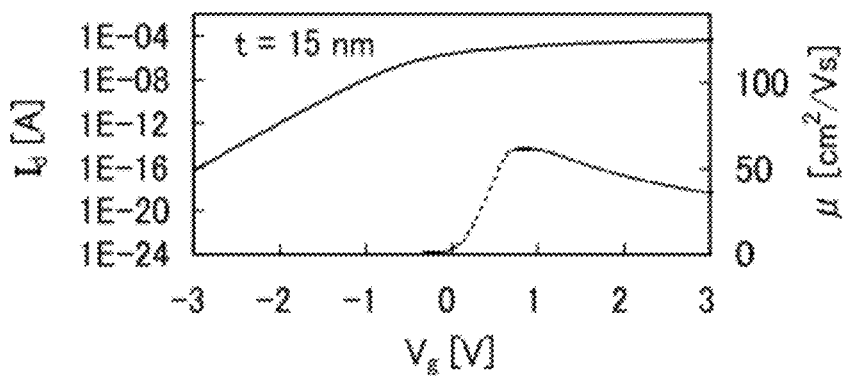
FIGS. 24A to 24C each show the gate voltage dependence of drain current and field-effect mobility obtained by calculation.
Figure 24B:
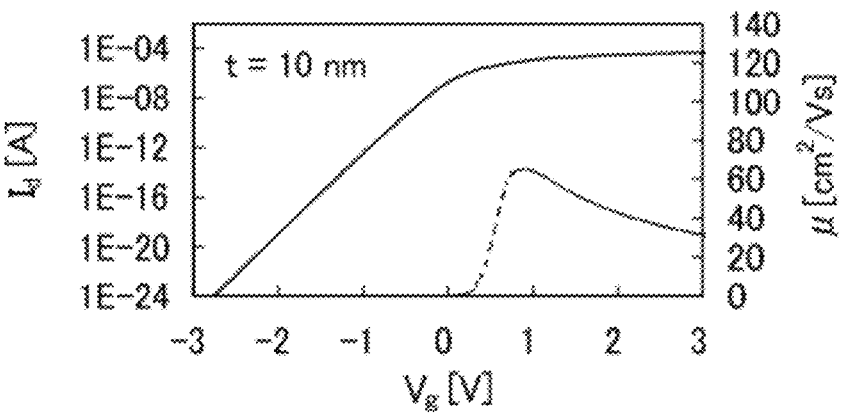
Figure 24C:
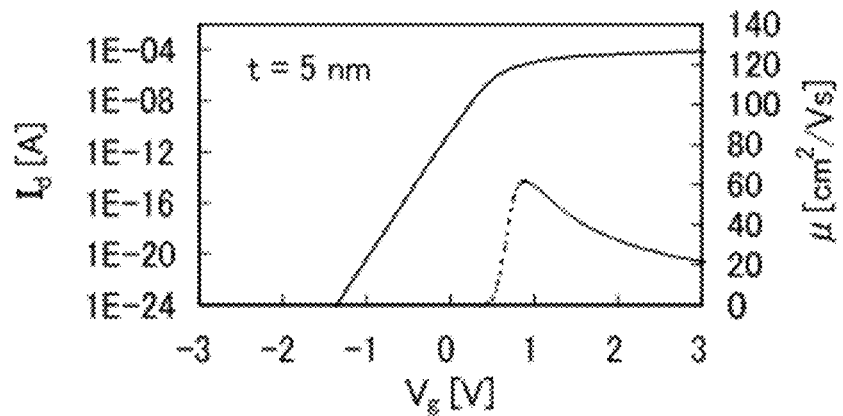

FIGS. 24A to 24C show the gate voltage $V_g$ dependence of the drain current $I_d$ (a solid line) and the field-effect mobility $\mu$ (a dotted line) of the transistor having the structure illustrated in FIG. 26B where the offset length $L_{off}$ is 5 nm. The drain current $I_d$ is obtained by calculation under the assumption that the drain voltage is +1 V and the field-effect mobility $\mu$ is obtained by calculation under the assumption that the drain voltage is +0.1 V. FIG. 24A shows the gate voltage dependence of the transistor in the case where the thickness of the gate insulating film is 15 nm, FIG. 24B shows that of the transistor in the case where the thickness of the gate insulating film is 10 nm, and FIG. 24C shows that of the transistor in the case where the thickness of the gate insulating film is 5 nm.

Figure 25A:
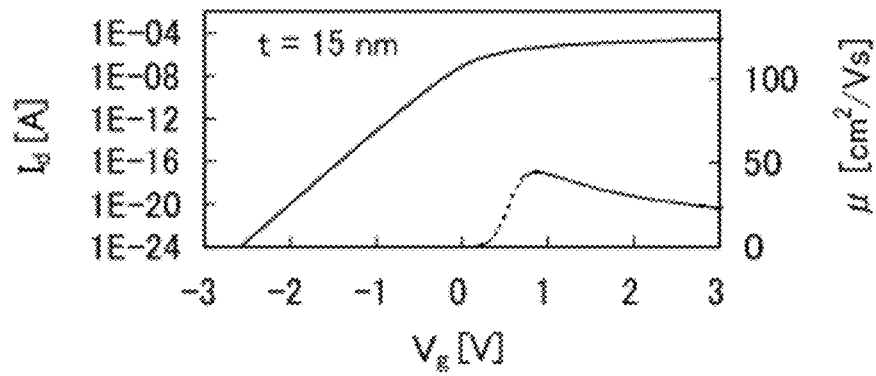
FIGS. 25A to 25C each show the gate voltage dependence of drain current and field-effect mobility obtained by calculation.
Figure 25B:
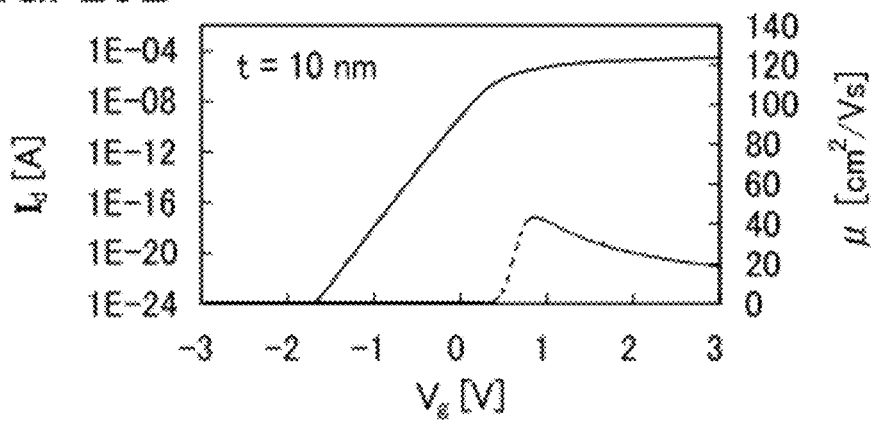
Figure 25C:
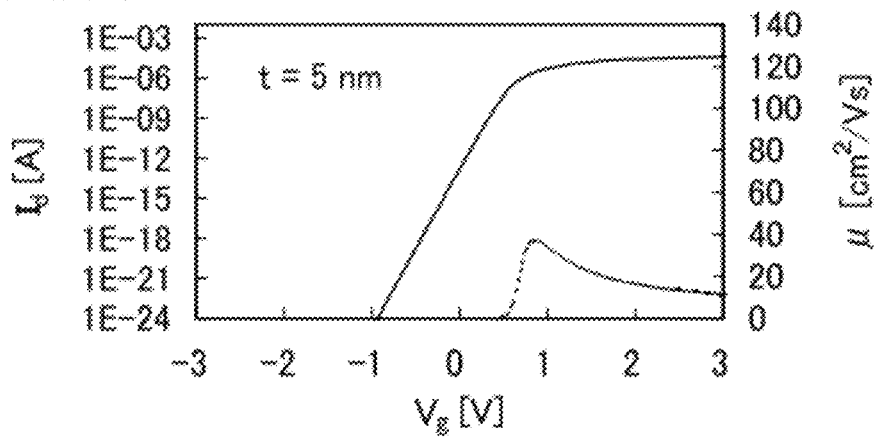

Further, FIGS. 25A to 25C show the gate voltage dependence of the drain current $I_d$ (a solid line) and the field-effect mobility $\mu$ (a dotted line) of the transistor having the structure illustrated in FIG. 26B where the offset length $L_{off}$ is 15 nm. The drain current $I_d$ is obtained by calculation under the assumption that the drain voltage is +1 V and the field-effect mobility $\mu$ is obtained by calculation under the assumption that the drain voltage is +0.1 V. FIG. 25A shows the gate voltage dependence of the transistor in the case where the thickness of the gate insulating film is 15 nm, FIG. 25B shows that of the transistor in the case where the thickness of the gate insulating film is 10 nm, and FIG. 25C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility $\mu$ and the on-state current.

Note that the peak of the field-effect mobility $\mu$ is approximately 80 $cm^2/Vs$ in FIGS. 23A to 23C, approximately 60 $cm^2/Vs$ in FIGS. 24A to 24C, and approximately 40 $cm^2/Vs$ in FIGS. 25A to 25C; thus, the peak of the field-effect mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, at a gate voltage of around 1 V.

Example 2

In this example, electric characteristics of a transistor which includes an oxide semiconductor containing In, Sn, and Zn as main components for a semiconductor layer where a channel is formed will be described.

A transistor in which an oxide semiconductor containing In, Sn, and Zn as main components is used as a semiconductor layer where a channel is formed can have favorable characteristics by depositing the oxide semiconductor while heating a substrate or by performing heat treatment after an oxide semiconductor film is formed. Note that a main component refers to an element included in composition at higher than or equal to 5 at. %.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 27A:
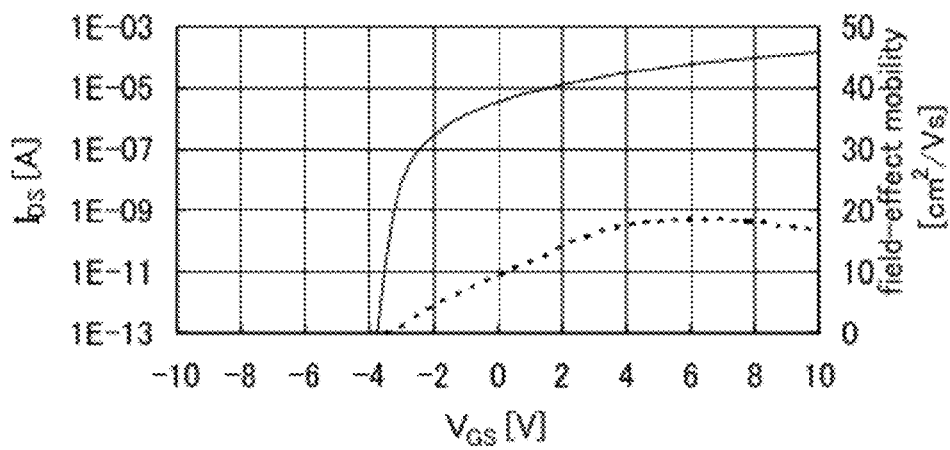
FIGS. 27A to 27C are graphs showing characteristics of transistors each including an oxide semiconductor film.
Figure 27B:
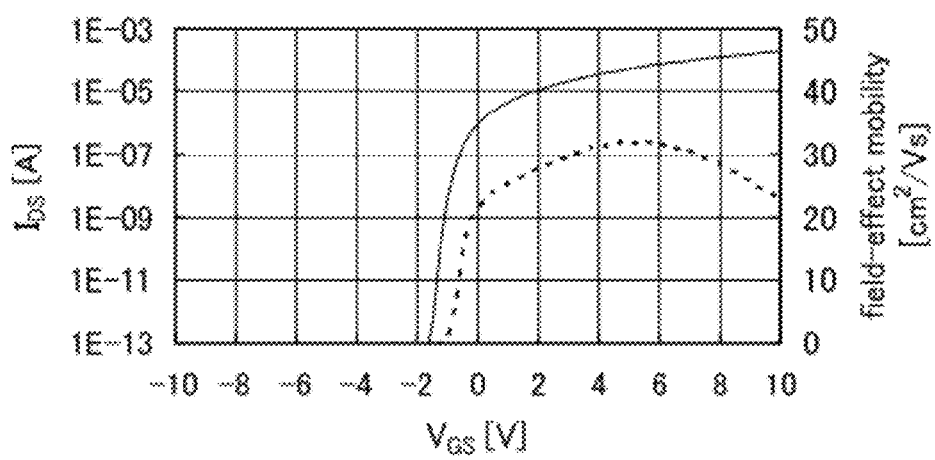
Figure 27C:
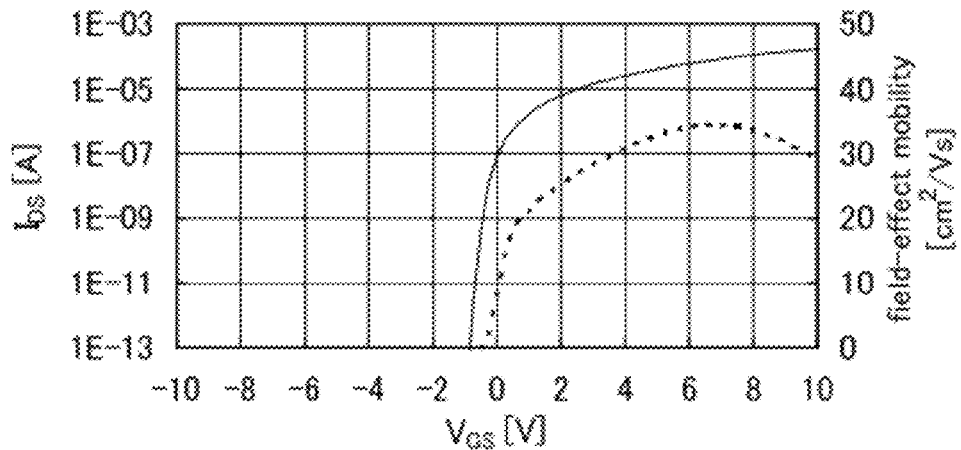

As an example, FIGS. 27A to 27C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 27A shows characteristics of a transistor whose oxide semiconductor film containing In, Sn, and Zn as main components is formed by a sputtering method without heating a substrate intentionally. The field-effect mobility of the transistor is 18.8 $cm^2/Vsec$. On the other hand, when the oxide semiconductor film containing In, Sn, and Zn as main components is formed while heating the substrate intentionally, the field-effect mobility can be improved. FIG. 27B shows characteristics of a transistor whose oxide semiconductor film containing In, Sn, and Zn as main components is formed while heating a substrate at 200° C. The field-effect mobility in this case is 32.2 cm²/Vsec.

The field-effect mobility can be further improved by performing heat treatment after formation of the oxide semiconductor film containing In, Sn, and Zn as main components. FIG. 27C shows characteristics of a transistor whose oxide semiconductor film containing In, Sn, and Zn as main components is formed by sputtering at 200° C. and then subjected to heat treatment at 650° C. The field-effect mobility of the transistor is 34.5 cm²/Vsec.

The intentional heating of the substrate is expected to have an effect of reducing water taken into the oxide semiconductor film during the formation by sputtering. Further, the heat treatment after film formation enables hydrogen, a hydroxyl group, or water to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm²/Vsec is expected to be realized.

The oxide semiconductor containing In, Sn, and Zn as main components may be crystallized in the following manner: oxygen ions are implanted into the oxide semiconductor; hydrogen, a hydroxyl group, or water included in the oxide semiconductor is released by heat treatment; and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a semiconductor layer where a channel is formed, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 27A and 27B.

Note that the threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target to In:Sn:Zn=2:1:3.

The temperature of the intentional heating of the substrate or the temperature of the heat treatment is higher than or equal to 150° C., preferably higher than or equal to 200° C., more preferably higher than or equal to 400° C. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. Note that $V_d$ refers to a drain voltage (a potential difference between a drain and a source). After that, $V_g$ of 20 V was applied so that the intensity of an electric field applied to the gate insulating film was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating film was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 28A:
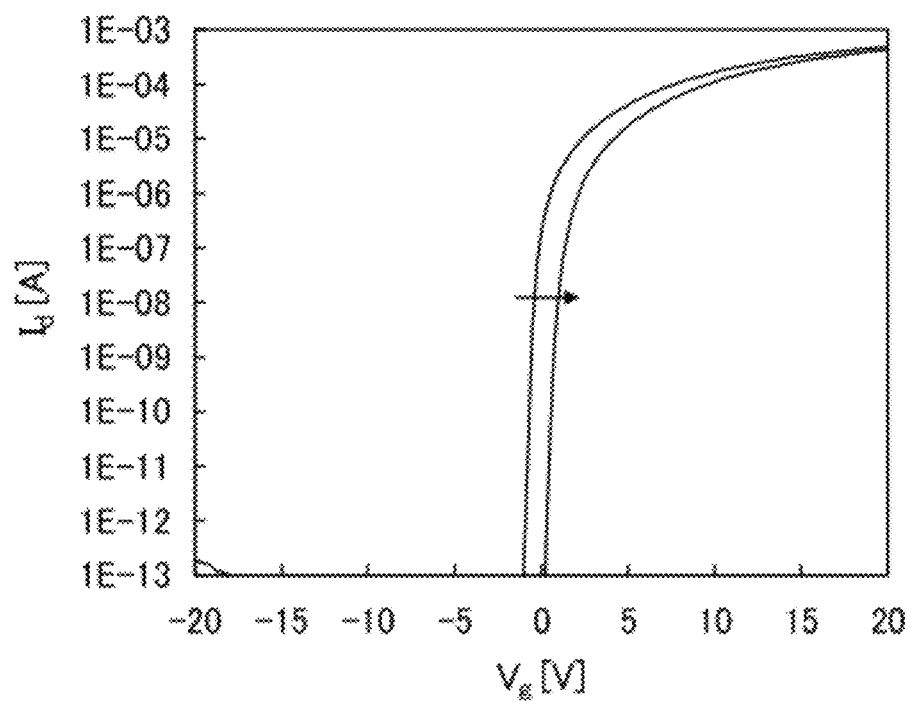
FIGS. 28A and 28B show $V_g$-$I_d$ characteristics after a BT test of a transistor of Sample 1.
Figure 28B:
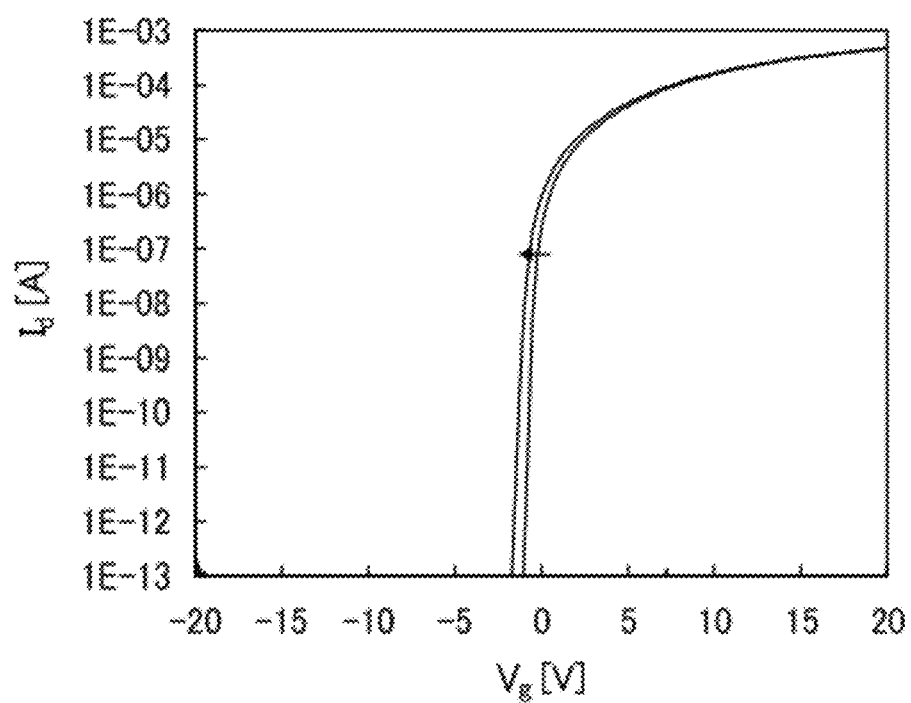
Figure 29A:
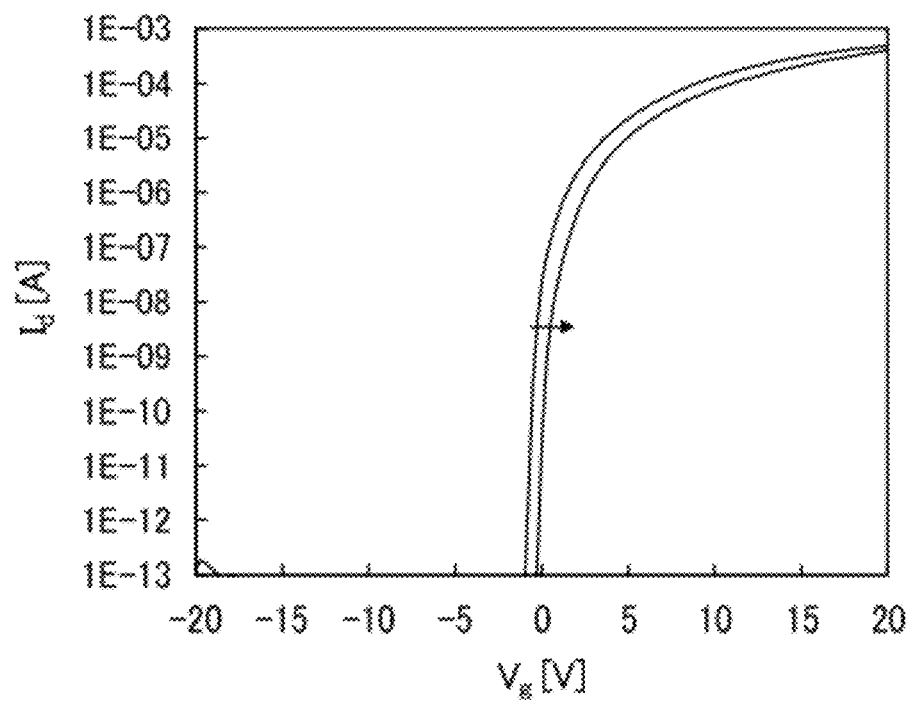
FIGS. 29A and 29B show $V_g$-$I_d$ characteristics after a BT test of a transistor of Sample 2.
Figure 29B:
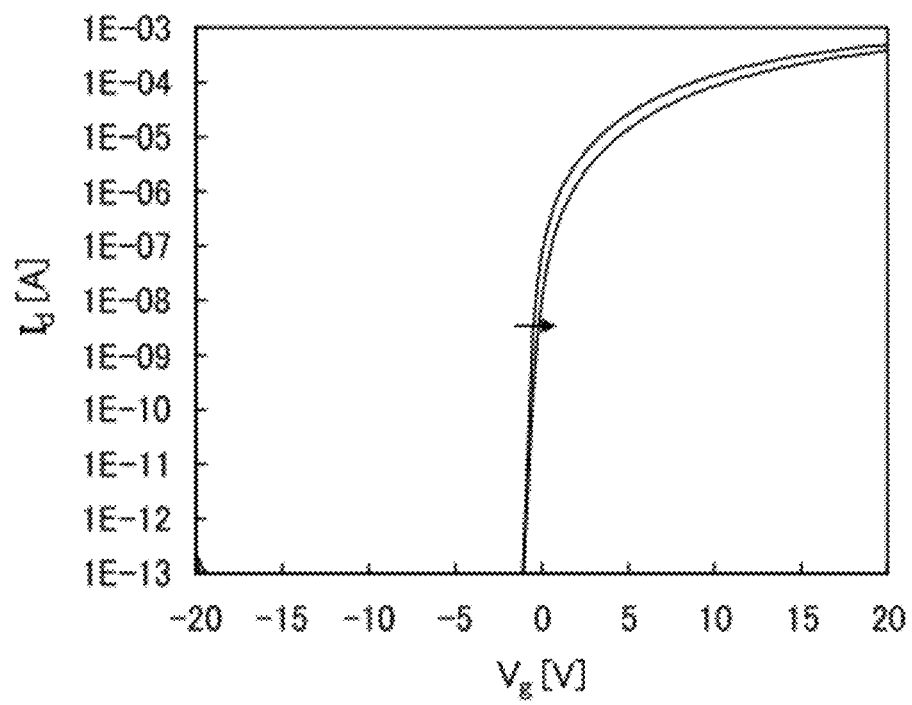

FIGS. 28A and 28B show a result of the positive BT test of Sample 1 and a result of the negative BT test of Sample 1, respectively. FIGS. 29A and 29B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to an oxygen vacancy is easily caused in the oxide semiconductor or at an interface between the oxide semiconductor and a film in contact with the oxide semiconductor; however, when excess oxygen is included in the oxide semiconductor by the heat treatment, oxygen vacancies caused constantly can be compensated for with excess oxygen. The excess oxygen is oxygen existing between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide was conducted. The XRD analysis was conducted using an X-ray diffractometer D8 ADVANCE manufactured by Bruker AXS, and measurement was performed by an out-of-plane method.

Sample A and Sample B were prepared and the XRD analyses were performed thereon. A method for manufacturing Sample A and Sample B will be described below.

First, an In—Sn—Zn-based oxide with a thickness of 100 nm was formed over a quartz substrate that had been subjected to dehydrogenation treatment.

The In—Sn—Zn-based oxide was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature in film formation was set to 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 30:
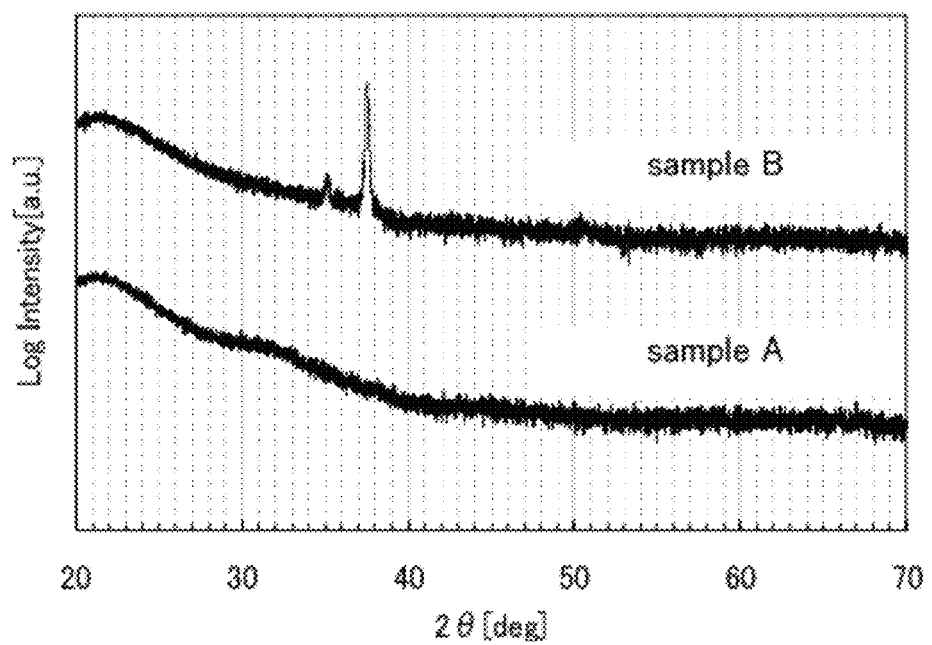
FIG. 30 shows XRD spectra of Sample A and Sample B.

FIG. 30 shows XRD spectra of Sample A and Sample B. No peak derived from crystal was observed in Sample A, whereas peaks derived from crystal were observed when 2θ was around 35 deg and 37 deg to 38 deg in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be lower than or equal to 1 aA/μm. Here, the unit of the off-state current represents current per micrometer of a channel width.

Figure 31:
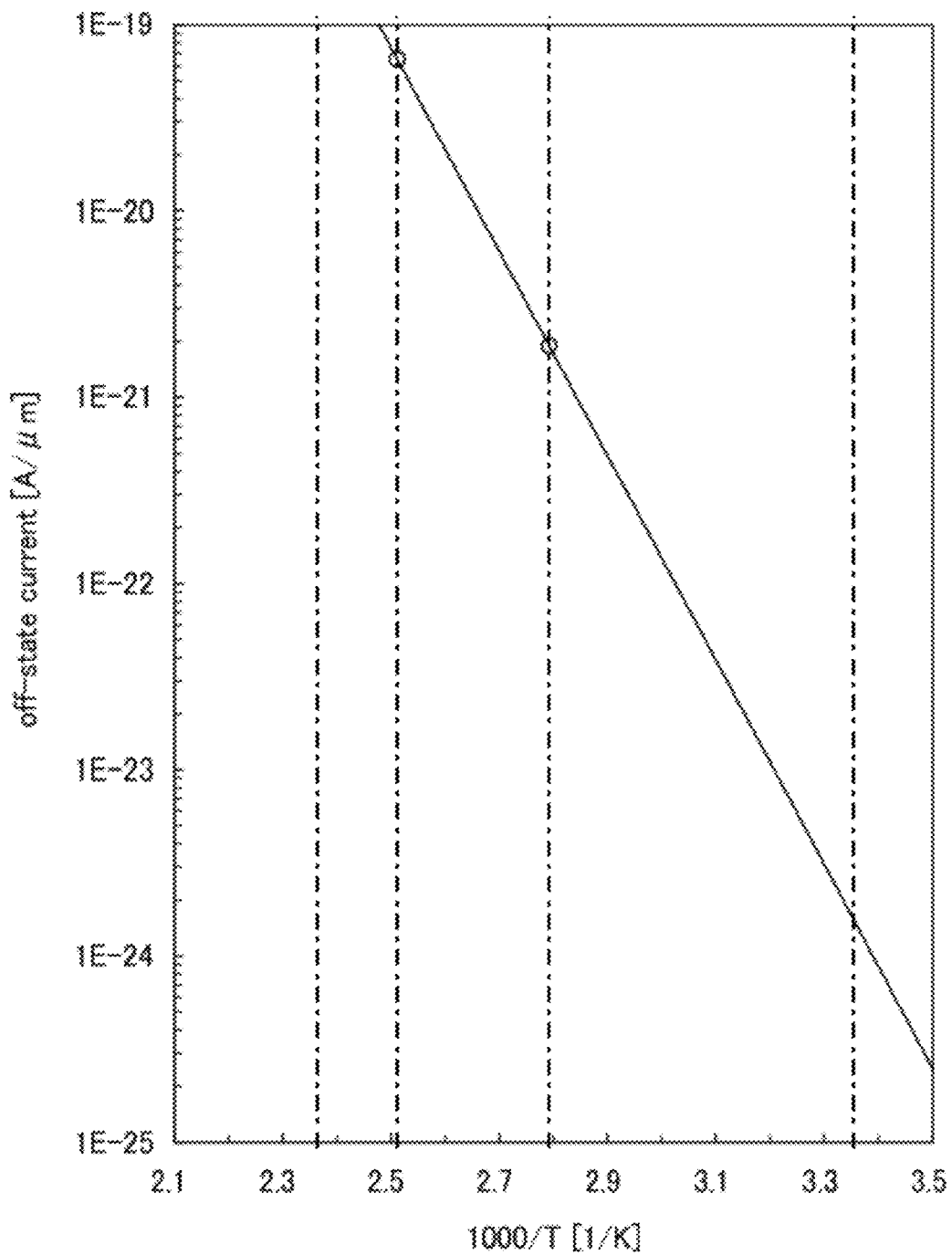
FIG. 31 shows a relation between substrate temperature in measurement and off-state current of a transistor.

FIG. 31 shows a relation between the off-state current of a transistor and the inverse of substrate temperature (absolute temperature) at measurement. Here, for simplicity, the abscissa represents a value (1000/T) obtained by multiplying an inverse of substrate temperature at measurement by 1000.

Specifically, as shown in FIG. 31, the off-state current was lower than or equal to 0.1 aA/μm ($1\times10^{-19}$ A/μm) and lower than or equal to 10 zA/μm ($1\times10^{-20}$ A/μm) when the substrate temperature was 125° C. and 85° C., respectively. The proportional relation between the logarithm of the off-state current and the inverse of the temperature suggests that the off-state current at room temperature (27° C.) is lower than or equal to 0.1 zA/μm ($1\times10^{-22}$ A/μm). Hence, the off-state current can be lower than or equal to 1 aA/μm ($1\times10^{-18}$ A/μm), lower than or equal to 100 zA/μm ($1\times10^{-19}$ A/μm), and lower than or equal to 1 zA/μm ($1\times10^{-21}$ A/μm) at 125° C., 85° C., and room temperature, respectively. The above values of off-state current are clearly much lower than that of the transistor using Si as a semiconductor film.

Needless to say, in order to prevent hydrogen and water from entering the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of lower than or equal to −70° C. is preferably used as the sputtering gas in order to prevent water from being included in the film. In addition, it is preferable to use a target which is highly purified so as not to include impurities such as hydrogen and water. Although it is possible to remove water from a film of an oxide semiconductor containing In, Sn, and Zn as main components by heat treatment, a film which does not include water originally is preferably formed because water is released from the oxide semiconductor containing In, Sn, and Zn as main components at a higher temperature than from an oxide semiconductor containing In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 32:
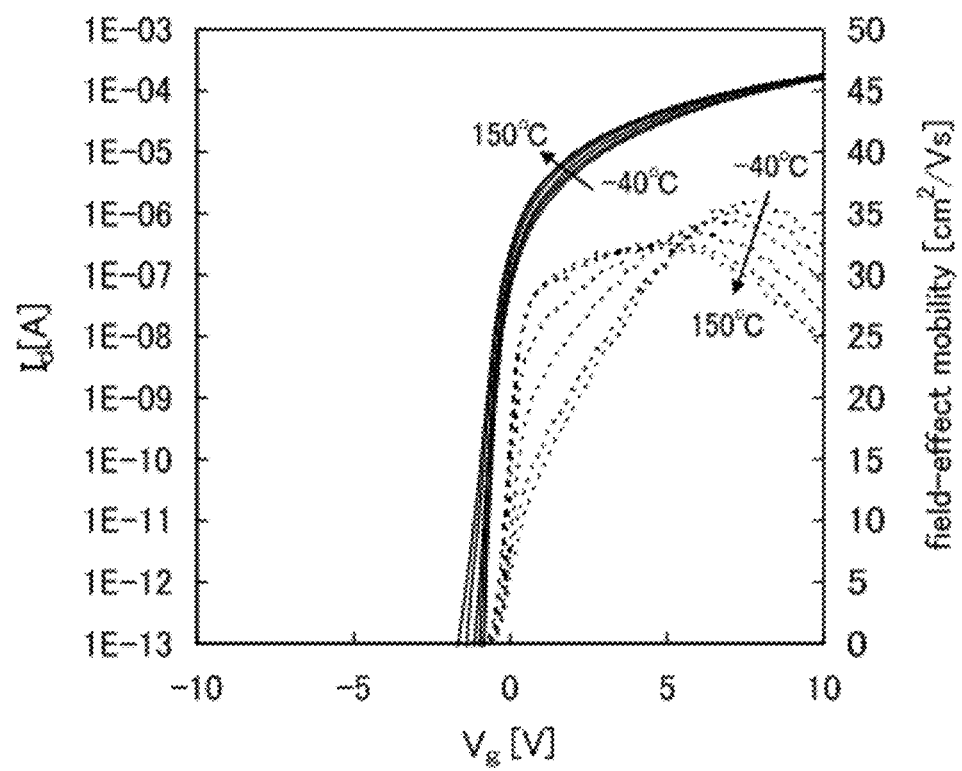
FIG. 32 is a graph showing $V_g$ dependence of $I_d$ and field-effect mobility.
Figure 33A:
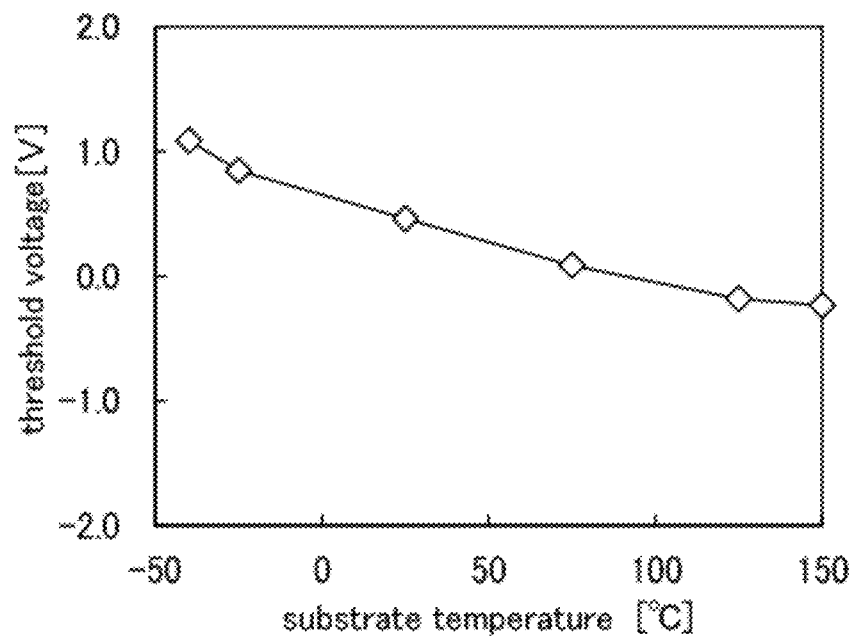
FIG. 33A is a graph showing a relation between the threshold voltage and the substrate temperature.

FIG. 32 shows the $V_g$ dependence of $I_d$ (a solid line) and field-effect mobility (a dotted line). FIG. 33A shows a relation between the substrate temperature and the threshold voltage, and FIG. 33B shows a relation between the substrate temperature and the field-effect mobility.

From FIG. 33A, it is found that the threshold voltage gets lower as the substrate temperature increases. Note that the threshold voltage is decreased from 1.09 V to −0.23 V in the range from −40° C. to 150° C.

Figure 33B:
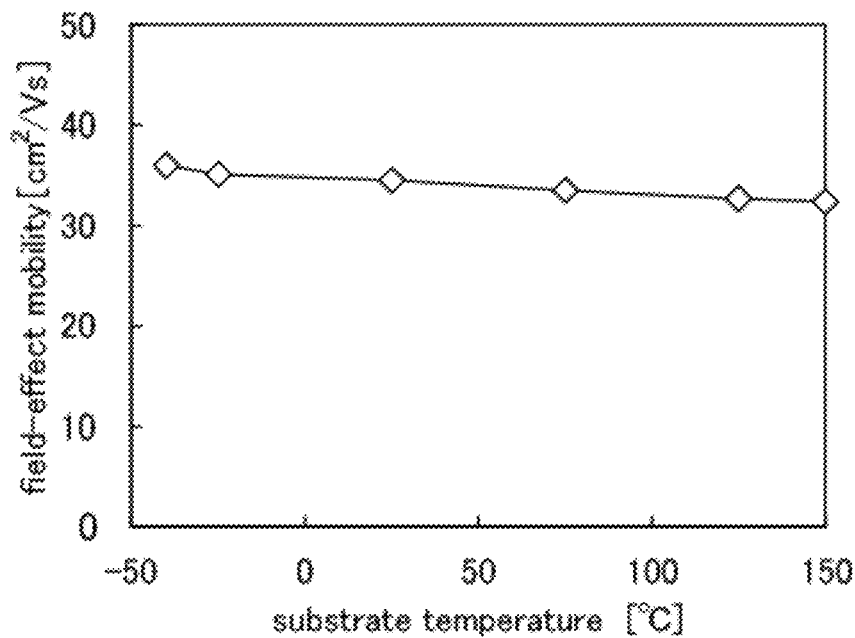
FIG. 33B is a graph showing a relation between the field-effect mobility and the substrate temperature.

From FIG. 33B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor which includes an oxide semiconductor containing In, Sn, and Zn as main components as a semiconductor layer where a channel is formed, a field-effect mobility of higher than or equal to 30 cm$^2$/Vsec, preferably higher than or equal to 40 cm$^2$/Vsec, more preferably higher than or equal to 60 cm$^2$/Vsec can be obtained with the off-state current maintained at lower than or equal to 1 aA/μm, which can achieve on-state current needed for an LSI. For example, in an FET where L/W is 33 nm/40 nm, an on-state current of higher than or equal to 12 μA can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

EXPLANATION OF REFERENCE

100: divider circuit, 101: DFF circuit, 102: DFF circuit, 103: DFF circuit, 111: terminal portion, 112: node, 113: node, 114: terminal portion, 115: node, 116: node, 121: inverter, 122: inverter, 123: inverter, 124: analog switch, 125: analog switch, 126: clocked inverter, 127: clocked inverter, 131: p-channel transistor, 132: n-channel transistor, 133: n-channel transistor, 134: p-channel transistor, 135: p-channel transistor, 136: n-channel transistor, 200: divider circuit, 201: FF circuit, 202: FF circuit, 203: FF circuit, 211: terminal portion, 212: node, 213: node, 214: terminal portion, 215: node, 216: node, 217: node, 218: node, 219: node, 220: node, 221: inverter, 222: inverter, 223: node, 231: transistor, 232: transistor, 233: transistor, 234: transistor, 235: transistor, 236: transistor, 237: transistor, 238: transistor, 251: FF circuit, 252: capacitor, 253: capacitor, 261: FF circuit, 300: divider circuit, 301: FF circuit, 302: FF circuit, 303: FF circuit, 311: terminal portion, 312: node, 313: node, 314: terminal portion, 315: node, 316: node, 341: inverter, 700: substrate, 701: insulating film, 702: semiconductor film, 703: gate insulating film, 704: impurity region, 705: mask, 706: opening, 707: gate electrode, 708: conductive film, 709: impurity region, 710: channel formation region, 711: impurity region, 712: insulating film, 713: insulating film, 716: oxide semiconductor layer, 719: conductive film, 720: conductive film, 721: gate insulating film, 722: gate electrode, 724: insulating film, 725: opening, 726: wiring, 727: insulating film, 731: transistor, 732: transistor, 901: transistor, 902: base film, 903: oxide semiconductor layer, 904: source electrode, 905: drain electrode, 906: gate insulating film, 907: gate electrode, 908: high-concentration region, 909: channel formation region, 910: protective insulating film, 911: transistor, 912: base film, 913: oxide semiconductor layer, 914: source electrode, 915: drain electrode, 916: gate insulating film, 917: gate electrode, 918: high-concentration region, 919: channel formation region, 920: protective insulating film, 921: transistor, 922: base film, 923: oxide semiconductor layer, 924: source electrode, 925: drain electrode, 926: gate insulating film, 927: gate electrode, 928: high-concentration region, 929: low-concentration region, 930: sidewall, 931: channel formation region, 932: protective insulating film, 941: transistor, 942: base film, 943: oxide semiconductor layer, 944: source electrode, 945: drain electrode, 946: gate insulating film, 947: gate electrode, 948: high-concentration region, 949: low-concentration region, 950: sidewall, 951: channel formation region, 952: protective insulating film, 961: transistor, 962: base film, 963: oxide semiconductor layer, 964: source electrode, 965: drain electrode, 966: gate insulating film, 967: gate electrode, 968: high-concentration region, 969: low-concentration region, 970: sidewall, 971: channel formation region, 972: protective insulating film, 973: insulating film, 974: electrode, 975: electrode, 1101: base insulating layer, 1102: insulator, 1104: gate insulating film, 1105: gate, 1107: insulator, 7001: housing, 7002: display portion, 7011: housing, 7012: display portion, 7013: supporting base, 7021: housing, 7022: display portion, 7031: housing, 7032: housing, 7033: display portion, 7034: display portion, 7035: microphone, 7036: speaker, 7037: operation key, 7038: stylus, 7041: housing, housing, 7042: display portion, 7043: audio-input portion, 7044: audio-output portion, 7045: operation key, 7046: light-receiving portion, 7051: housing, 7052: display portion, 7053: operation key, 9900: substrate, 9901: arithmetic logic unit (ALU), 9906: register, 9909: rewritable ROM, 1103a: semiconductor region, 1103b: semiconductor region, 1103c: semiconductor region, 1106a: sidewall insulator, 1106b: sidewall insulator, 1108a: source, 1108b: drain This application is based on Japanese Patent Application serial no. 2011-118125 filed with Japan Patent Office on May 26, 2011, the entire contents of which are hereby incorporated by reference.

The invention claimed is:
1. A divider circuit comprising:
a flip-flop circuit including:
   a first input portion configured to be supplied with a clock signal;
   a first output portion configured to supply a first output signal;
   a second output portion configured to supply an inversion signal of the first output signal;
   a second input portion electrically connected to the second output portion;
   a first transistor comprising a source and a drain, wherein one of the source and the drain is electrically connected to the second input portion, and wherein a gate of the first transistor is configured to be supplied with an inversion signal of the clock signal;
   a second transistor having a gate electrically connected to the other of the source and the drain of the first transistor;
   a third transistor having a gate electrically connected to the first input portion;
   a fourth transistor having a gate electrically connected to one of a source and a drain of the third transistor,
wherein a channel formation region of the first transistor comprises an oxide semiconductor including indium, and
wherein a channel formation region of the third transistor comprises an oxide semiconductor including indium.
2. A divider circuit according to claim 1,
wherein a channel formation region of the second transistor comprises an oxide semiconductor, and
wherein a channel formation region of the fourth transistor comprises an oxide semiconductor.
3. A semiconductor device comprising the divider circuit according to claim 1.
4. A divider circuit comprising:
a first inverter and a second inverter;
a first transistor and a fifth transistor which are p-channel transistors; and
a second transistor, a third transistor, a fourth transistor, a sixth transistor, a seventh transistor, and an eighth transistor which are n-channel transistors,
wherein one of a source and a drain of the first transistor and one of a source and a drain of the fifth transistor are electrically connected to a first power supply,
wherein the other of the source and the drain of the first transistor is electrically connected to one of a source and a drain of the second transistor,
wherein the other of the source and the drain of the second transistor is electrically connected to one of a source and a drain of the third transistor,
wherein the other of the source and the drain of the fifth transistor is electrically connected to one of a source and a drain of the sixth transistor,
wherein the other of the source and the drain of the sixth transistor is electrically connected to one of a source and a drain of the seventh transistor, wherein the other of the source and the drain of the third transistor and the other of the source and the drain of the seventh transistor are electrically connected to a second power supply, wherein a gate of the first transistor and a gate of the second transistor are electrically connected to a gate of the eighth transistor and an input of the first inverter, wherein one of a source and a drain of the eighth transistor is electrically connected to the other of the source and the drain of the first transistor and the one of the source and the drain of the second transistor, wherein the other of the source and the drain of the eighth transistor is electrically connected to a gate of the seventh transistor, wherein an input of the second inverter is electrically connected to the other of the source and the drain of the fifth transistor and the one of the source and the drain of the sixth transistor, wherein an output of the second inverter is electrically connected to one of a source and a drain of the fourth transistor, wherein the other of the source and the drain of the fourth transistor is electrically connected to a gate of the third transistor, and wherein an output of the first inverter is electrically connected to a gate of the fourth transistor, a gate of the fifth transistor, and a gate of the sixth transistor.

5. The divider circuit according to claim 4, wherein the first power supply supplies a higher potential than the second power supply.

6. The divider circuit according to claim 4, wherein a capacitor is electrically connected to at least one of the input of the second inverter and the one of the source and the drain of the eighth transistor.

7. The divider circuit according to claim 4, wherein a channel formation region of the fourth transistor comprises an oxide semiconductor.

8. The divider circuit according to claim 4, wherein a channel formation region of the eighth transistor comprises an oxide semiconductor.

9. The divider circuit according to claim 4, wherein a channel formation region of at least one of the second transistor and the third transistor comprises an oxide semiconductor.

10. The divider circuit according to claim 4, wherein a channel formation region of at least one of the sixth transistor and the seventh transistor comprises an oxide semiconductor.

11. A semiconductor device comprising the divider circuit according to claim 4.

12. A divider circuit comprising:
a first inverter;
a first transistor and a fifth transistor which are p-channel transistors; and
a second transistor, a third transistor, a fourth transistor, a sixth transistor, a seventh transistor, and an eighth transistor which are n-channel transistors, wherein one of a source and a drain of the first transistor and one of a source and a drain of the fifth transistor are electrically connected to a first power supply, wherein the other of the source and the drain of the first transistor is electrically connected to one of a source and a drain of the second transistor, wherein the other of the source and the drain of the second transistor is electrically connected to one of a source and a drain of the third transistor, wherein the other of the source and the drain of the fifth transistor is electrically connected to one of a source and a drain of the sixth transistor, wherein the other of the source and the drain of the sixth transistor is electrically connected to one of a source and a drain of the seventh transistor, wherein the other of the source and the drain of the third transistor and the other of the source and the drain of the seventh transistor are electrically connected to a second power supply, wherein a gate of the first transistor and a gate of the second transistor are electrically connected to a gate of the eighth transistor, wherein one of a source and a drain of the eighth transistor is electrically connected to the other of the source and the drain of the first transistor and the one of the source and the drain of the second transistor, wherein the other of the source and the drain of the eighth transistor is electrically connected to a gate of the seventh transistor, wherein an input of the first inverter is electrically connected to the other of the source and the drain of the fifth transistor and the one of the source and the drain of the sixth transistor, wherein an output of the first inverter is electrically connected to one of a source and a drain of the fourth transistor, wherein the other of the source and the drain of the fourth transistor is electrically connected to a gate of the third transistor, and wherein a gate of the fourth transistor is electrically connected to a gate of the fifth transistor, and a gate of the sixth transistor.

13. The divider circuit according to claim 12, wherein the first power supply supplies a higher potential than the second power supply.

14. The divider circuit according to claim 12, wherein a capacitor is electrically connected to at least one of the input of the first inverter and the one of the source and the drain of the eighth transistor.

15. The divider circuit according to claim 12, wherein a channel formation region of the fourth transistor comprises an oxide semiconductor.

16. The divider circuit according to claim 12, wherein a channel formation region of the eighth transistor comprises an oxide semiconductor.

17. The divider circuit according to claim 12, wherein a channel formation region of at least one of the second transistor and the third transistor comprises an oxide semiconductor.

18. The divider circuit according to claim 12, wherein a channel formation region of at least one of the sixth transistor and the seventh transistor comprises an oxide semiconductor.

19. A semiconductor device comprising the divider circuit according to claim 12.

* * * * *

UNITED STATES PATENT AND TRADEMARK OFFICE
CERTIFICATE OF CORRECTION

PATENT NO. : 8,742,804 B2
APPLICATION NO. : 13/473658
DATED : June 3, 2014
INVENTOR(S) : Masashi Fujita et al.

It is certified that error appears in the above-identified patent and that said Letters Patent is hereby corrected as shown below:

In the Specification

At column 6, line 8, "$I_a$" should be --$I_d$--;

At column 45, line 61, "$\mu t_0$" should be --$\mu_0$--;

At column 51, line 34, "2θ" should be --2θ--.

Signed and Sealed this
Fourteenth Day of October, 2014

Michelle K. Lee
*Deputy Director of the United States Patent and Trademark Office*